US012135368B2

(12) United States Patent
Murphy

(10) Patent No.: US 12,135,368 B2
(45) Date of Patent: Nov. 5, 2024

(54) SMART MODULE WITH ADJUSTABLE TIME OF FLIGHT SENSOR

(71) Applicant: OP-Hygiene IP GmbH, Niederbipp (CH)

(72) Inventor: Mark Murphy, Ballina (IE)

(73) Assignee: OP-HYGIENE IP GMBH, Niederbipp (CH)

(*) Notice: Subject to any disclaimer, the term of this patent is extended or adjusted under 35 U.S.C. 154(b) by 341 days.

(21) Appl. No.: 17/559,241

(22) Filed: Dec. 22, 2021

(65) Prior Publication Data

US 2022/0206138 A1 Jun. 30, 2022

Related U.S. Application Data

(60) Provisional application No. 63/132,135, filed on Dec. 30, 2020.

(51) Int. Cl.
*G01S 13/88* (2006.01)
*A47K 10/32* (2006.01)
(Continued)

(52) U.S. Cl.
CPC .............. *G01S 13/88* (2013.01); *G01D 11/24* (2013.01); *G01D 11/245* (2013.01); *A47K 10/32* (2013.01);
(Continued)

(58) Field of Classification Search
CPC .......... G01S 13/88; G01S 7/483; G01S 17/08; H03K 17/945; H03K 2217/94015;
(Continued)

(56) References Cited

U.S. PATENT DOCUMENTS 6,396,070 B1 5/2002 Christensen et al.
6,720,884 B2 4/2004 O'Connor et al.
(Continued)

FOREIGN PATENT DOCUMENTS

CN 105365705 A * 3/2016
CN 207867603 U * 9/2018
(Continued)

OTHER PUBLICATIONS

Translation CN-208519424 (Year: 2019).*
Translation CN_207867603 (Year: 2017).*
Translation CN_112032479 (Year: 2020).*

*Primary Examiner* — Octavia Hollington
*Assistant Examiner* — Monica S Young
(74) *Attorney, Agent, or Firm* — Thorpe North & Western, LLP

(57) ABSTRACT

A sensor assembly including a sensor, a sensor housing that carries the sensor, a mounting member that pivotally engages with the sensor housing, an adjustment member for selecting an angular position of the sensor housing relative to the mounting member, and a locking mechanism for locking the sensor housing at the selected angular position relative to the mounting member. The adjustment member is moveable relative to the mounting member between a first location and a second location, and engages with the sensor housing to pivot the sensor housing about a pivot axis relative to the mounting member between a first angular position and a second angular position.

20 Claims, 37 Drawing Sheets

(51) Int. Cl.
*A47K 10/36* (2006.01)
*G01D 11/24* (2006.01)
*H03K 17/94* (2006.01)
*H03K 17/945* (2006.01)

(52) U.S. Cl.
CPC ............ *A47K 10/36* (2013.01); *H03K 17/941* (2013.01); *H03K 17/945* (2013.01)

(58) Field of Classification Search
CPC ....... H03K 2217/94108; H03K 17/941; A47K 10/32; A47K 10/36; A47K 2010/3233; A47K 2010/3246; G01D 11/24
USPC ........................................................ 73/865.8
See application file for complete search history.

(56) References Cited

U.S. PATENT DOCUMENTS

| | | | |
|---|---|---|---|
| 9,726,359 B1 | 8/2017 | Jensen et al. | |
| 10,278,550 B2 | 5/2019 | Ophardt et al. | |
| 2019/0309557 A1* | 10/2019 | Zhevelev | G01D 5/32 |
| 2020/0033480 A1* | 1/2020 | Augspurger | G01S 7/4813 |
| 2021/0149036 A1* | 5/2021 | Hutchinson | A63J 1/02 |

FOREIGN PATENT DOCUMENTS

| | | | | |
|---|---|---|---|---|
| CN | 208519424 U | * | 2/2019 | |
| CN | 112032479 A | * | 12/2020 | |
| CN | 215807500 U | * | 12/2020 | |
| EP | 2722234 A1 | * | 4/2014 | ............ B60R 11/04 |
| WO | WO 2020/042346 A1 | | 3/2020 | |

* cited by examiner

SMART MODULE WITH ADJUSTABLE TIME OF FLIGHT SENSOR

RELATED APPLICATION

This application claims priority to the Dec. 30, 2020 filing date of U.S. Provisional Patent Application No. 63/132,135, which is incorporated herein by reference.

FIELD OF THE INVENTION

This invention relates to apparatuses, such as paper towel dispensers and waste bins, that incorporate electronics to provide smart functionality.

BACKGROUND OF THE INVENTION

It is known to incorporate electronics into apparatuses such as paper towel dispensers and waste bins to provide smart functionality. For example, U.S. Pat. No. 10,278,550 to Ophardt et al., issued May 7, 2019 and hereby incorporated by reference, discloses devices such as hand cleaning fluid dispensers, toilet paper dispensers, paper towel dispensers, and waste bins that incorporate a time of flight sensor.

The time of flight sensor may be used to detect a user's hand placed below a dispenser, so that the dispenser can be touchlessly operated. The time of flight sensor may also be used to measure the quantity of a product remaining in the dispenser, or in the case of a waste bin, the quantity of waste contained in the waste bin. Information about the measured quantity can then be communicated, for example by illuminating an LED to indicate to service personnel that the dispenser needs to be refilled or the waste bin needs to be emptied.

The applicant has appreciated that the manner in which apparatuses are provided with smart functionality, including the manner in which sensors such as time of flight sensors are mounted, could be improved.

SUMMARY OF THE INVENTION

To at least partially overcome some of the disadvantages of previously known devices and methods, in one aspect the present invention provides a sensor assembly including a sensor, a sensor housing that carries the sensor, a mounting member that pivotally engages with the sensor housing, an adjustment member for selecting an angular position of the sensor housing relative to the mounting member, and a locking mechanism for locking the sensor housing at the selected angular position relative to the mounting member.

The applicant has appreciated that the sensor assembly in accordance with the invention allows the angular position of the sensor to be adjusted and then locked in place. This preferably allows identical sensor assemblies to be used in a variety of different contexts in which the sensor might need to be mounted at different angular positions.

For example, in one context the sensor assembly could be mounted to a horizontal mounting surface of a paper towel dispenser, with the sensor being angled straight downwardly towards a paper towel storage space in the dispenser. In another context, an identical sensor assembly could be mounted to an inclined mounting surface of a lid of a waste bin, with the sensor having a different angular position relative to the mounting surface than in the paper towel dispenser, so that the sensor is angled towards a waste collection space in the waste bin.

The adjustable sensor assembly in accordance with the invention preferably allows a single manufacturing process to be used to produce a plurality of identical sensor assemblies that can be used in a variety of different contexts.

In some preferred embodiments, the sensor housing has a first mounting element and a first adjustment element, and the mounting member has a second mounting element that pivotally engages with the first mounting element so as to permit pivotal movement of the sensor housing about a pivot axis relative to the mounting member. Preferably, the adjustment member has a second adjustment element that engages with the first adjustment element, and when the locking mechanism is in an unlocked state, the adjustment member is slideable relative to the mounting member between a first location and a second location, with the engagement of the second adjustment element with the first adjustment element pivoting the sensor housing about the pivot axis relative to the mounting member between a first angular position and a second angular position.

The applicant has appreciated that with the aforementioned configuration, the adjustment member can preferably be formed as a planar body that slides against a planar surface of the mounting member. This preferably allows the adjustment member to have a compact structure that extends only a short distance from the planar surface of the mounting member, so that the adjustment member is preferably able to fit into a relatively small space. For example, in one preferred embodiment of the invention, the mounting member forms the cover or lid of a smart module or container that contains electronics, such as a printed circuit board. The compact structure of the adjustment member preferably allows the adjustment member to sit between the lid and the circuit board without requiring a large space between the lid and the circuit board.

In some preferred embodiments of the invention, the sensor assembly is incorporated into a container body for a smart module, the container body being configured to be mounted to a mounting mechanism that is present in a plurality of different apparatuses. For example, a series of products such as paper towel dispensers, fluid dispensers, toilet paper dispensers, and waste bins could be manufactured, each incorporating an identical mounting mechanism that is configured to mount the container body. Preferably, the same container body could be used to incorporate smart functionality into any one of the series of products, with the sensor being adjustable as described above to select an angular position that is suitable for the apparatus in which the container body will be mounted.

In some preferred embodiments, the angular position of the sensor is selected and locked in place before the container body is mounted to an apparatus. For example, a manufacturer of the container body could adjust the angular position of the sensor based on the requirements of the apparatus in which the container body will be installed, and lock the sensor at the selected angular position before providing the container body to a customer. The customer can then preferably install the container body using the mounting mechanism, without having to adjust the angular position of the sensor. This preferably makes installation of the smart module easier, and preferably reduces the likelihood of the sensor being installed at an incorrect angular position.

Preferably, the locking mechanism is inaccessible when the container body is fully assembled and delivered to a customer. This preferably reduces the risk of the angular position of the sensor being inadvertently changed when the smart module is installed, or of the angular position of the sensor being adjusted by someone without the required expertise.

Accordingly, in one aspect the present invention resides in a sensor assembly comprising: a sensor; a sensor housing that carries the sensor; a mounting member that pivotally engages with the sensor housing; an adjustment member for selecting an angular position of the sensor housing relative to the mounting member; and a locking mechanism for locking the sensor housing at the selected angular position relative to the mounting member; wherein the sensor housing comprises a first mounting element and a first adjustment element; wherein the mounting member comprises a second mounting element that pivotally engages with the first mounting element so as to permit pivotal movement of the sensor housing about a pivot axis relative to the mounting member; wherein the adjustment member comprises a second adjustment element that engages with the first adjustment element; wherein, when the locking mechanism is in an unlocked state, the adjustment member is slideable relative to the mounting member between a first location and a second location; wherein, when the adjustment member is moved relative to the mounting member between the first location and the second location, the engagement of the second adjustment element with the first adjustment element pivots the sensor housing about the pivot axis relative to the mounting member between a first angular position and a second angular position; wherein the angular position of the sensor housing relative to the mounting member is selectable by adjusting a location of the adjustment member relative to the mounting member; and wherein, when the sensor housing is at the selected angular position relative to the mounting member and the locking mechanism is in a locked state, the adjustment member is prevented from sliding relative to the mounting member, and the engagement of the second adjustment element with the first adjustment element locks the sensor housing at the selected angular position relative to the mounting member.

In another aspect, the present invention resides in a smart module comprising a container body that contains a circuit board; wherein the container body comprises the aforementioned sensor assembly.

In a further aspect, the present invention resides in an apparatus for dispensing or receiving a product, the apparatus comprising: a receptacle that defines a product storage space where the product is stored in the receptacle; and the aforementioned sensor assembly; wherein the angular position of the sensor is selected so that the sensor faces towards the product storage space.

In a still further aspect, the present invention resides in a system for providing smart functionality to a plurality of apparatuses, the system comprising: the plurality of apparatuses; and a plurality of smart modules; wherein each of the plurality of smart modules has a container body that contains electronics; and wherein each of the plurality of apparatuses has a mounting mechanism that is configured to mountably receive the container body of any one of the plurality of smart modules.

In a still further aspect, the present invention resides in a method of providing smart functionality, the method comprising: providing a plurality of smart modules, each of the plurality of smart modules having a container body that contains electronics; providing a plurality of apparatuses, each of the plurality of apparatuses having a mounting mechanism that is configured to mountably receive the container body of any one of the plurality of smart modules; and for each one of the plurality of apparatuses that is to be provided with smart functionality, mounting one of the plurality of smart modules to the mounting mechanism.

Accordingly, in a first aspect the present invention resides in a sensor assembly comprising: a sensor; a sensor housing that carries the sensor; a mounting member that pivotally engages with the sensor housing; an adjustment member for selecting an angular position of the sensor housing relative to the mounting member; and a locking mechanism for locking the sensor housing at the selected angular position relative to the mounting member; wherein the sensor housing comprises a first mounting element and a first adjustment element; wherein the mounting member comprises a second mounting element that pivotally engages with the first mounting element so as to permit pivotal movement of the sensor housing about a pivot axis relative to the mounting member; wherein the adjustment member comprises a second adjustment element that engages with the first adjustment element; wherein, when the locking mechanism is in an unlocked state, the adjustment member is slideable relative to the mounting member between a first location and a second location; wherein, when the adjustment member is moved relative to the mounting member between the first location and the second location, the engagement of the second adjustment element with the first adjustment element pivots the sensor housing about the pivot axis relative to the mounting member between a first angular position and a second angular position; wherein the angular position of the sensor housing relative to the mounting member is selectable by adjusting a location of the adjustment member relative to the mounting member; and wherein, when the sensor housing is at the selected angular position relative to the mounting member and the locking mechanism is in a locked state, the adjustment member is prevented from sliding relative to the mounting member, and the engagement of the second adjustment element with the first adjustment element locks the sensor housing at the selected angular position relative to the mounting member.

In a second aspect, the present invention resides in a sensor assembly, which optionally incorporates one or more features of the first aspect, wherein the sensor comprises a time of flight sensor.

In a third aspect, the present invention resides in a sensor assembly, which optionally incorporates one or more features of any one or more of the first and second aspects, wherein the mounting member has a locking surface that is spaced from the pivot axis; wherein the adjustment member has a lock surface that faces towards the locking surface and is slideable relative to the locking surface when the locking mechanism is in the unlocked state; and wherein, when the locking mechanism is in the locked state, the lock surface engages with the locking surface so as to prevent the adjustment member from moving relative to the mounting member.

In a fourth aspect, the present invention resides in a sensor assembly, which optionally incorporates one or more features of any one or more of the first to third aspects, wherein, when the locking mechanism is in the locked state, the locking mechanism applies pressure to the adjustment member to force the lock surface into engagement with the locking surface.

In a fifth aspect, the present invention resides in a sensor assembly, which optionally incorporates one or more features of any one or more of the first to fourth aspects, wherein the locking mechanism comprises a fastener having a threaded shaft and a head; wherein the adjustment member comprises a fastener slot; wherein the mounting member comprises a threaded hole; wherein the threaded shaft extends through the fastener slot and into the threaded hole, with the adjustment member being positioned between the head and the mounting member; wherein, when the locking mechanism is in the unlocked state, the head is sufficiently spaced from the mounting member to allow the adjustment member to slide between the first location and the second location; wherein placing the locking mechanism in the locked state comprises rotating the threaded shaft relative to the threaded hole so as to move the head towards the mounting member; and wherein, when the locking mechanism is in the locked state, the head engages with the adjustment member to force the lock surface into engagement with the locking surface.

In a sixth aspect, the present invention resides in a sensor assembly, which optionally incorporates one or more features of any one or more of the first to fifth aspects, wherein the locking surface faces away from the pivot axis.

In a seventh aspect, the present invention resides in a sensor assembly, which optionally incorporates one or more features of any one or more of the first to sixth aspects, wherein the locking surface is planar.

In an eighth aspect, the present invention resides in a sensor assembly, which optionally incorporates one or more features of any one or more of the first to seventh aspects, wherein the locking surface is parallel to the pivot axis.

In a ninth aspect, the present invention resides in a sensor assembly, which optionally incorporates one or more features of any one or more of the first to eighth aspects, wherein the first adjustment element comprises an adjustment projection; and wherein the second adjustment element comprises an adjustment slot that receives the adjustment projection.

In a tenth aspect, the present invention resides in a sensor assembly, which optionally incorporates one or more features of any one or more of the first to ninth aspects, wherein the adjustment projection extends along a projection axis that is spaced from the pivot axis and parallel to the pivot axis.

In an eleventh aspect, the present invention resides in a sensor assembly, which optionally incorporates one or more features of any one or more of the first to tenth aspects, wherein, when the locking mechanism is in the unlocked state, the adjustment member is slideable relative to the mounting member between the first location and the second location along an adjustment axis; and wherein the adjustment axis is spaced from the pivot axis and lies in an adjustment plane that is perpendicular to the pivot axis.

In a twelfth aspect, the present invention resides in a sensor assembly, which optionally incorporates one or more features of any one or more of the first to eleventh aspects, wherein the adjustment slot has a closed terminal end; wherein the adjustment projection is slideable within the adjustment slot relative to the closed terminal end; and wherein a distance between the adjustment projection and the closed terminal end changes as the adjustment member moves between the first location and the second location.

In a thirteenth aspect, the present invention resides in a sensor assembly, which optionally incorporates one or more features of any one or more of the first to twelfth aspects, wherein the adjustment slot has an open end for receiving the adjustment projection during assembly of the sensor assembly.

In a fourteenth aspect, the present invention resides in a sensor assembly, which optionally incorporates one or more features of any one or more of the first to thirteenth aspects, wherein the sensor housing has an outer wall that defines an inner cavity; wherein the inner cavity has an open adjustment end; wherein the adjustment projection extends inwardly from the outer wall into the inner cavity; wherein the adjustment member comprises an adjustment slot defining body that defines the adjustment slot; and wherein the adjustment slot defining body extends through the open adjustment end into the inner cavity of the sensor housing.

In a fifteenth aspect, the present invention resides in a sensor assembly, which optionally incorporates one or more features of any one or more of the first to fourteenth aspects, wherein the outer wall has a side portion that is perpendicular to the pivot axis; and wherein the adjustment projection extends inwardly into the inner cavity from the side portion of the outer wall.

In a sixteenth aspect, the present invention resides in a sensor assembly, which optionally incorporates one or more features of any one or more of the first to fifteenth aspects, wherein the first mounting element comprises a first mounting projection and a second mounting projection; and wherein the second mounting element comprises a first mounting cavity that receives the first mounting projection and a second mounting cavity that receives the second mounting projection.

In a seventeenth aspect, the present invention resides in a sensor assembly, which optionally incorporates one or more features of any one or more of the first to sixteenth aspects, wherein the sensor housing has a first outer surface and a second outer surface; wherein the first mounting projection extends outwardly from the first outer surface along the pivot axis; and wherein the second mounting projection extends outwardly from the second outer surface along the pivot axis.

In an eighteenth aspect, the present invention resides in a sensor assembly, which optionally incorporates one or more features of any one or more of the first to seventeenth aspects, wherein the mounting member has a mounting portion with a first side wall and a second side wall; wherein the first side wall defines the first mounting cavity; wherein the second side wall defines the second mounting cavity; and wherein the pivot axis extends through the first mounting cavity and the second mounting cavity.

In a nineteenth aspect, the present invention resides in a sensor assembly, which optionally incorporates one or more features of any one or more of the first to eighteenth aspects, wherein the mounting member has a base portion; and wherein the mounting portion extends from the base portion.

In a twentieth aspect, the present invention resides in a sensor assembly, which optionally incorporates one or more features of any one or more of the first to nineteenth aspects, wherein the mounting portion has an open end adjacent to the base portion; wherein the first side wall defines a first channel that extends from the open end to the first mounting cavity; wherein the second side wall defines a second channel that extends from the open end to the second mounting cavity; wherein the sensor housing is configured to be inserted into the open end of the mounting portion, between the first side wall and the second side wall, during assembly of the sensor assembly; wherein the first mounting projection is configured to travel through the first channel from the open end to the first mounting cavity during assembly of the sensor assembly; and wherein the second mounting projection is configured to travel through the second channel from the open end to the second mounting cavity during assembly of the sensor assembly.

In a twenty first aspect, the present invention resides in a sensor assembly, which optionally incorporates one or more features of any one or more of the first to twentieth aspects, wherein the first side wall and the second side wall extend perpendicularly from the base portion.

In a twenty second aspect, the present invention resides in a sensor assembly, which optionally incorporates one or more features of any one or more of the first to twenty first aspects, wherein the base portion is planar and lies in a base plane; wherein, when the locking mechanism is in the unlocked state, the adjustment member is slideable relative to the base portion along a sliding axis that is parallel to the base plane; and wherein, when the locking mechanism is in the locked state, the adjustment member engages with the base portion and is prevented from moving along the sliding axis relative to the base portion.

In a twenty third aspect, the present invention resides in a sensor assembly, which optionally incorporates one or more features of any one or more of the first to twenty second aspects, wherein the mounting member is a cover of a container for containing electronics.

In a twenty fourth aspect, the present invention resides in a sensor assembly, which optionally incorporates one or more features of any one or more of the first to twenty third aspects, wherein the container comprises a box for carrying a circuit board.

In a twenty fifth aspect, the present invention resides in a smart module, which optionally incorporates one or more features of any one or more of the first to twenty fourth aspects, comprising a container body that contains a circuit board; wherein the container body comprises the sensor assembly in accordance with any one of the first to twenty fourth aspects.

In a twenty sixth aspect, the present invention resides in an apparatus for dispensing or receiving a product, which optionally incorporates one or more features of any one or more of the first to twenty fifth aspects, the apparatus comprising: a receptacle that defines a product storage space where the product is stored in the receptacle; and the sensor assembly in accordance with any one of the first to twenty fourth aspects; wherein the angular position of the sensor is selected so that the sensor faces towards the product storage space.

In a twenty seventh aspect, the present invention resides in an apparatus, which optionally incorporates one or more features of any one or more of the first to twenty sixth aspects, wherein the sensor is configured to detect a quantity of the product that is present in the product storage space.

In a twenty eighth aspect, the present invention resides in an apparatus, which optionally incorporates one or more features of any one or more of the first to twenty seventh aspects, wherein the apparatus comprises a paper dispenser and the product comprises paper.

In a twenty ninth aspect, the present invention resides in an apparatus, which optionally incorporates one or more features of any one or more of the first to twenty eighth aspects, wherein the paper dispenser comprises a paper towel dispenser and the paper comprises paper towel.

In a thirtieth aspect, the present invention resides in an apparatus, which optionally incorporates one or more features of any one or more of the first to twenty ninth aspects, wherein the paper dispenser comprises a toilet paper dispenser and the paper comprises toilet paper.

In a thirty first aspect, the present invention resides in an apparatus, which optionally incorporates one or more features of any one or more of the first to thirtieth aspects, wherein the apparatus comprises a waste bin and the product comprises a waste product.

In a thirty second aspect, the present invention resides in an apparatus, which optionally incorporates one or more features of any one or more of the first to thirty first aspects, wherein the waste bin comprises a waste paper bin and the waste product comprises waste paper.

In a thirty third aspect, the present invention resides in an apparatus, which optionally incorporates one or more features of any one or more of the first to thirty second aspects, wherein the waste paper bin comprises a waste paper towel bin and the waste paper comprises paper towel.

In a thirty fourth aspect, the present invention resides in a system for providing smart functionality to a plurality of apparatuses, which optionally incorporates one or more features of any one or more of the first to thirty third aspects, the system comprising: the plurality of apparatuses; and a plurality of smart modules; wherein each of the plurality of smart modules has a container body that contains electronics; and wherein each of the plurality of apparatuses has a mounting mechanism that is configured to mountably receive the container body of any one of the plurality of smart modules.

In a thirty fifth aspect, the present invention resides in a system, which optionally incorporates one or more features of any one or more of the first to thirty fourth aspects, wherein each of the plurality of apparatuses has an enclosure.

In a thirty sixth aspect, the present invention resides in a system, which optionally incorporates one or more features of any one or more of the first to thirty fifth aspects, wherein the enclosure has a communication opening; wherein the mounting mechanism is positioned adjacent to the communication opening so that the container body is positioned adjacent to the communication opening when mountably received by the mounting mechanism; and wherein the container body contains a wireless communication device that is configured to send wireless signals, receive wireless signals, or send and receive wireless signals through the communication opening.

In a thirty seventh aspect, the present invention resides in a system, which optionally incorporates one or more features of any one or more of the first to thirty sixth aspects, wherein the mounting mechanism comprises a plug member that is positioned in the communication opening, the plug member being configured to allow the wireless signals to pass through the plug member.

In a thirty eighth aspect, the present invention resides in a system, which optionally incorporates one or more features of any one or more of the first to thirty seventh aspects, wherein the plug member comprises a non-metallic material.

In a thirty ninth aspect, the present invention resides in a system, which optionally incorporates one or more features of any one or more of the first to thirty eighth aspects, wherein the plug member comprises a polymer.

In a fortieth aspect, the present invention resides in a system, which optionally incorporates one or more features of any one or more of the first to thirty ninth aspects, wherein the container body carries at least one indicator light; and wherein the plug member has at least one window through which the at least one indicator light is visible from outside of the enclosure when the container body is mountably received by the mounting mechanism.

In a forty first aspect, the present invention resides in a system, which optionally incorporates one or more features of any one or more of the first to fortieth aspects, wherein the enclosure comprises a metallic enclosure.

In a forty second aspect, the present invention resides in a system, which optionally incorporates one or more features of any one or more of the first to forty first aspects, wherein the enclosure comprises a stainless steel enclosure.

In a forty third aspect, the present invention resides in a system, which optionally incorporates one or more features of any one or more of the first to forty second aspects, wherein each of the plurality of apparatuses has a mounting and locking body that is mounted to the enclosure; wherein the mounting and locking body comprises the mounting mechanism and an enclosure locking mechanism; wherein the enclosure has an open state and a closed state; wherein, when the enclosure is in the closed state and the enclosure locking mechanism is in a locked condition, the enclosure locking mechanism locks the enclosure in the closed state.

In a forty fourth aspect, the present invention resides in a system, which optionally incorporates one or more features of any one or more of the first to forty third aspects, wherein the system further comprises a plurality of tools; wherein the enclosure locking mechanism comprises a tool receiving aperture that is configured to receive any one of the plurality of tools; wherein the enclosure locking mechanism is moved from the locked condition to an unlocked condition by inserting any one of the plurality of tools into the tool receiving aperture and rotating the tool relative to the enclosure locking mechanism; and wherein the enclosure is moveable from the closed state to the open state when the enclosure locking mechanism is in the unlocked condition.

In a forty fifth aspect, the present invention resides in a system, which optionally incorporates one or more features of any one or more of the first to forty fourth aspects, wherein the tool receiving aperture is a first tool receiving aperture; wherein the mounting mechanism comprises a second tool receiving aperture that is configured to receive any one of the plurality of tools; and wherein the container body is removable from the mounting mechanism by inserting any one of the plurality of tools into the second tool receiving aperture and rotating the tool relative to the mounting mechanism.

In a forty sixth aspect, the present invention resides in a system, which optionally incorporates one or more features of any one or more of the first to forty fifth aspects, wherein the system further comprises a plurality of battery modules; and wherein each of the apparatuses has a battery mounting structure that is configured to carry any one of the plurality of battery modules.

In a forty seventh aspect, the present invention resides in a system, which optionally incorporates one or more features of any one or more of the first to forty sixth aspects, wherein the battery mounting structure is positioned adjacent to the mounting mechanism.

In a forty eighth aspect, the present invention resides in a system, which optionally incorporates one or more features of any one or more of the first to forty seventh aspects, wherein the battery mounting structure comprises a resiliently flexible clip.

In a forty ninth aspect, the present invention resides in a system, which optionally incorporates one or more features of any one or more of the first to forty eighth aspects, wherein the plurality of apparatuses comprises a plurality of paper towel dispensers.

In a fiftieth aspect, the present invention resides in a system, which optionally incorporates one or more features of any one or more of the first to forty ninth aspects, wherein the plurality of apparatuses comprises a plurality of toilet paper dispensers.

In a fifty first aspect, the present invention resides in a system, which optionally incorporates one or more features of any one or more of the first to fiftieth aspects, wherein the plurality of apparatuses comprises a plurality of waste bins.

In a fifty second aspect, the present invention resides in a system, which optionally incorporates one or more features of any one or more of the first to fifty first aspects, wherein the plurality of apparatuses comprises a plurality of paper towel dispensers, a plurality of toilet paper dispensers, and a plurality of waste bins.

In a fifty third aspect, the present invention resides in a system, which optionally incorporates one or more features of any one or more of the first to fifty second aspects, wherein at least some of the plurality of smart modules comprise the sensor assembly in accordance with any one of the first to twenty fourth aspects.

In a fifty fourth aspect, the present invention resides in a method of providing smart functionality, which optionally incorporates one or more features of any one or more of the first to fifty third aspects, the method comprising: providing a plurality of smart modules, each of the plurality of smart modules having a container body that contains electronics; providing a plurality of apparatuses, each of the plurality of apparatuses having a mounting mechanism that is configured to mountably receive the container body of any one of the plurality of smart modules; and for each one of the plurality of apparatuses that is to be provided with smart functionality, mounting one of the plurality of smart modules to the mounting mechanism.

In a fifty fifth aspect, the present invention resides in a method, which optionally incorporates one or more features of any one or more of the first to fifty fourth aspects, wherein at least some of the plurality of smart modules comprise the sensor assembly in accordance with any one of the first to twenty fourth aspects.

In a fifty sixth aspect, the present invention resides in a method, which optionally incorporates one or more features of any one or more of the first to fifty fifth aspects, further comprising, for each of the plurality of smart modules that comprise the sensor assembly in accordance with any one of the first to twenty fourth aspects, locking the sensor housing at the selected angular position before the smart module is mounted to the mounting mechanism.

In a fifty seventh aspect, the present invention resides in a method, which optionally incorporates one or more features of any one or more of the first to fifty sixth aspects, wherein the method is performed using the system in accordance with any one of the thirty fourth to fifty third aspects.

In a fifty eighth aspect, the present invention resides in a system, which optionally incorporates one or more features of any one or more of the first to fifty seventh aspects, wherein the plurality of apparatuses comprises a first set of apparatuses that perform a first function and a second set of apparatuses that perform a second function that is different from the first function.

In a fifty ninth aspect, the present invention resides in a sensor assembly, which optionally incorporates one or more features of any one or more of the first to fifty eighth aspects, comprising: a sensor; a sensor housing that carries the sensor; a mounting member that pivotally engages with the sensor housing; an adjustment member for selecting an angular position of the sensor housing relative to the mounting member; and a locking mechanism for locking the sensor housing at the selected angular position relative to the mounting member; wherein the sensor housing comprises a first mounting element and a first adjustment element; wherein the mounting member comprises a second mounting element that pivotally engages with the first mounting element so as to permit pivotal movement of the sensor housing about a pivot axis relative to the mounting member;

wherein the adjustment member comprises a second adjustment element that engages with the first adjustment element; wherein, when the locking mechanism is in an unlocked state, the adjustment member is slideable relative to the mounting member between a first location and a second location; wherein, when the adjustment member is moved relative to the mounting member between the first location and the second location, the engagement of the second adjustment element with the first adjustment element pivots the sensor housing about the pivot axis relative to the mounting member between a first angular position and a second angular position; wherein the angular position of the sensor housing relative to the mounting member is selectable by adjusting a location of the adjustment member relative to the mounting member; and wherein, when the sensor housing is at the selected angular position relative to the mounting member and the locking mechanism is in a locked state, the adjustment member is prevented from sliding relative to the mounting member, and the engagement of the second adjustment element with the first adjustment element locks the sensor housing at the selected angular position relative to the mounting member.

In a sixtieth aspect, the present invention resides in a sensor assembly, which optionally incorporates one or more features of any one or more of the first to fifty ninth aspects, wherein the mounting member has a locking surface that is spaced from the pivot axis; wherein the adjustment member has a lock surface that faces towards the locking surface and is slideable relative to the locking surface when the locking mechanism is in the unlocked state; and wherein, when the locking mechanism is in the locked state, the lock surface engages with the locking surface so as to prevent the adjustment member from moving relative to the mounting member.

In a sixty first aspect, the present invention resides in a sensor assembly, which optionally incorporates one or more features of any one or more of the first to sixtieth aspects, wherein, when the locking mechanism is in the locked state, the locking mechanism applies pressure to the adjustment member to force the lock surface into engagement with the locking surface.

In a sixty second aspect, the present invention resides in a sensor assembly, which optionally incorporates one or more features of any one or more of the first to sixty first aspects, wherein the locking mechanism comprises a fastener having a threaded shaft and a head; wherein the adjustment member comprises a fastener slot; wherein the mounting member comprises a threaded hole; wherein the threaded shaft extends through the fastener slot and into the threaded hole, with the adjustment member being positioned between the head and the mounting member; wherein, when the locking mechanism is in the unlocked state, the head is sufficiently spaced from the mounting member to allow the adjustment member to slide between the first location and the second location; wherein placing the locking mechanism in the locked state comprises rotating the threaded shaft relative to the threaded hole so as to move the head towards the mounting member; and wherein, when the locking mechanism is in the locked state, the head engages with the adjustment member to force the lock surface into engagement with the locking surface.

In a sixty third aspect, the present invention resides in a sensor assembly, which optionally incorporates one or more features of any one or more of the first to sixty second aspects, wherein the locking surface faces away from the pivot axis; wherein the locking surface is planar; and wherein the locking surface is parallel to the pivot axis.

In a sixty fourth aspect, the present invention resides in a sensor assembly, which optionally incorporates one or more features of any one or more of the first to sixty third aspects, wherein the first adjustment element comprises an adjustment projection; wherein the second adjustment element comprises an adjustment slot that receives the adjustment projection; wherein the adjustment projection extends along a projection axis that is spaced from the pivot axis and parallel to the pivot axis; wherein, when the locking mechanism is in the unlocked state, the adjustment member is slideable relative to the mounting member between the first location and the second location along an adjustment axis; and wherein the adjustment axis is spaced from the pivot axis and lies in an adjustment plane that is perpendicular to the pivot axis.

In a sixty fifth aspect, the present invention resides in a sensor assembly, which optionally incorporates one or more features of any one or more of the first to sixty fourth aspects, wherein the adjustment slot has a closed terminal end; wherein the adjustment projection is slideable within the adjustment slot relative to the closed terminal end; wherein a distance between the adjustment projection and the closed terminal end changes as the adjustment member moves between the first location and the second location; and wherein the adjustment slot has an open end for receiving the adjustment projection during assembly of the sensor assembly.

In a sixty sixth aspect, the present invention resides in a sensor assembly, which optionally incorporates one or more features of any one or more of the first to sixty fifth aspects, wherein the sensor housing has an outer wall that defines an inner cavity; wherein the inner cavity has an open adjustment end; wherein the adjustment projection extends inwardly from the outer wall into the inner cavity; wherein the adjustment member comprises an adjustment slot defining body that defines the adjustment slot; wherein the adjustment slot defining body extends through the open adjustment end into the inner cavity of the sensor housing; wherein the outer wall has a side portion that is perpendicular to the pivot axis; and wherein the adjustment projection extends inwardly into the inner cavity from the side portion of the outer wall.

In a sixty seventh aspect, the present invention resides in a sensor assembly, which optionally incorporates one or more features of any one or more of the first to sixty sixth aspects, wherein the first mounting element comprises a first mounting projection and a second mounting projection; wherein the second mounting element comprises a first mounting cavity that receives the first mounting projection and a second mounting cavity that receives the second mounting projection; wherein the sensor housing has a first outer surface and a second outer surface; wherein the first mounting projection extends outwardly from the first outer surface along the pivot axis; wherein the second mounting projection extends outwardly from the second outer surface along the pivot axis; wherein the mounting member has a mounting portion with a first side wall and a second side wall; wherein the first side wall defines the first mounting cavity; wherein the second side wall defines the second mounting cavity; and wherein the pivot axis extends through the first mounting cavity and the second mounting cavity.

In a sixty eighth aspect, the present invention resides in a sensor assembly, which optionally incorporates one or more features of any one or more of the first to sixty seventh aspects, wherein the mounting member has a base portion; and wherein the mounting portion extends from the base portion.

In a sixty ninth aspect, the present invention resides in a sensor assembly, which optionally incorporates one or more features of any one or more of the first to sixty eighth aspects, wherein the mounting portion has an open end adjacent to the base portion; wherein the first side wall defines a first channel that extends from the open end to the first mounting cavity; wherein the second side wall defines a second channel that extends from the open end to the second mounting cavity; wherein the sensor housing is configured to be inserted into the open end of the mounting portion, between the first side wall and the second side wall, during assembly of the sensor assembly; wherein the first mounting projection is configured to travel through the first channel from the open end to the first mounting cavity during assembly of the sensor assembly; and wherein the second mounting projection is configured to travel through the second channel from the open end to the second mounting cavity during assembly of the sensor assembly.

In a seventieth aspect, the present invention resides in a sensor assembly, which optionally incorporates one or more features of any one or more of the first to sixty ninth aspects, wherein the first side wall and the second side wall extend perpendicularly from the base portion.

In a seventy first aspect, the present invention resides in a sensor assembly, which optionally incorporates one or more features of any one or more of the first to seventieth aspects, wherein the base portion is planar and lies in a base plane; wherein, when the locking mechanism is in the unlocked state, the adjustment member is slideable relative to the base portion along a sliding axis that is parallel to the base plane; and wherein, when the locking mechanism is in the locked state, the adjustment member engages with the base portion and is prevented from moving along the sliding axis relative to the base portion.

In a seventy second aspect, the present invention resides in a sensor assembly, which optionally incorporates one or more features of any one or more of the first to seventy first aspects, wherein the mounting member is a cover of a container for containing electronics.

In a seventy third aspect, the present invention resides in a sensor assembly, which optionally incorporates one or more features of any one or more of the first to seventy second aspects, wherein the container comprises a box for carrying a circuit board; and wherein the sensor comprises a time of flight sensor.

In a seventy fourth aspect, the present invention resides in a sensor assembly, which optionally incorporates one or more features of any one or more of the first to seventy third aspects, wherein the locking surface faces away from the pivot axis; wherein the locking surface is planar; wherein the locking surface is parallel to the pivot axis; wherein the first adjustment element comprises an adjustment projection; wherein the second adjustment element comprises an adjustment slot that receives the adjustment projection; wherein the adjustment projection extends along a projection axis that is spaced from the pivot axis and parallel to the pivot axis; wherein, when the locking mechanism is in the unlocked state, the adjustment member is slideable relative to the mounting member between the first location and the second location along an adjustment axis; and wherein the adjustment axis is spaced from the pivot axis and lies in an adjustment plane that is perpendicular to the pivot axis.

In a seventy fifth aspect, the present invention resides in a sensor assembly, which optionally incorporates one or more features of any one or more of the first to seventy fourth aspects, wherein the adjustment slot has a closed terminal end; wherein the adjustment projection is slideable within the adjustment slot relative to the closed terminal end; wherein a distance between the adjustment projection and the closed terminal end changes as the adjustment member moves between the first location and the second location; wherein the adjustment slot has an open end for receiving the adjustment projection during assembly of the sensor assembly; wherein the sensor housing has an outer wall that defines an inner cavity; wherein the inner cavity has an open adjustment end; wherein the adjustment projection extends inwardly from the outer wall into the inner cavity; wherein the adjustment member comprises an adjustment slot defining body that defines the adjustment slot; wherein the adjustment slot defining body extends through the open adjustment end into the inner cavity of the sensor housing; wherein the outer wall has a side portion that is perpendicular to the pivot axis; and wherein the adjustment projection extends inwardly into the inner cavity from the side portion of the outer wall.

In a seventy sixth aspect, the present invention resides in a sensor assembly, which optionally incorporates one or more features of any one or more of the first to seventy fifth aspects, wherein the first mounting element comprises a first mounting projection and a second mounting projection; wherein the second mounting element comprises a first mounting cavity that receives the first mounting projection and a second mounting cavity that receives the second mounting projection; wherein the sensor housing has a first outer surface and a second outer surface; wherein the first mounting projection extends outwardly from the first outer surface along the pivot axis; wherein the second mounting projection extends outwardly from the second outer surface along the pivot axis; wherein the mounting member has a mounting portion with a first side wall and a second side wall; wherein the first side wall defines the first mounting cavity; wherein the second side wall defines the second mounting cavity; and wherein the pivot axis extends through the first mounting cavity and the second mounting cavity.

In a seventy seventh aspect, the present invention resides in a sensor assembly, which optionally incorporates one or more features of any one or more of the first to seventy sixth aspects, wherein the mounting member has a base portion; wherein the mounting portion extends from the base portion; wherein the mounting portion has an open end adjacent to the base portion; wherein the first side wall defines a first channel that extends from the open end to the first mounting cavity; wherein the second side wall defines a second channel that extends from the open end to the second mounting cavity; wherein the sensor housing is configured to be inserted into the open end of the mounting portion, between the first side wall and the second side wall, during assembly of the sensor assembly; wherein the first mounting projection is configured to travel through the first channel from the open end to the first mounting cavity during assembly of the sensor assembly; wherein the second mounting projection is configured to travel through the second channel from the open end to the second mounting cavity during assembly of the sensor assembly; wherein the first side wall and the second side wall extend perpendicularly from the base portion; wherein the base portion is planar and lies in a base plane; wherein, when the locking mechanism is in the unlocked state, the adjustment member is slideable relative to the base portion along a sliding axis that is parallel to the base plane; and wherein, when the locking mechanism is in the locked state, the adjustment member engages with the base portion and is prevented from moving along the sliding axis relative to the base portion.

In a seventy eighth aspect, the present invention resides in a sensor assembly, which optionally incorporates one or more features of any one or more of the first to seventy seventh aspects, wherein the mounting member is a cover of a container for containing electronics; wherein the container comprises a box for carrying a circuit board; and wherein the sensor comprises a time of flight sensor.

BRIEF DESCRIPTION OF THE DRAWINGS

Further aspects and advantages of the invention will appear from the following description taken together with the accompanying drawings, in which.

DETAILED DESCRIPTION OF THE DRAWINGS

Figure 1:
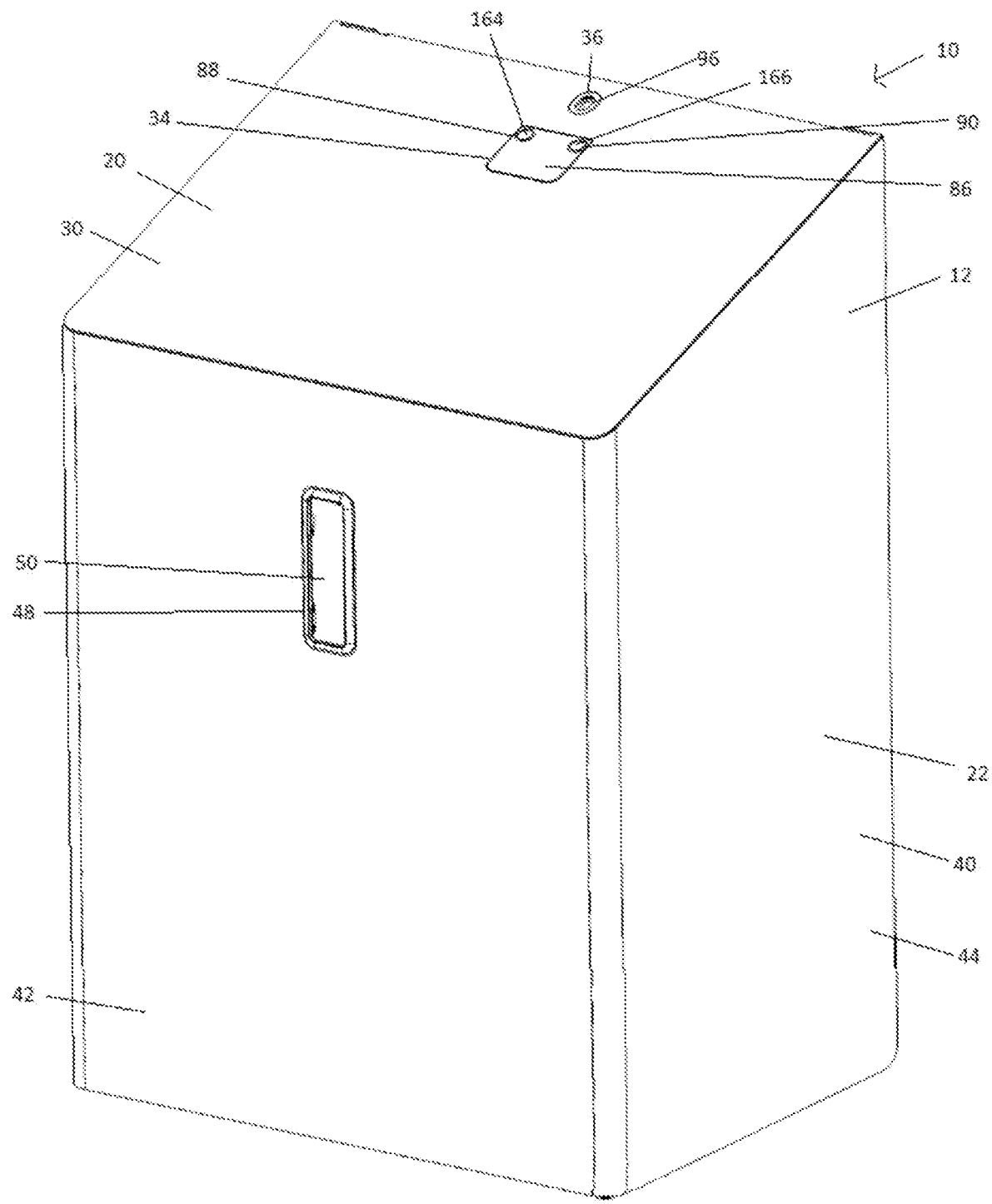
FIG. 1 is a perspective view of a paper towel dispenser in accordance with a first embodiment of the present invention.

FIGS. 1 to 29 show a paper towel dispenser 10 in accordance with a first embodiment of the present invention. The paper towel dispenser 10 includes an enclosure 12, a paper towel dispensing mechanism 14, a mounting and locking body 16, and a smart module 18.

Figure 2:
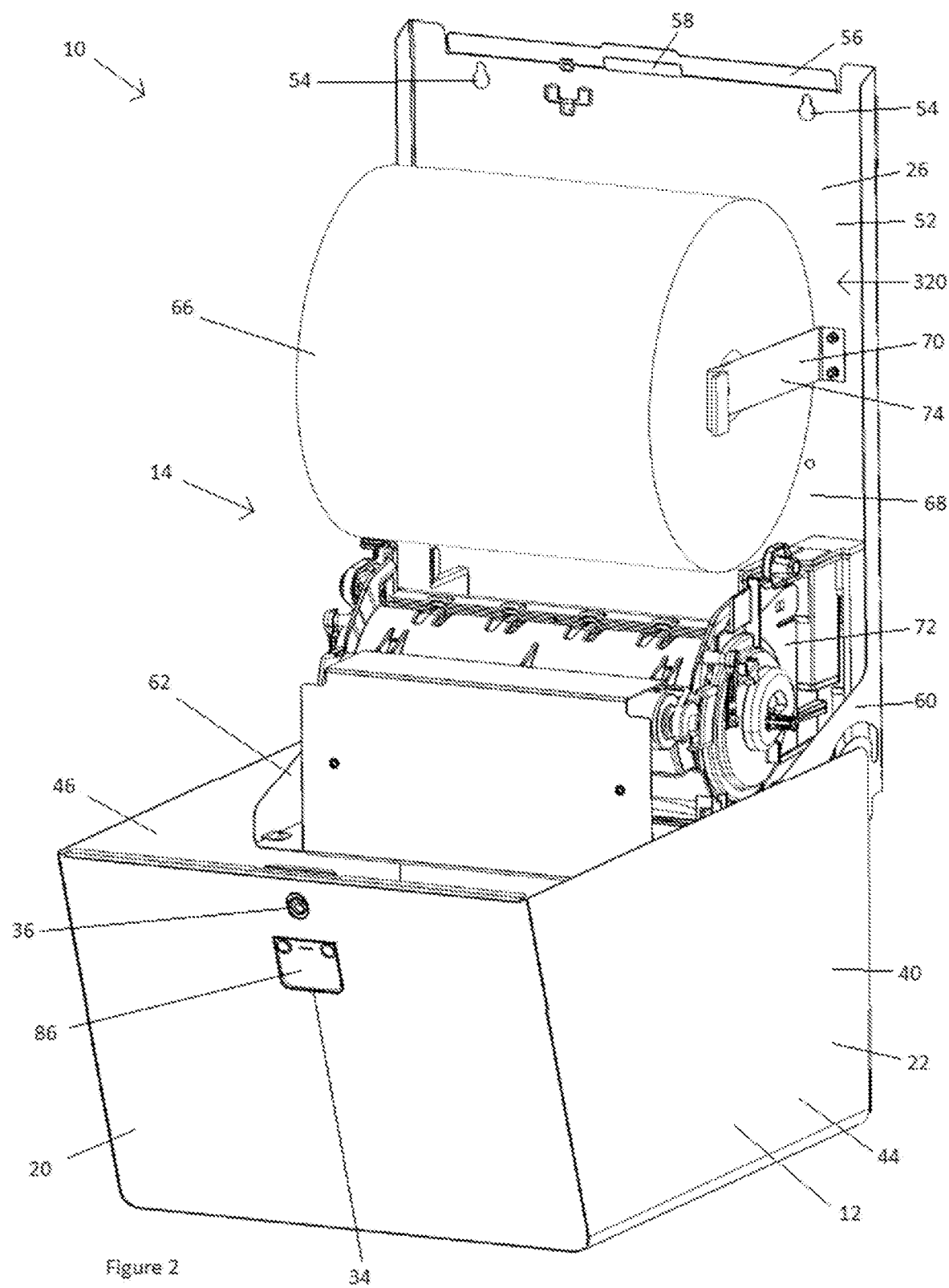
FIG. 2 is a perspective view of the paper towel dispenser shown in FIG. 1, with an enclosure of the paper towel dispenser shown in an open state.
Figure 3:
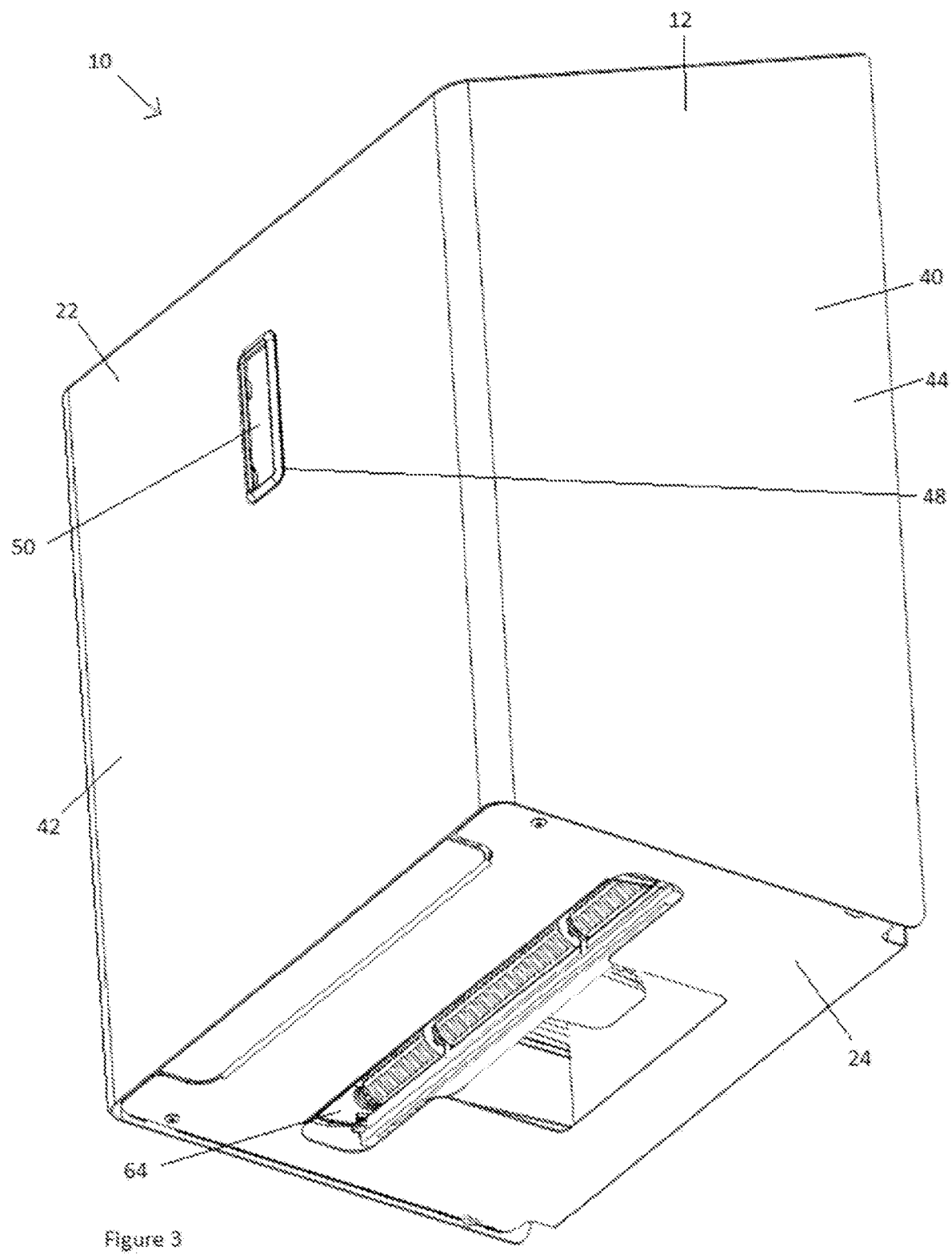
FIG. 3 is a bottom perspective view of the paper towel dispenser shown in FIG. 1.

As can be seen in FIGS. 1 to 3, the enclosure 12 has a top panel 20, a front and side panel 22, a bottom panel 24, and a back panel 26. The top panel 20, the front and side panel 22, the bottom panel 24, and the back panel 26 are preferably formed from stainless steel sheet metal, but could be formed from other suitable metallic or non-metallic materials as well.

Figure 4:
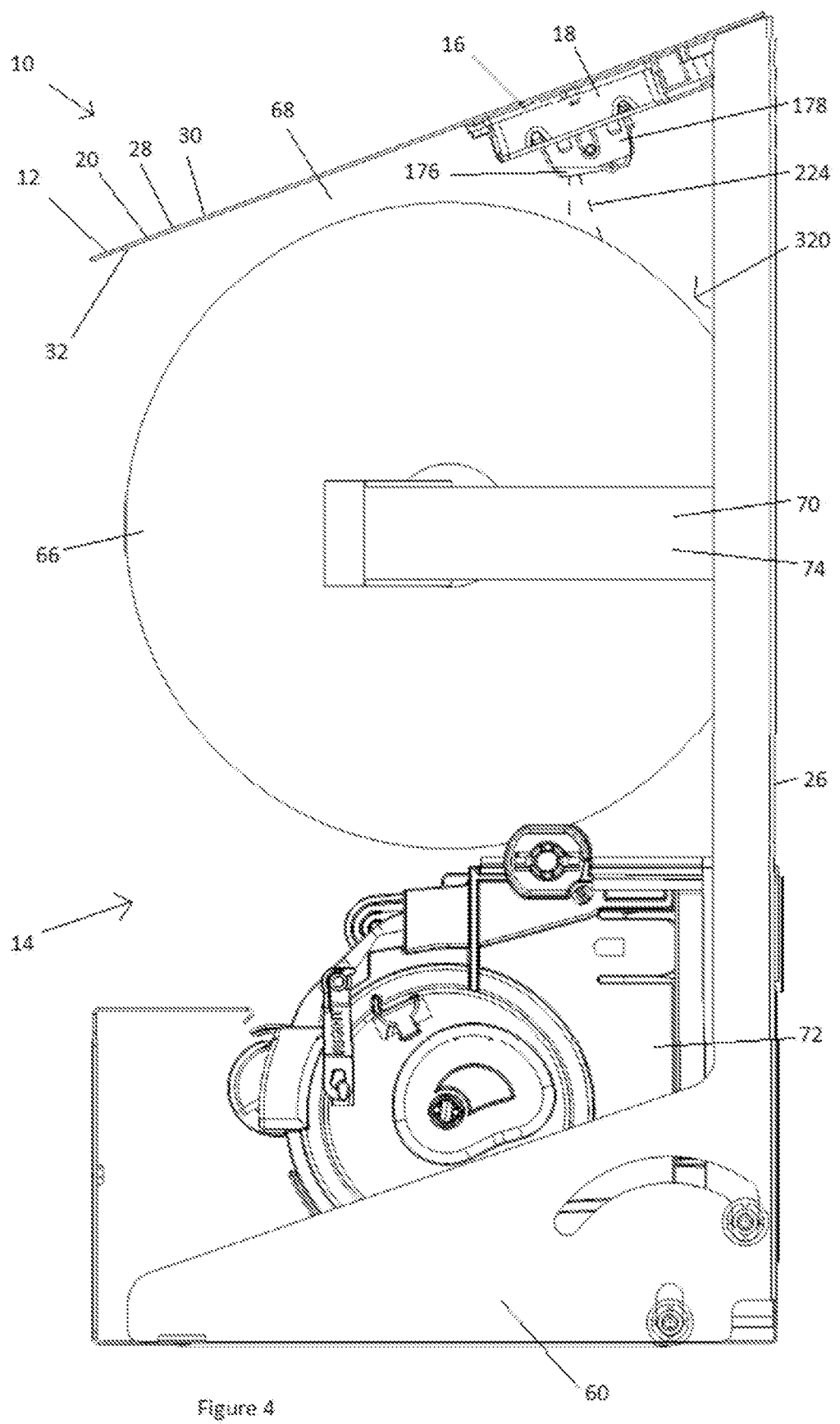
FIG. 4 is a side view of the paper towel dispenser shown in FIG. 1, with a front and side panel of the enclosure omitted, and with the dispenser containing a full paper towel roll.
Figure 5:
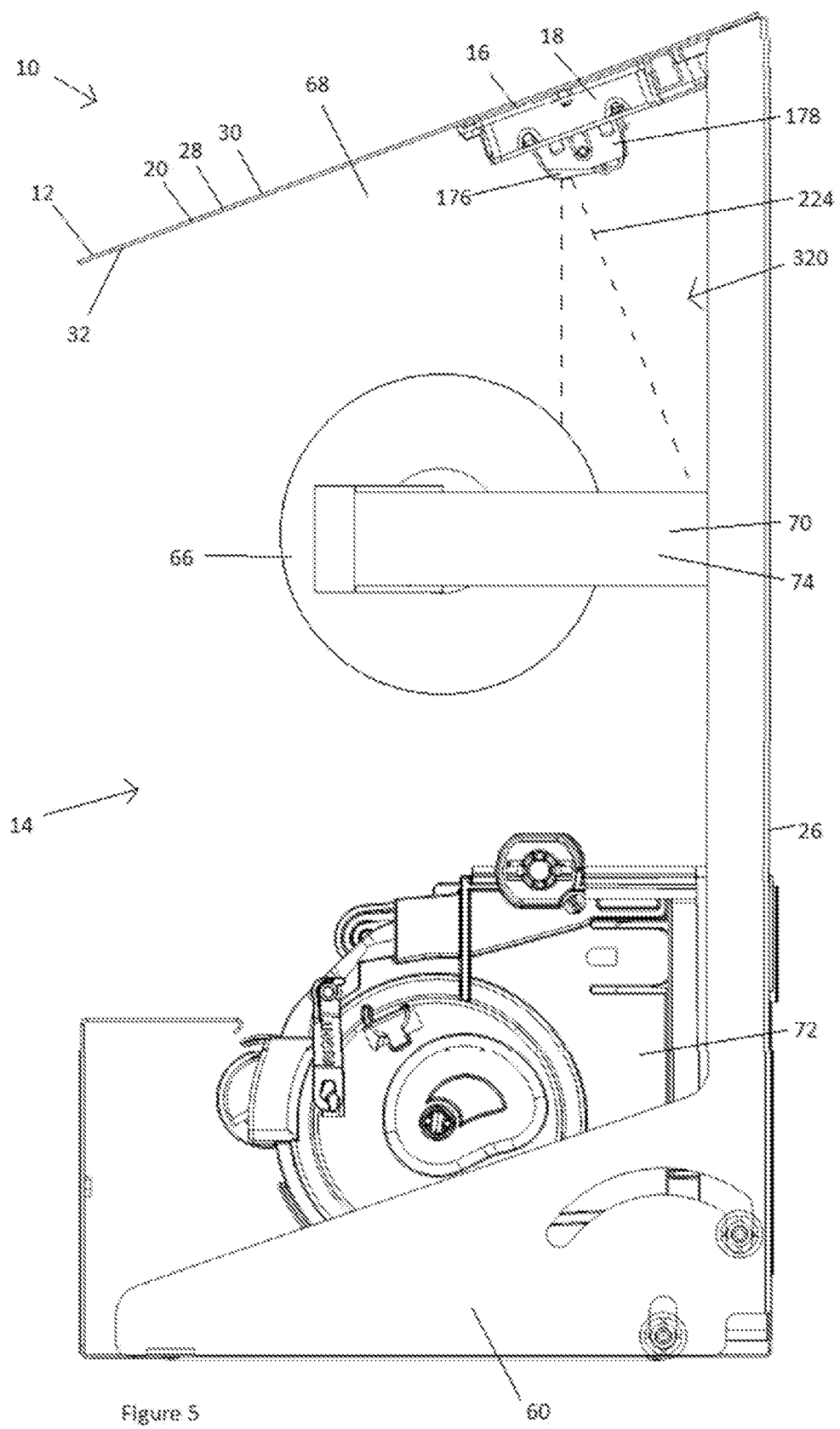
FIG. 5 is a side view of the paper towel dispenser the same as in FIG. 4, but with the dispenser containing a depleted paper towel roll.
Figure 6:
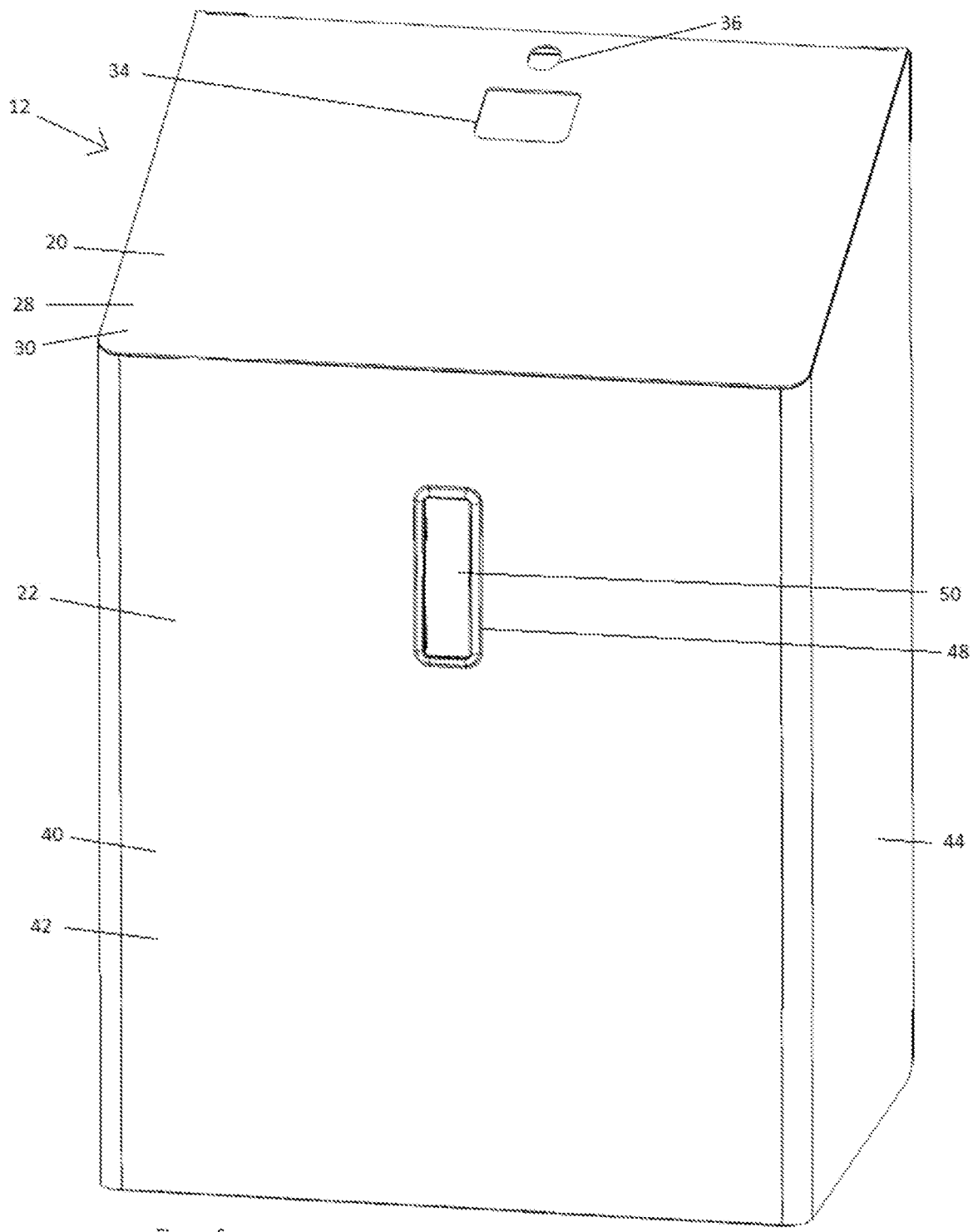
FIG. 6 is a perspective view of the enclosure of the paper towel dispenser shown in FIG. 1.
Figure 7:
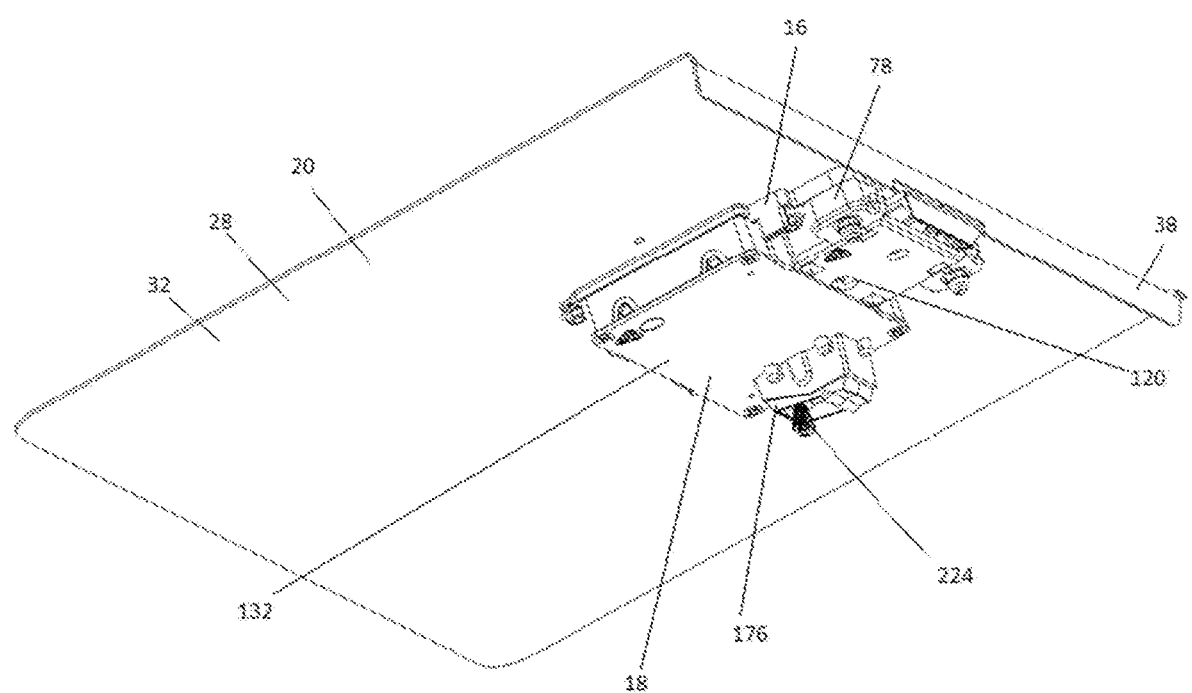
FIG. 7 is a bottom perspective view of a top panel of the enclosure of the paper towel dispenser shown in FIG. 1, showing a mounting and locking body mounted to the top panel and a smart module attached to the mounting and locking body.

As can be seen in FIGS. 4 to 7, the top panel 20 has a thin, planar top panel body 28 with an outwardly directed surface 30 and an inwardly directed surface 32. As shown in FIG. 6, the top panel body 28 defines a generally rectangular communication opening 34 and a generally elliptical tool receiving opening 36. As can be seen in FIG. 7, the top panel 20 also has a back panel engagement lip 38 that extends downwardly at the rear edge of the top panel body 28.

As can be seen in FIGS. 1 and 2, the front and side panel 22 has a front and side panel body 40 with a front portion 42 and two side portions 44 and 46 that extend rearwardly from the left and right sides of the front portion 42, respectively. The top of the front portion 42 is attached to the front edge of the top panel body 28, and the tops of the side portions 44 and 46 are attached to the left and right side edges of the top panel body 28, respectively. The front portion 42 defines a window opening 48 that carries a transparent window member 50. The window member 50 allows an inner chamber 68 defined by the enclosure 12 to be viewed from outside of the enclosure 12. The side portions 44 and 46 are hingedly connected to the back panel 26 so as to permit the front and side panel 22 and the top panel 20 to move relative to the back panel 26 between the closed state shown in FIG. 1 and the open state shown in FIG. 2, as is known in the art.

As shown in FIG. 2, the back panel 26 has a back panel body 52 with connection openings 54 for receiving fasteners to attach the enclosure 12 to a vertical support surface, such as a wall. The top edge of the back panel body 52 has an upper lip 56 that defines a lock opening 58. Side connection bodies 60 and 62 extend forwardly from the left and right sides of the back panel body 52 for hingedly engaging with the side portions 44 and 46 of the front and side panel 22.

As can be seen in FIG. 3, the bottom panel 24 defines a bottom opening 64 for delivering paper towel 66 from the paper towel dispenser 10.

The paper towel dispensing mechanism 14 is mounted inside the inner chamber 68 of the enclosure 12. As can be seen in FIG. 2, the paper towel dispensing mechanism 14 includes a roll holding mechanism 70 and a dispensing mechanism 72. The roll holding mechanism 70 includes two roll holding arms 74 that are attached to the back panel body 52 and which are configured to rotatably carry a roll of paper towel 66. Only one of the two roll holding arms 74 is visible in FIG. 2. The dispensing mechanism 14 is configured to draw paper towel 66 from the roll holding mechanism 70, and dispense the paper towel 66 out through the bottom opening 64 when the dispensing mechanism 72 is activated, as is known in the art. Any suitable dispensing mechanism 72 for dispensing the paper towel 66 from the dispenser 10 could be used.

Figure 8:
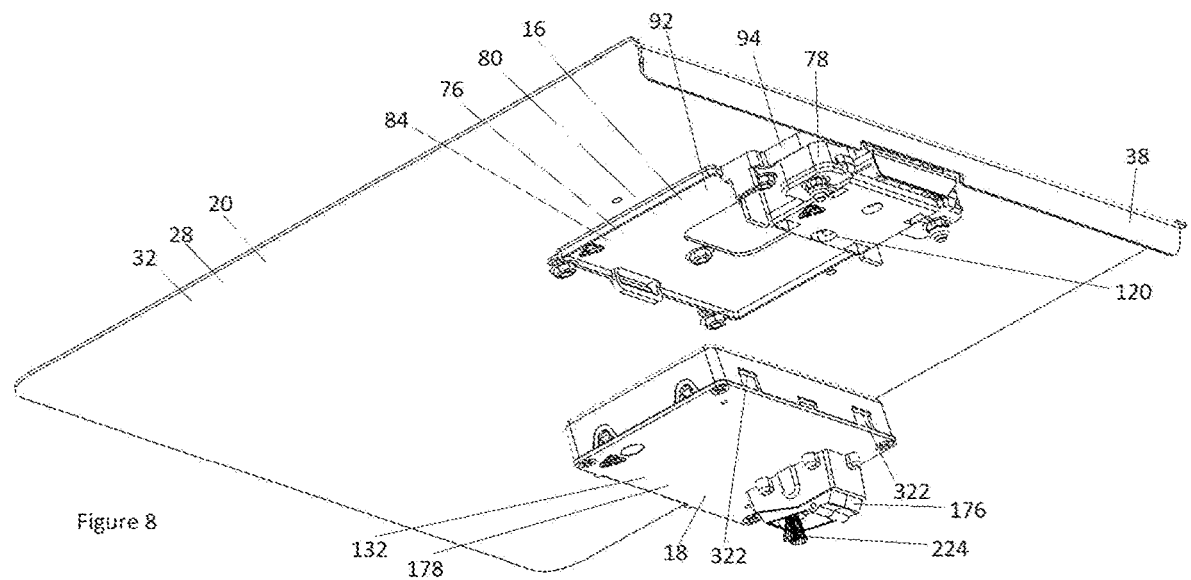
FIG. 8 is a bottom perspective view of the top panel of the enclosure of the paper towel dispenser the same as in FIG. 7, but showing the smart module detached from the mounting and locking body.
Figure 25:
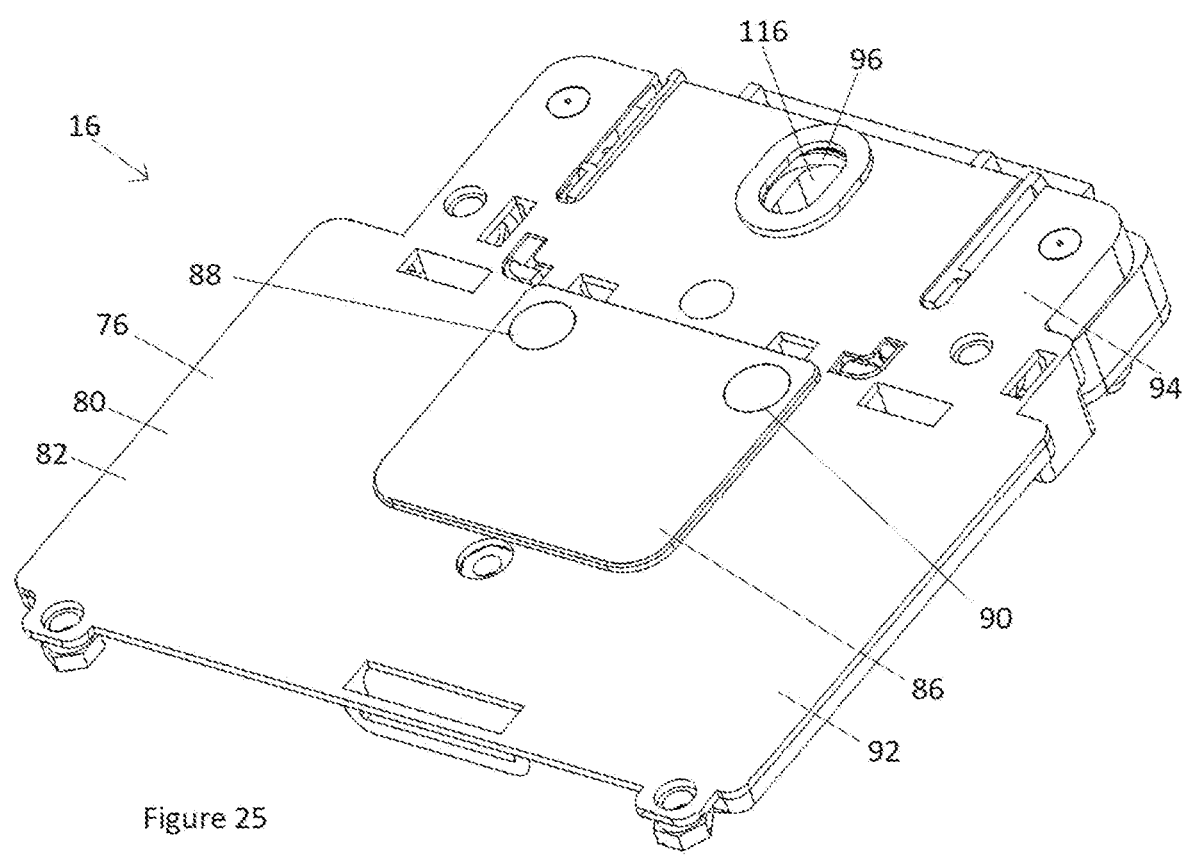
FIG. 25 is a perspective view of the mounting and locking body shown in FIG. 7, showing an upwardly facing side of the mounting and locking body.
Figure 26:
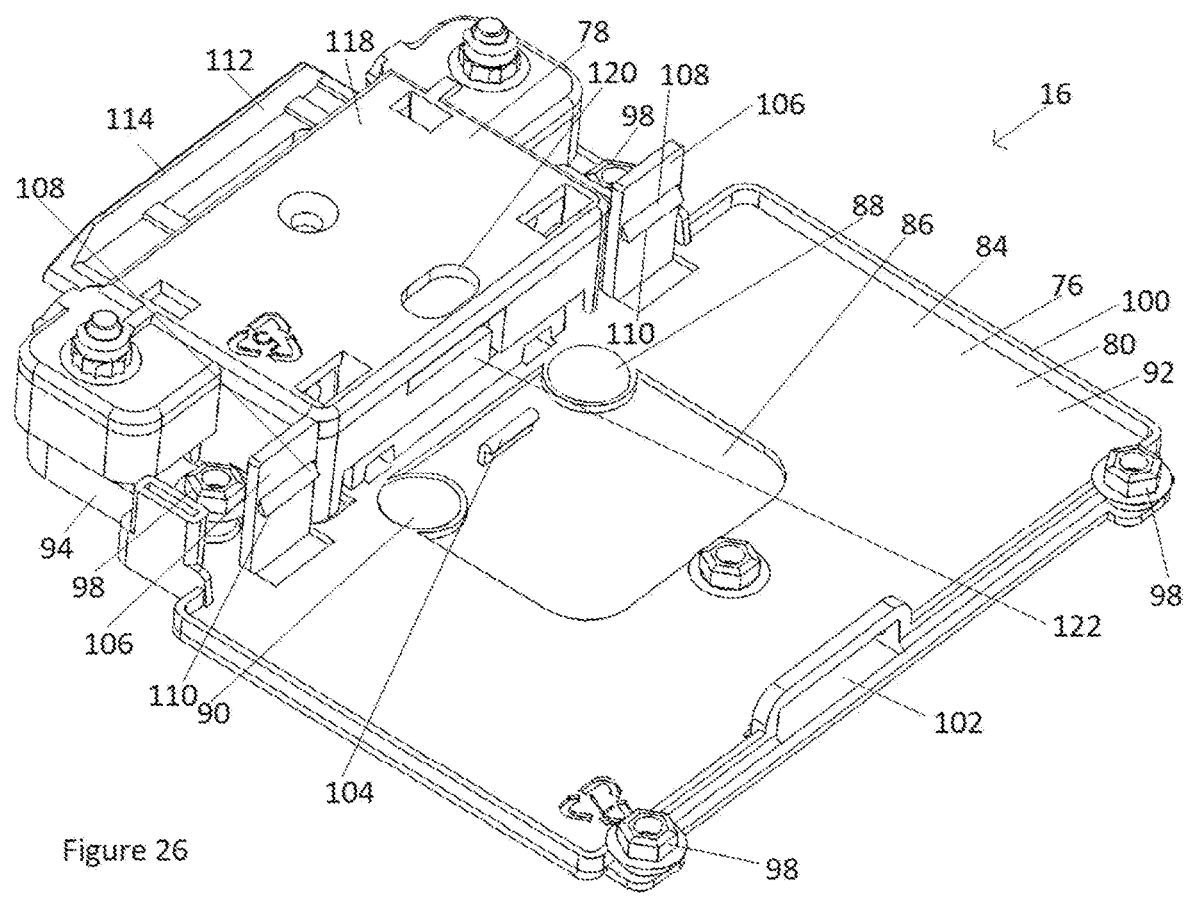
FIG. 26 is a perspective view of the mounting and locking body shown in FIG. 25, showing a downwardly facing side of the mounting and locking body.
Figure 27:
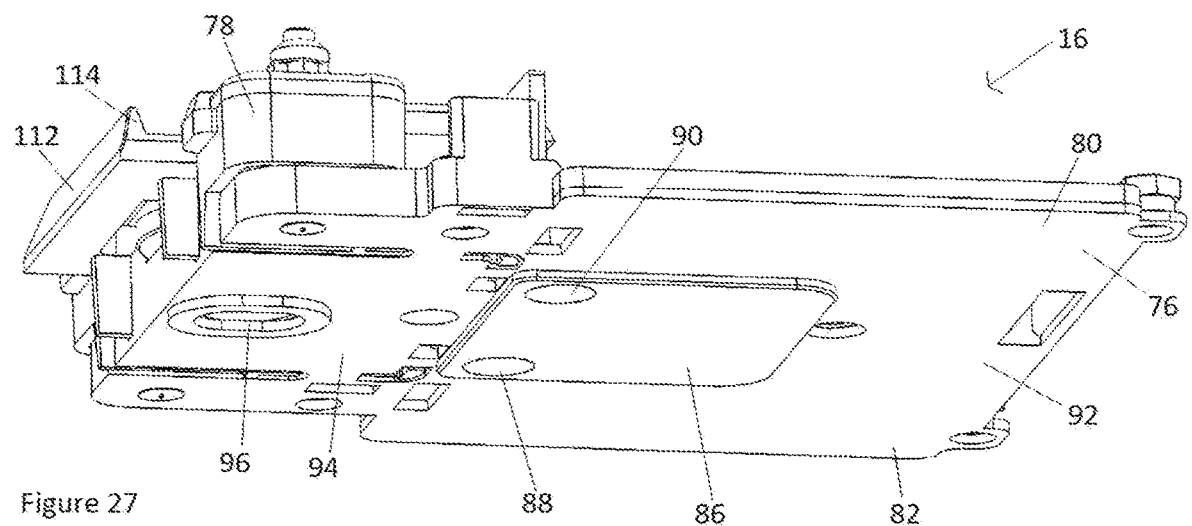
FIG. 27 is a perspective view of the mounting and locking body shown in FIG. 25, showing the upwardly facing side of the mounting and locking body.
Figure 28:
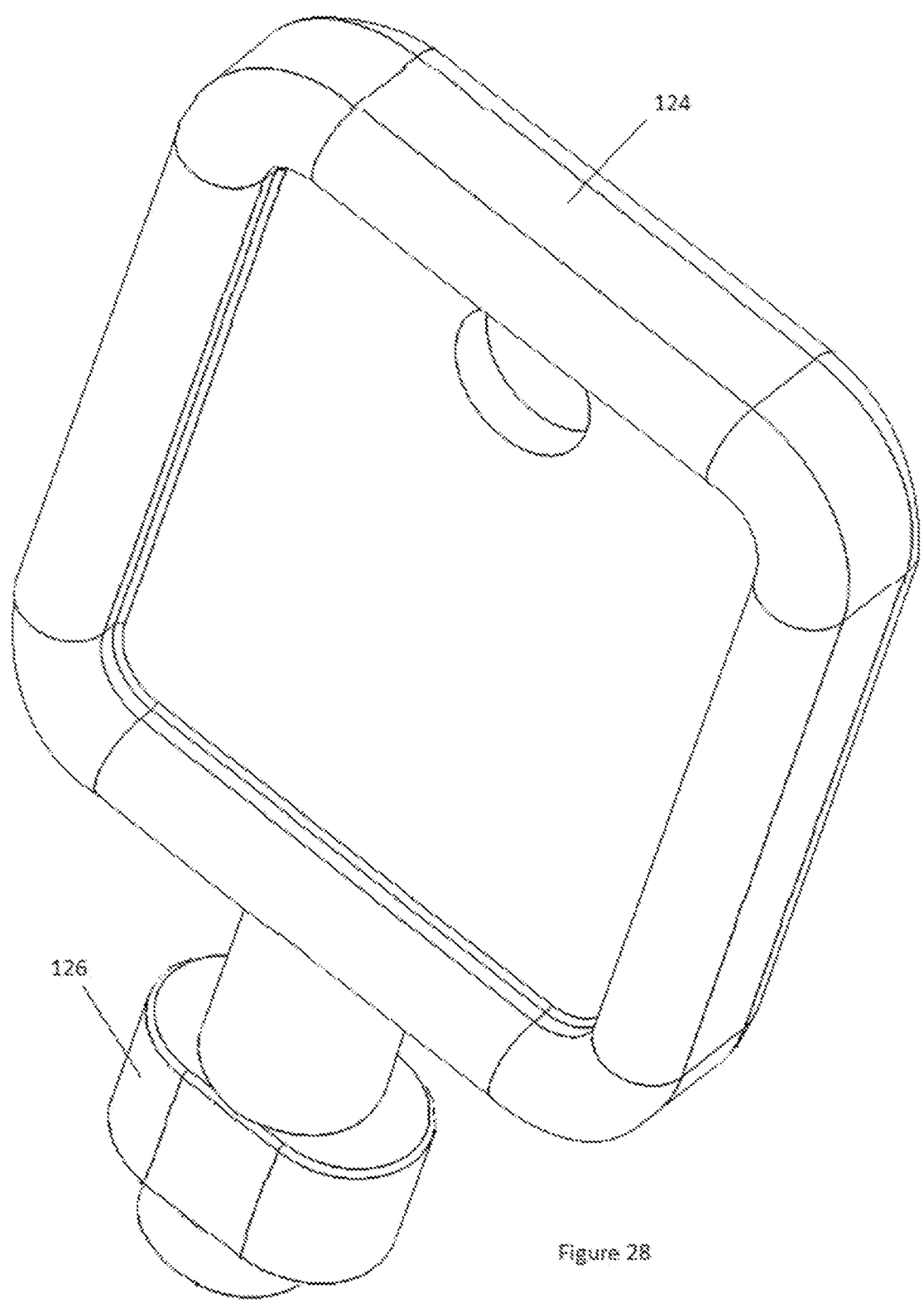
FIG. 28 is a perspective view of an unlocking tool used with the paper towel dispenser shown in FIG. 1.

As can be seen in FIG. 8, the mounting and locking body 16 is attached to the inwardly directed surface 32 of the top panel 20. Referring to FIGS. 25 to 27, the mounting and locking body 16 includes an attachment portion 76 and a locking portion 78. The attachment portion 76 has a generally planar attachment body 80 with a smart module attachment area 92 and a locking body attachment area 94. The attachment portion 76 also has an enclosure attachment side 82, as shown in FIGS. 25 and 27, and a smart module attachment side 84, as shown in FIG. 26.

As can be seen in FIG. 25, the attachment portion 76 has a plug member 86 that extends upwardly from the enclosure attachment side 82 of the smart module attachment area 92. The plug member 86 has a generally rectangular shape and is configured to be received by the communication opening 34 in the top panel 20, as can be seen in FIG. 1. The plug member 86 has two transparent indicator windows 88 and 90. The plug member 86 is formed from a material, such as plastic, that allows wireless signals to pass through the plug member 86.

As can be seen in FIG. 25, the locking body attachment area 94 of the attachment portion 76 defines a first tool receiving aperture 96. The first tool receiving aperture 96 aligns with the tool receiving opening 36 in the top panel 20 of the enclosure 12. The attachment portion 76 is attached to the top panel 20 of the enclosure 12 by a plurality of fasteners 98.

As can be seen in FIG. 26, the smart module attachment area 92 has a generally rectangular border wall 100 that extends downwardly from the smart module attachment side 84. At a center front portion of the smart module attachment area 92, the border wall 100 separates from the attachment body 80 to define a projection receiving opening 102 between the border wall 100 and the attachment body 80.

As can also be seen in FIG. 26, a hook member 104 extends downwardly from the smart module attachment side 84 of the plug member 86. Two catch arms 106 also extend downwardly from the smart module attachment side 84 of the attachment portion 76 on either side of the plug member 86. Each catch arm 106 has a forwardly extending catch member 108 that presents an upwardly directed catch surface 110.

As can be seen in FIGS. 26 and 27, the locking portion 78 is attached to the smart module attachment side 84 of the locking body attachment area 94 of the attachment portion 76. As shown in FIG. 27, the locking portion 78 has a rearwardly extending enclosure locking hook 112 with an upwardly extending hook end 114. The locking portion 78 has an internal enclosure unlocking mechanism 116 that is accessible via the first tool receiving aperture 96. The enclosure unlocking mechanism 116 can be activated by inserting the tool 124 shown in FIG. 28 into the first tool receiving aperture 96 and then rotating the tool 124. The activation of the enclosure unlocking mechanism 116 draws the enclosure locking hook 112 forwardly in a manner as is known in the art. The enclosure unlocking mechanism 116 could have any suitable construction.

As can be seen in FIG. 26, the locking portion 78 has an inwardly directed wall 118 that defines a second tool receiving aperture 120, and a resiliently deflectable wall 122 that is positioned adjacent to the second tool receiving aperture 120. The resiliently deflectable wall 122 faces towards the smart module attachment area 92 of the attachment portion 76, and can be deflected forwardly by inserting the tool 124 shown in FIG. 28 into the second tool receiving aperture 120 and then rotating the tool 124 so that an activation portion 126 of the tool 124 pushes against the resiliently deflectable wall 122.

Figure 11:
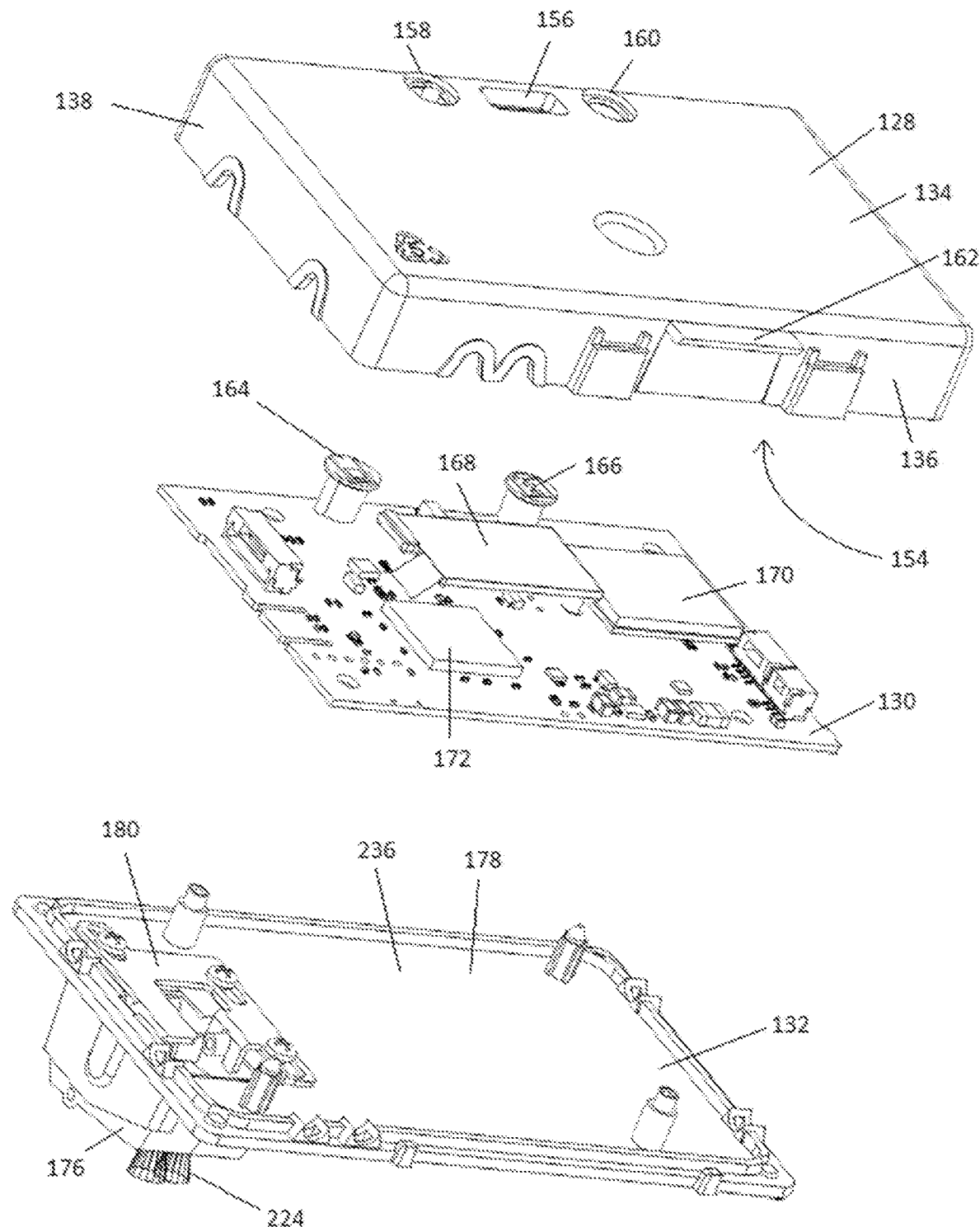
FIG. 11 is a partially exploded view of the smart module shown in FIG. 9.

As can be seen in FIG. 7, the smart module 18 attaches to the smart module attachment area 92 of the attachment portion 76 of the mounting and locking body 16. As shown in FIG. 11, the smart module 18 includes a smart module housing 128, a circuit board 130, and a cover assembly 132. The cover assembly 132 is also referred to herein as the sensor assembly 132.

Figure 10:
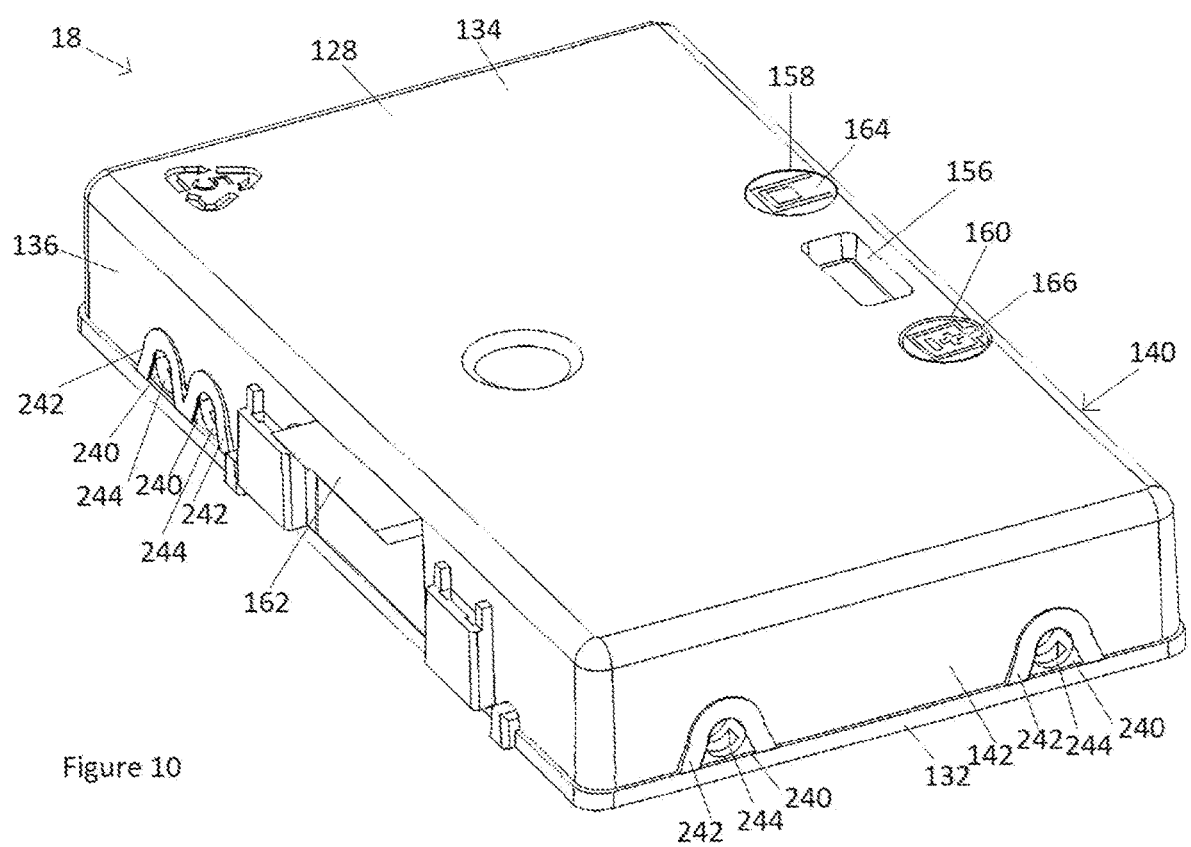
FIG. 10 is a perspective view of the smart module shown in FIG. 9, showing an upwardly facing side of the smart module.

The smart module housing 128 has a generally rectangular mounting wall 134 and four side walls 136, 138, 140, 142 that extend from the four sides of the mounting wall 134, so as to define a circuit board receiving internal cavity 154 therebetween. As can be seen in FIG. 10, the mounting wall 134 defines a generally rectangular hook receiving aperture 156 adjacent to the rear side wall 140. As shown in FIG. 11, the mounting wall 134 also defines two indicator apertures 158 and 160, which are positioned on either side of the hook receiving aperture 156. A forwardly extending projection 162 extends forwardly from the front side wall 136.

The circuit board 130, which can be seen in FIG. 11, carries various electronic components for giving the paper towel dispenser 10 smart functionality, including a first indicator light 164, a second indicator light 166, a wireless communication device 168, a processor 170, and a memory 172. The circuit board 130 could also carry any additional electronic components required to provide the desired smart functionality. When the smart module 18 is assembled, the circuit board 130 is positioned inside the internal cavity 154 of the smart module housing 128.

As can be seen in FIG. 10, the indicator lights 164 and 166 extend through the indicator apertures 158 and 160 in the smart module housing 128, so that the indicator lights 164 and 166 are visible from the outside of the smart module 18. When the smart module 18 is attached to the mounting and locking body 16, the indicator lights 164 and 166 are aligned with the indicator windows 88 and 90 in the plug member 86, so that the indicator lights 164 and 166 are visible from outside of the enclosure 12, as can be seen in FIG. 1.

The position of the wireless communication device 168 on the circuit board 130 is selected so that the wireless communication device 168 is adjacent to the plug member 86 when the smart module 18 is attached to the mounting and locking body 16. The wireless communication device 168 is configured to send and receive wireless signals through the communication opening 34 in the enclosure 12 and through the plug member 86. The wireless communication device 168 may be configured to send and/or receive any suitable type of wireless signal, including for example one or more of: radio signals, Wi-Fi™ signals, Bluetooth™ signals, and Near-Field Communication (NFC) signals.

Figure 9:
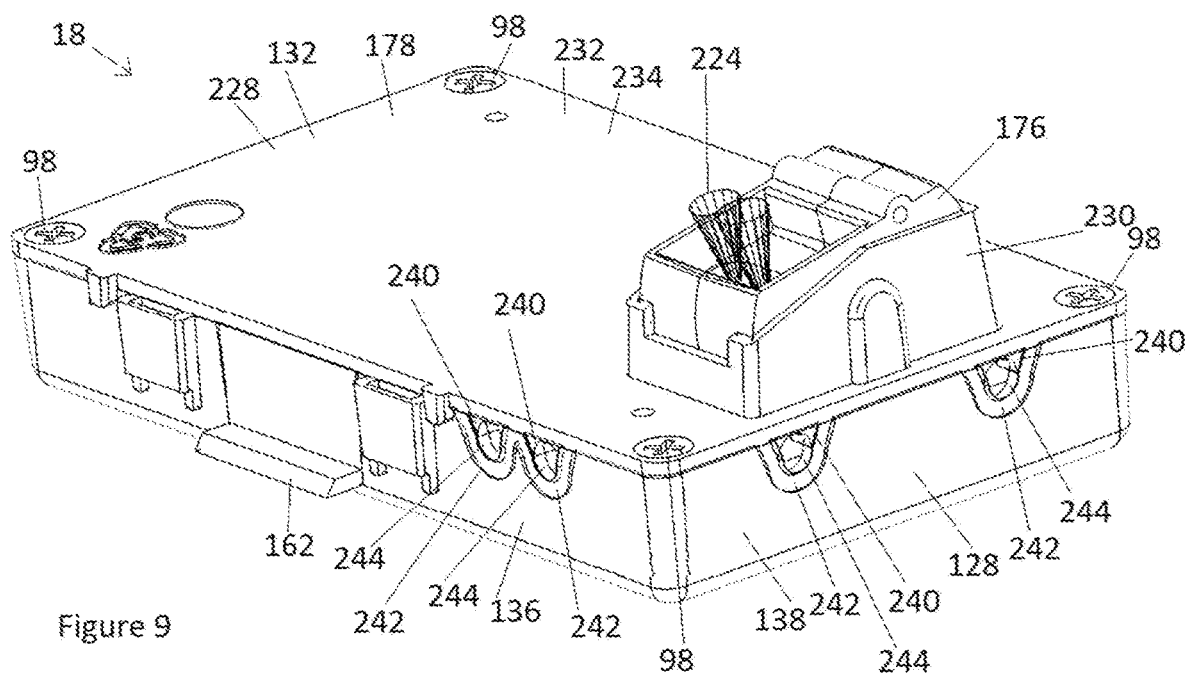
FIG. 9 is a perspective view of the smart module shown in FIG. 8, showing a downwardly facing side of the smart module.

As can be seen in FIG. 9, the cover assembly 132 is attached to the smart module housing 128 by four fasteners 98, so as to enclose the circuit board 130 within the internal cavity 154 of the smart module housing 128. The cover assembly 132 includes a sensor 174, a sensor housing 176, a mounting member 178, an adjustment member 180, and a locking mechanism 182.

Figure 16:
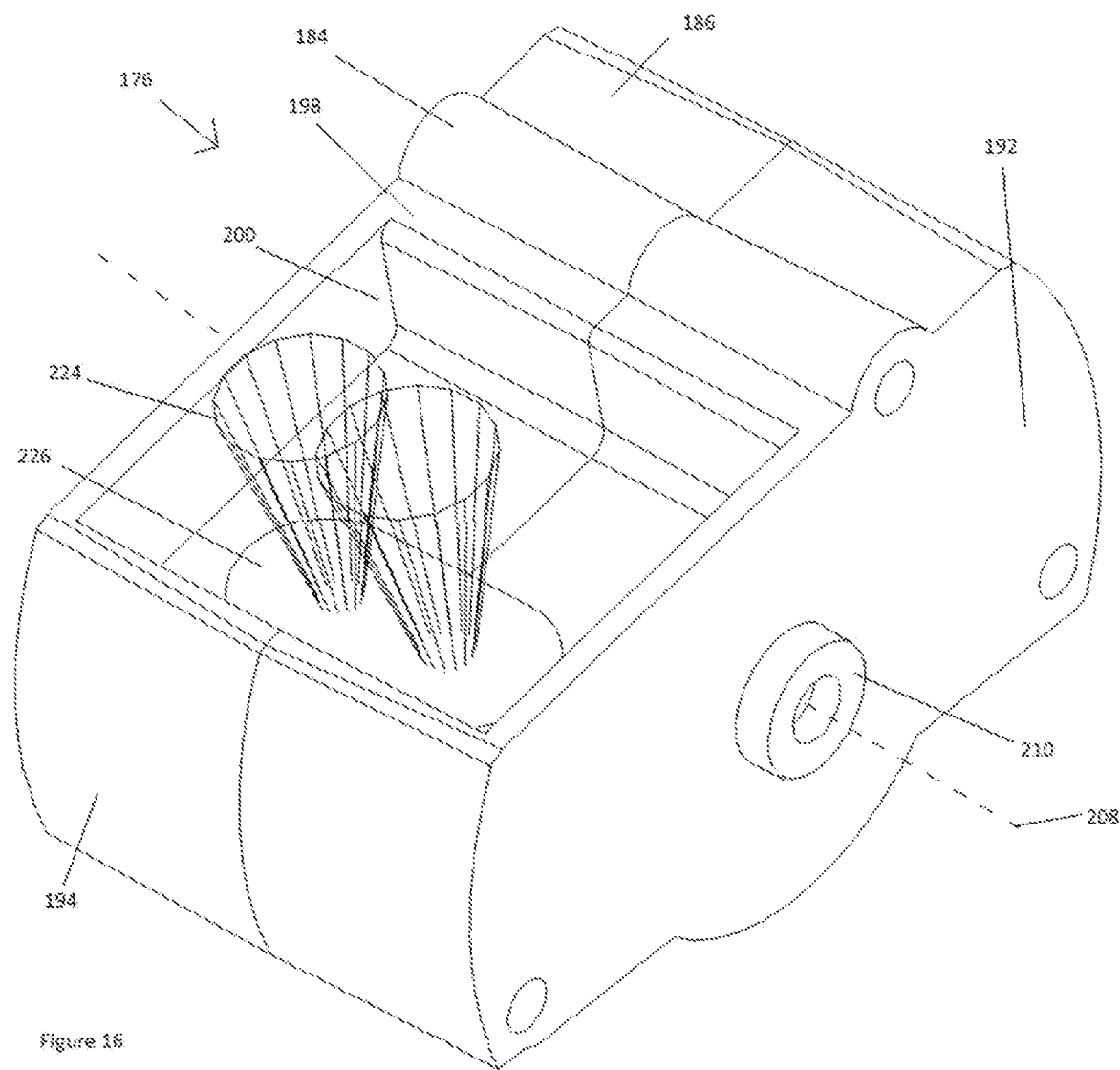
FIG. 16 is a perspective view of the sensor housing shown in FIG. 12, showing a sensor side of the sensor housing.
Figure 17:
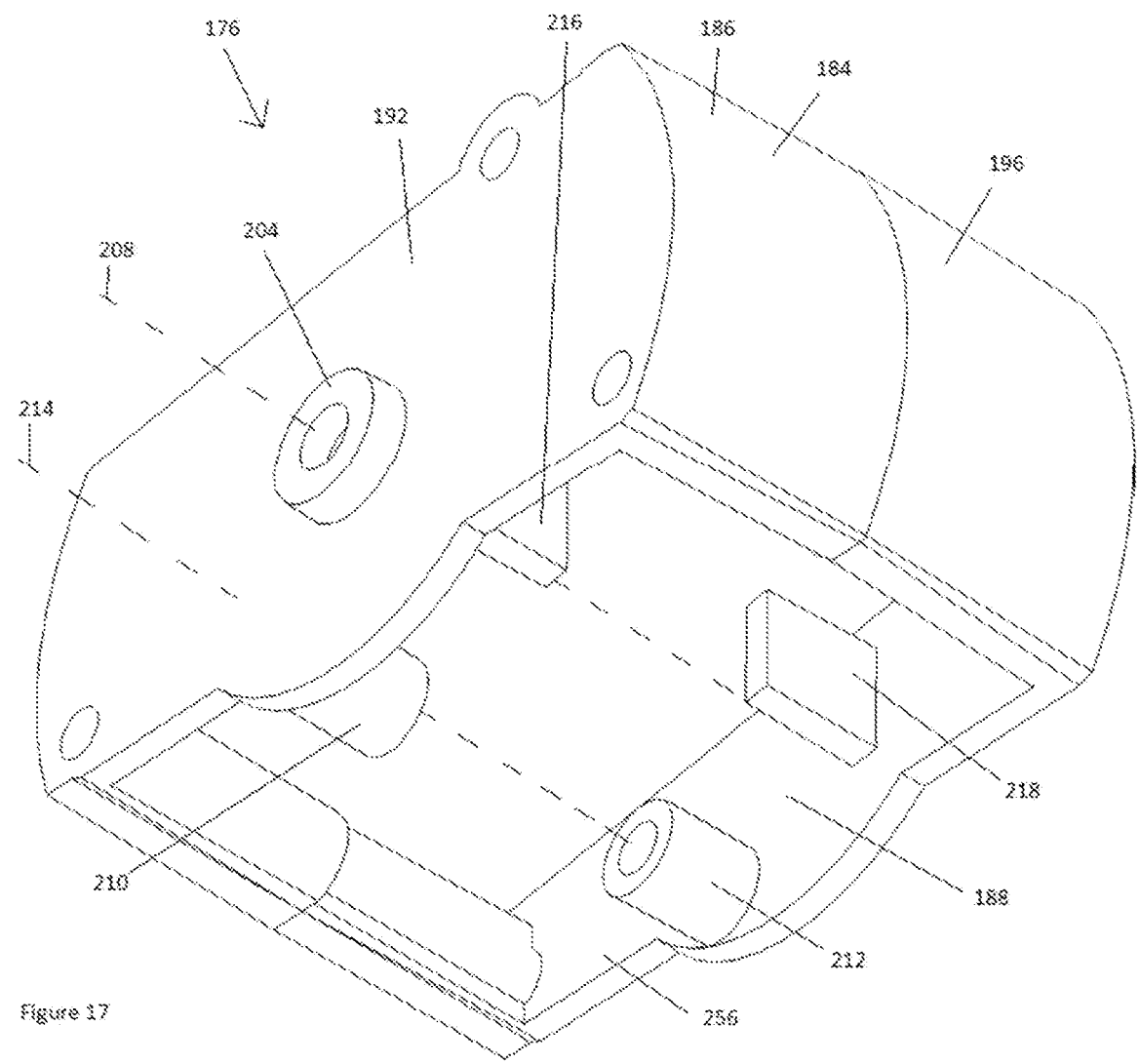
FIG. 17 is a perspective view of the sensor housing shown in FIG. 16, showing an attachment side of the sensor housing.
Figure 18:
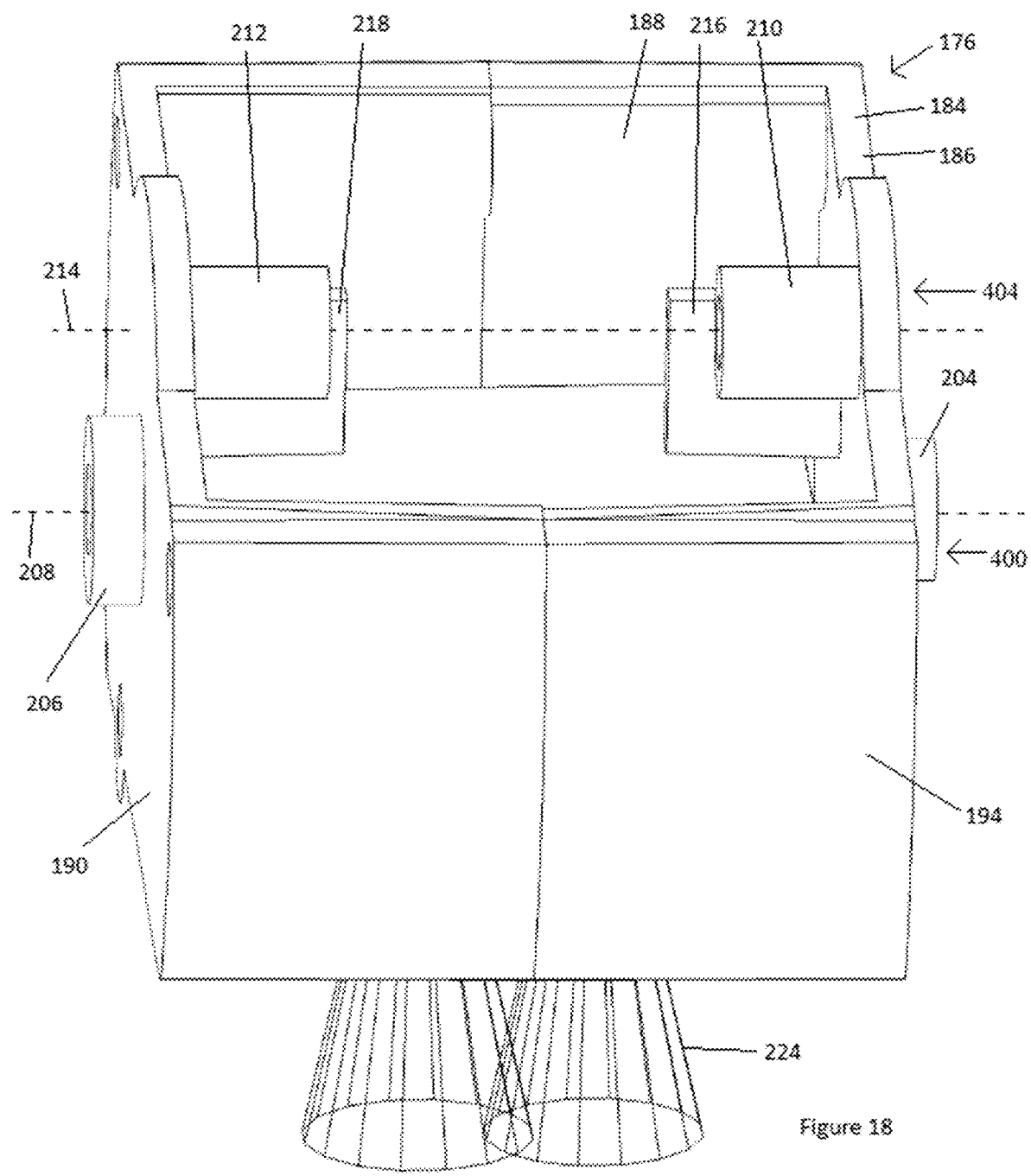
FIG. 18 is a perspective view of the sensor housing shown in FIG. 16, showing the attachment side of the sensor housing.
Figure 19:
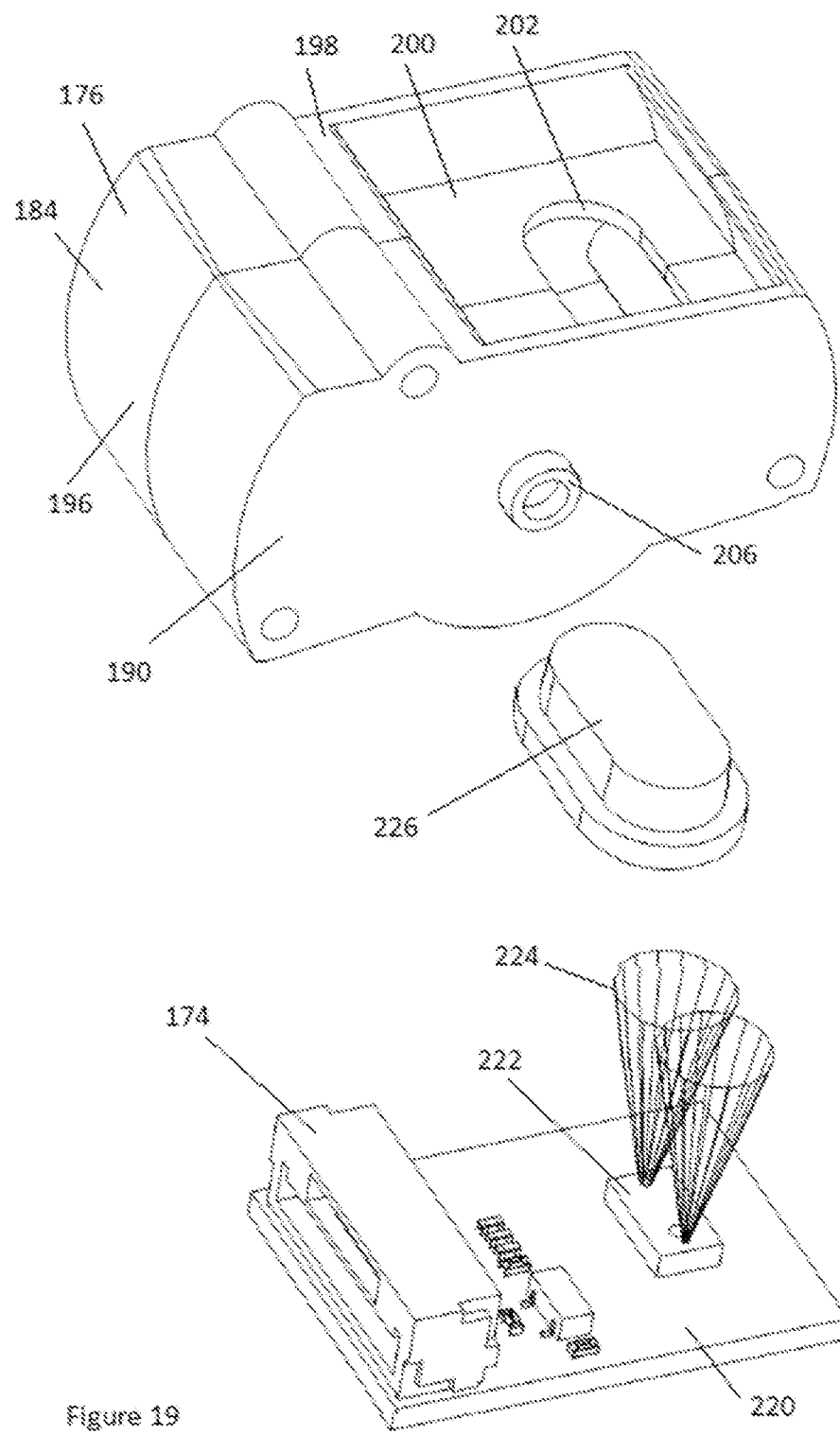
FIG. 19 is an exploded view of the sensor housing shown in FIG. 16.

The sensor housing 176 is shown in FIGS. 16 to 18 as having a sensor housing body 184 with an outer wall 186 that defines an internal chamber 188. The outer wall 186 has a left side portion 190, a right side portion 192, a front portion 194, a rear portion 196, and a lower portion 198. The left side portion 190 and the right side portion 192 are planar and parallel to each other. The front portion 194 and the rear portion 196 are rounded. As can be seen in FIG. 19, the lower portion 198 defines a downwardly open cavity 200 with a lens receiving aperture 202 that extends through to the internal chamber 188. As shown in FIG. 17, the internal chamber 188 has an open adjustment end 256 defined by the left side portion 190, the right side portion 192, the front portion 194, and the rear portion 196 of the outer wall 186.

As can be seen in FIGS. 16 to 18, a first mounting projection 204 extends outwardly from the right side portion 192 of the outer wall 186 and a second mounting projection 206 extends outwardly from the left side portion 190 of the outer wall 186. The first mounting projection 204 and the second mounting projection 206 both have a generally cylindrical shape, and extend along a pivot axis 208 that is perpendicular to the left side portion 190 and the right side portion 192 of the outer wall 186. Together, the first mounting projection 204 and the second mounting projection 206 form a first mounting element 400.

As can be seen in FIGS. 17 and 18, a first adjustment projection 210 extends inwardly from the right side portion 192 of the outer wall 186 into the internal chamber 188, and a second adjustment projection 212 extends inwardly from the left side portion 190 of the outer wall 186 into the internal chamber 188. The first adjustment projection 210 and the second adjustment projection 212 both have a generally cylindrical shape, and extend along a projection axis 214 that is perpendicular to the left side portion 190 and the right side portion 192 of the outer wall 186, and parallel to the pivot axis 208. Together, the first adjustment projection 210 and the second adjustment projection 212 form a first adjustment element 404.

As can also be seen in FIGS. 17 and 18, a first sensor holding arm 216 extends inwardly from the right side portion 192 of the outer wall 186 into the internal chamber 188, and a second sensor holding arm 218 extends inwardly from the left side portion 190 of the outer wall 186 into the internal chamber 188. The first sensor holding arm 216 and the second sensor holding arm 218 both have a generally rectangular shape, and are spaced from the lower portion 198 of the outer wall 186.

The sensor 174 is shown in FIG. 19. In the embodiment shown, the sensor 174 is a time-of-flight sensor 174. The time-of-flight sensor 174 has a sensor body 220 with an emitter and receiver portion 222. The emitter and receiver portion 222 is configured to emit electromagnetic radiation 224, depicted as two cones in FIG. 19, and detect when the electromagnetic radiation 224 is reflected back to the emitter and receiver portion 222 by an object. By measuring the amount of time that it takes for the electromagnetic radiation 224 to be reflected back to the emitter and receiver portion 222, the sensor 174 is able to determine the distance of the object from the sensor 174. As can be seen in FIG. 19, the sensor 174 also include a lens 226. The lens 226 is positioned over the emitter and receiver portion 222 and focuses the electromagnetic radiation 224 emitted and received by the emitter and receiver portion 222.

The sensor housing 176 is configured to carry the sensor 174 within the internal chamber 188. When the sensor 174 is received in the internal chamber 188, the lens 226 extends through the lens receiving aperture 202, so that the electromagnetic radiation 224 is emitted and received by the sensor 174 through the downwardly open cavity 200, as shown in FIG. 16. The sensor holding arms 216 and 218 help to hold the sensor 174 in place within the internal chamber 188.

Figure 20:
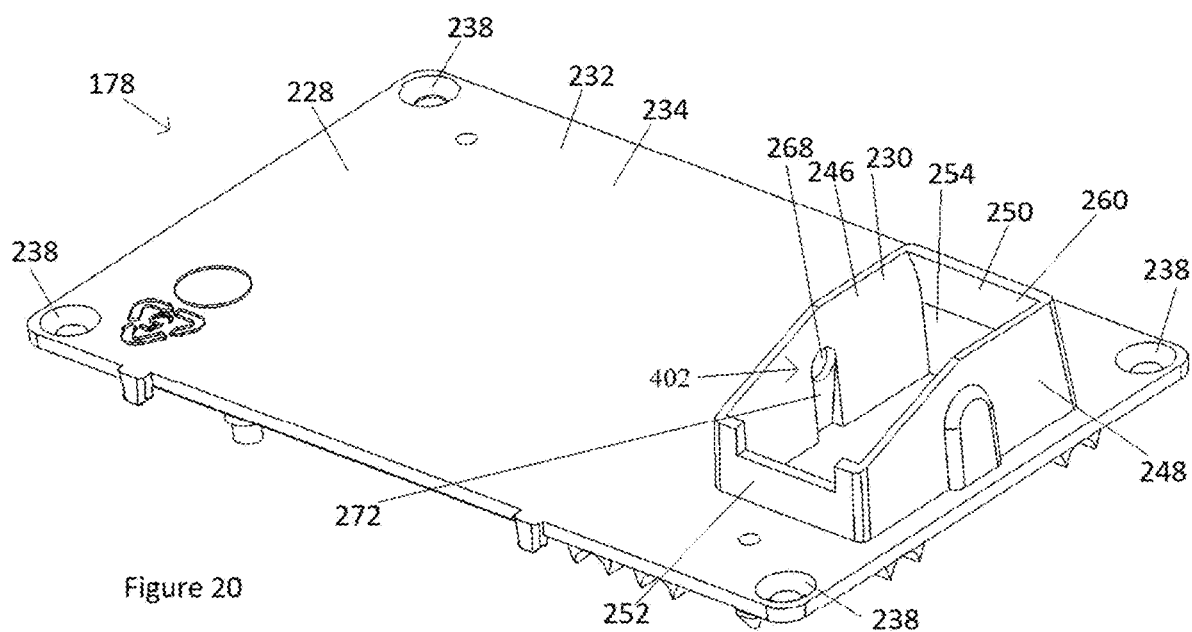
FIG. 20 is a perspective view of a mounting member of the sensor assembly shown in FIG. 12, showing a downwardly facing side of the mounting member.
Figure 21:
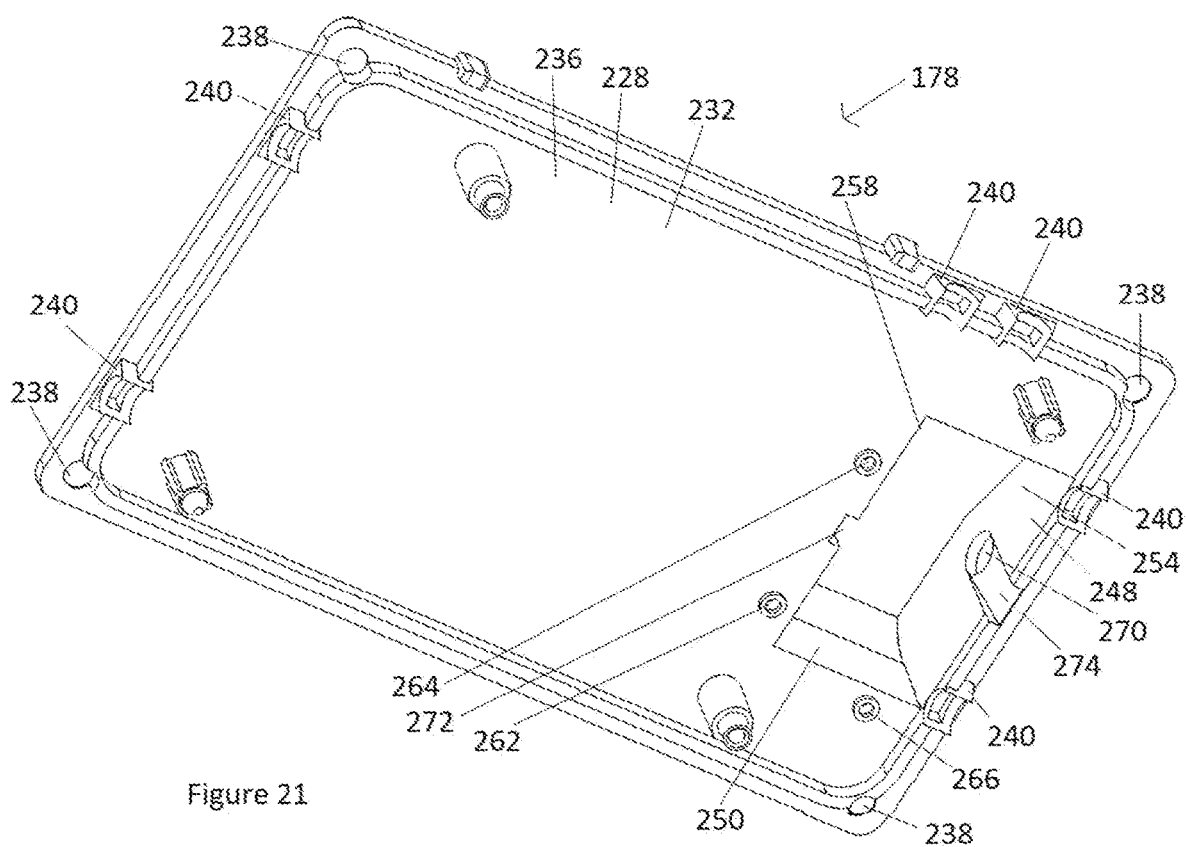
FIG. 21 is a perspective view of the mounting member shown in FIG. 20, showing an upwardly facing side of the mounting member.

The mounting member 178 is shown in FIGS. 20 and 21 as having a lid portion 228 and a sensor receiving portion 230. The lid portion 228 has a generally rectangular lid forming body 232 with a planar outer surface 234 and a planar inner surface 236. The lid forming body 232 has a cover attachment opening 238 positioned at each of its four corners. As can be seen in FIG. 21, the lid forming body 232 also has six arch shaped extensions 240 that are arranged about the perimeter of the lid forming body 232. As can be seen in FIG. 9, the lid forming body 232 attaches to the smart module housing 128 to enclose the circuit board 130 within the internal cavity 154 of the smart module housing 128. The lid forming body 232 is fastened to the smart module housing 128 by fasteners 98 that extend through the cover attachment opening 238 into the side walls 136, 138, 140, 142 of the smart module housing 128. As can be seen in FIG. 9, when the lid forming body 232 is attached to the smart module housing 128, the arch shaped extensions 240 align with corresponding archways 242 in the smart module housing 128 to form wire receiving channels 244. The wire receiving channels 244 provide passageways for wires to extend into the internal cavity 154 of the smart module housing 128, for example to provide electricity to the electronic components carried by the circuit board 130.

As can be seen in FIG. 20, the sensor receiving portion 230 of the mounting member 178 extends from the outer surface 234 of the lid forming body 232. The sensor receiving portion 230 has a first side wall 246, a second side wall 248, a back wall 250, and a front wall 252, which together define an internal cavity 254. The internal cavity 254 has an open attachment end 258 that is adjacent to the lid forming body 232 and an open extension end 260 that is spaced from the lid forming body 232. As can be seen in FIG. 21, the lid forming body 232 has three threaded holes 262, 264, 266 that are positioned about the perimeter of the open attachment end 258 of the sensor receiving portion 230.

As shown in FIGS. 20 and 21, the first side wall 246 has an inwardly open first mounting cavity 268 and the second side wall 248 has an inwardly open second mounting cavity 270. The first mounting cavity 268 and the second mounting cavity 270 both have a generally circular shape, and are positioned facing towards each other. The first side wall 246 also defines a first channel 272 that extends from the open attachment end 258 to the first mounting cavity 268, and the second side wall 248 defines a second channel 274 that extends from the open attachment end 258 to the second mounting cavity 270. Together, the first mounting cavity 268 and the second mounting cavity 270 form a second mounting element 402.

The sensor housing 176 is received by the sensor receiving portion 230 of the mounting member 178, as can be seen in FIG. 9. When the sensor housing 176 is received by the sensor receiving portion 230, the sensor housing 176 is positioned in the internal cavity 254 of the sensor receiving portion 230, with the left side portion 190 of the sensor housing 176 positioned adjacent to the first side wall 246 of the sensor receiving portion 230; the right side portion 192 of the sensor housing 176 positioned adjacent to the second side wall 248 of the sensor receiving portion 230; the front portion 194 of the sensor housing 176 positioned adjacent to the front wall 252 of the sensor receiving portion 230; and the rear portion 196 of the sensor housing 176 positioned adjacent to the back wall 250 of the sensor receiving portion 230. The first mounting projection 204 is pivotally received by the first mounting cavity 268 and the second mounting projection 206 is pivotally received by the second mounting cavity 270, so as to permit the sensor housing 176 to pivot about the pivot axis 208 relative to the sensor receiving portion 230 between the first angular position shown in FIGS. 12 and 14 and the second angular position shown in FIGS. 13 and 15.

The first channel 272 and the second channel 274 provide passageways for the first mounting projection 204 and the second mounting projection 206 to be inserted from the open attachment end 258 of the sensor receiving portion 230 into the first mounting cavity 268 and the second mounting cavity 270, respectively, during assembly of the cover assembly 132. Optionally, the first mounting projection 204 has a different size than the second mounting projection 206, with the sizes of the first channel 272 and the first mounting cavity 268 being selected to receive the first mounting projection 204 and the sizes of the second channel 274 and the second mounting cavity 270 being selected to receive the second mounting projection 206. This preferably helps to ensure that the sensor housing 176 is inserted into the sensor receiving portion 230 in the correct orientation during assembly of the cover assembly 132.

Figure 22:
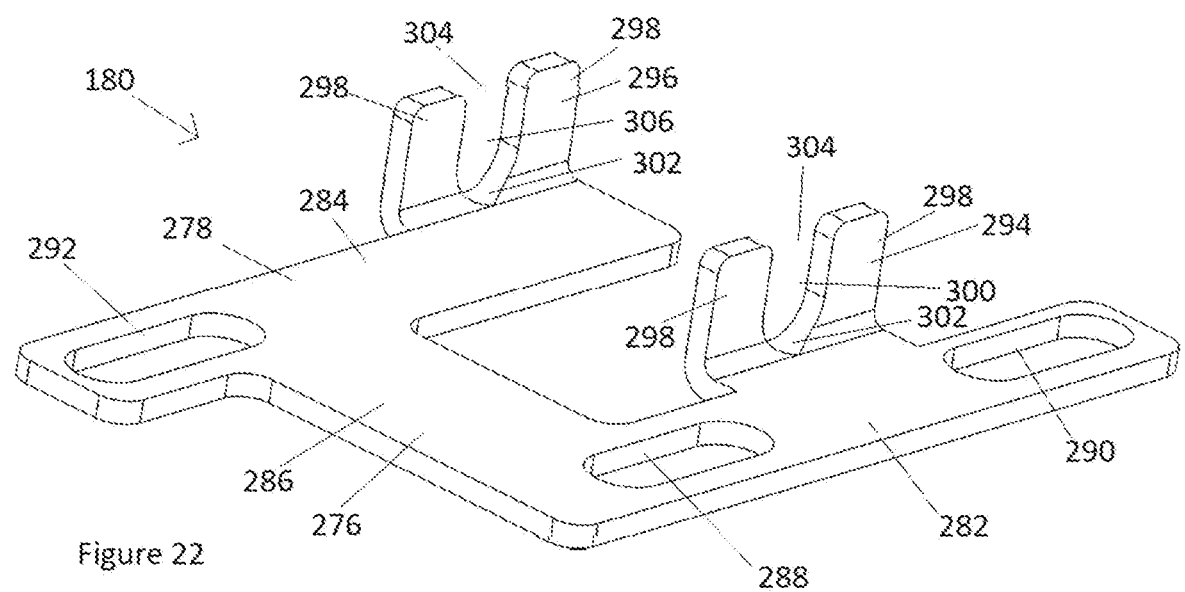
FIG. 22 is a perspective view of an adjustment member of the sensor assembly shown in FIG. 12, showing a downwardly facing side of the adjustment member.
Figure 23:
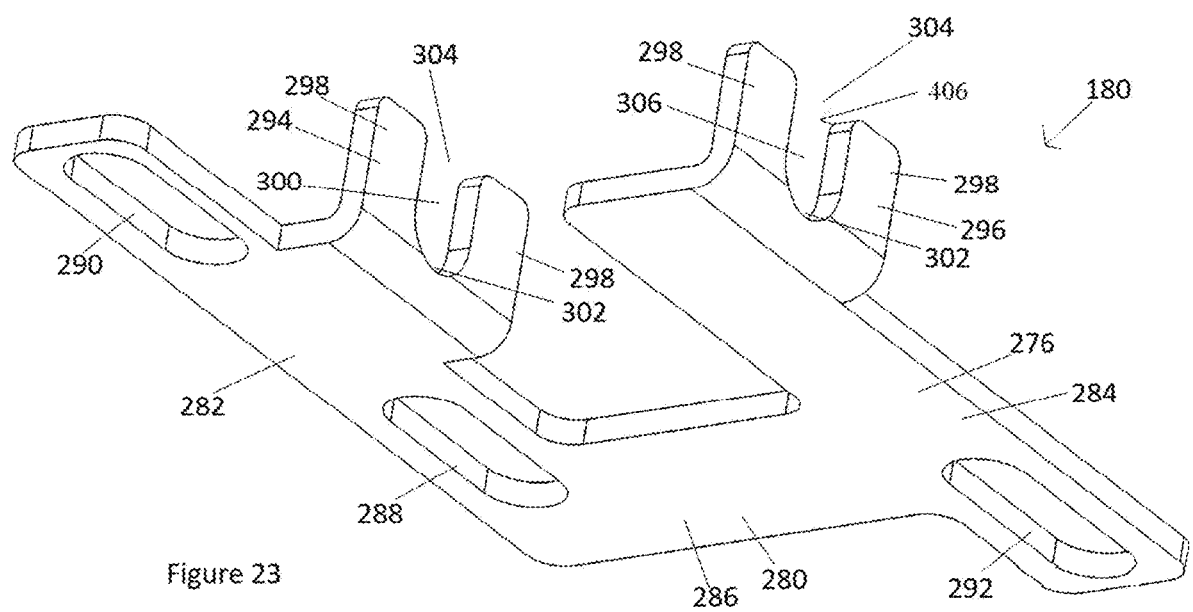
FIG. 23 is a perspective view of the adjustment member shown in FIG. 22, showing an upwardly facing side of the adjustment member.

The adjustment member 180 is shown in FIGS. 22 and 23. The adjustment member 180 has a planar adjustment body 276 with a mounting member engagement surface 278 and a fastener engagement surface 280. The adjustment body 276 has a first arm portion 282, a second arm portion 284, and a connecting portion 286 that connects the first arm portion 282 to the second arm portion 284. As can be seen in FIG. 23, the first arm portion 282, the second arm portion 284, and the connecting portion 286 together form a shape similar to the number four. The first arm portion 282 defines a first fastener slot 288 and a second fastener slot 290, and the second arm portion 284 defines a third fastener slot 292.

A first adjustment slot defining body 294 extends perpendicularly from the first arm portion 282, and a second adjustment slot defining body 296 extends perpendicularly from the second arm portion 284. The first adjustment slot defining body 294 has two fingers 298 that define a first adjustment slot 300 therebetween. The first adjustment slot 300 has a closed end 302 proximate to the first arm portion 282 and an open end 304 spaced from the first arm portion 282. The second adjustment slot defining body 296 also has two fingers 298 that define a second adjustment slot 306 therebetween. The second adjustment slot 306 also has a closed end 302 proximate to the second arm portion 284 and an open end 304 spaced from the second arm portion 284. Together, the first adjustment slot 300 and the second adjustment slot 306 form a second adjustment element 406.

Figure 12:
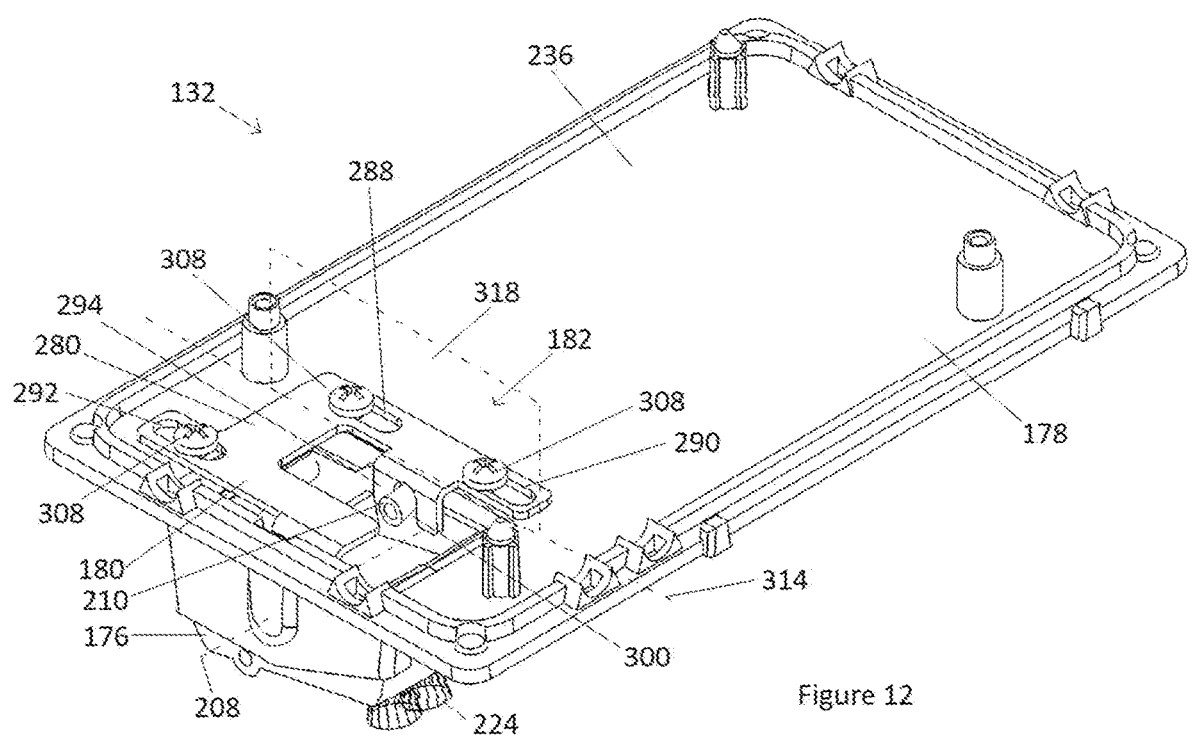
FIG. 12 is a perspective view of a sensor assembly of the smart module shown in FIG. 9, showing an upwardly facing side of the sensor assembly, and showing a sensor housing of the sensor assembly positioned at a first angular position.
Figure 13:
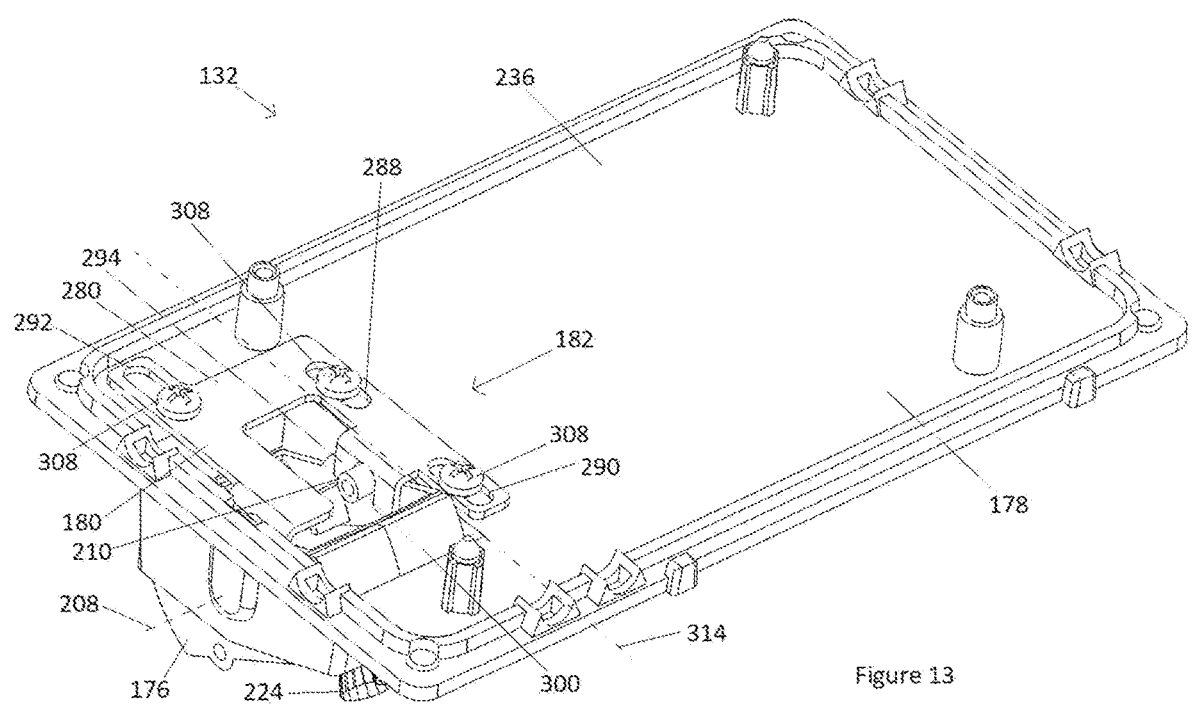
FIG. 13 is a perspective view of the sensor assembly shown in FIG. 12, showing the upwardly facing side of the sensor assembly, and showing the sensor housing positioned at a second angular position.

As can be seen in FIGS. 12 and 13, when the cover assembly 132 is assembled, the adjustment member 180 is positioned adjacent to the mounting member 178, with the mounting member engagement surface 278 of the adjustment member 180 positioned against and in opposition to the inner surface 236 of the lid forming body 232, and with the first adjustment slot defining body 294 and the second adjustment slot defining body 296 extending into the open adjustment end 256 of the sensor housing 176. The first adjustment projection 210 of the sensor housing 176 extends through the first adjustment slot 300 of the adjustment member 180. Although not visible in FIGS. 12 and 13, the second adjustment projection 212 likewise extends through the second adjustment slot 306.

Figure 24:
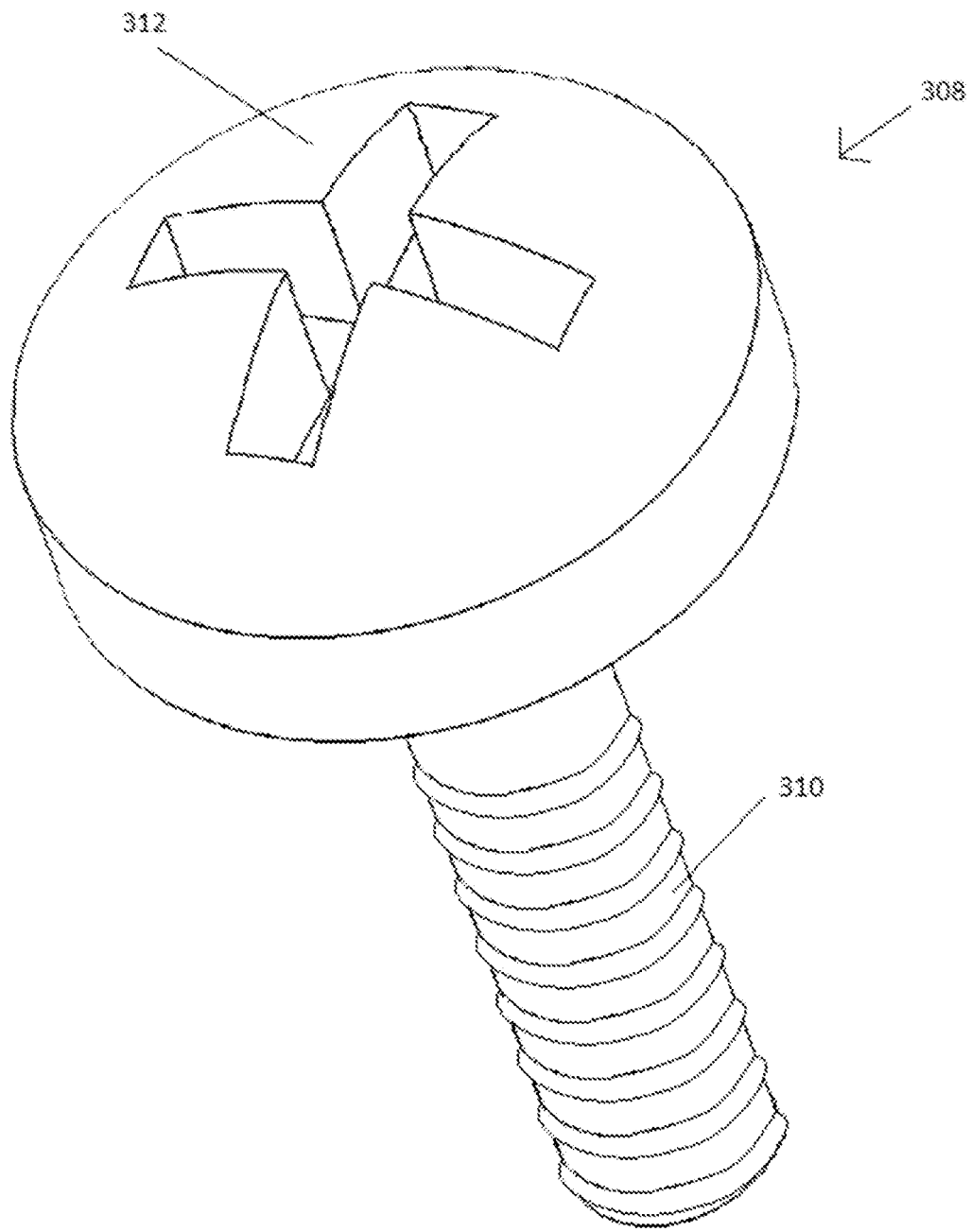
FIG. 24 is a perspective view of a fastener of the sensor assembly shown in FIG. 12.

The locking mechanism 182 comprises three threaded locking fasteners 308. One locking fastener 308 extends through the first fastener slot 288 in the adjustment member 180 into the first threaded hole 262 in the mounting member 178, one locking fastener 308 extends through the second fastener slot 290 in the adjustment member 180 into the second threaded hole 264 in the mounting member 178, and one locking fastener 308 extends through the third fastener slot 292 in the adjustment member 180 into the third threaded hole 266 in the mounting member 178. As can be seen in FIG. 24, each locking fastener 308 has a threaded shaft 310 that extends through the respective fastener slot 288, 290, 292 in the adjustment member 180 and engages with the respective threaded hole 262, 264, 266 in the mounting member 178, and a tool receiving head 312 that engages with the fastener engagement surface 280 of the adjustment member 180.

The locking mechanism 182 can be toggled between locked and unlocked states by tightening or loosening the locking fasteners 308. When the locking fasteners 308 are loosened so as to place the locking mechanism 182 in the unlocked state, the adjustment member 180 is slideable along an adjustment axis 314 relative to the mounting member 178 between the first location shown in FIG. 12 and the second location shown in FIG. 13. The adjustment axis 314 is parallel to the longitudinal dimension of the fastener slots 288, 290, 292, and lies within an adjustment plane 318 that is perpendicular to the pivot axis 208. The extended longitudinal dimension of the fastener slots 288, 290, 292 allows the adjustment member 180 to slide between the first location and the second location while the locking fasteners 308 remain stationary relative to the mounting member 178.

Figure 14:
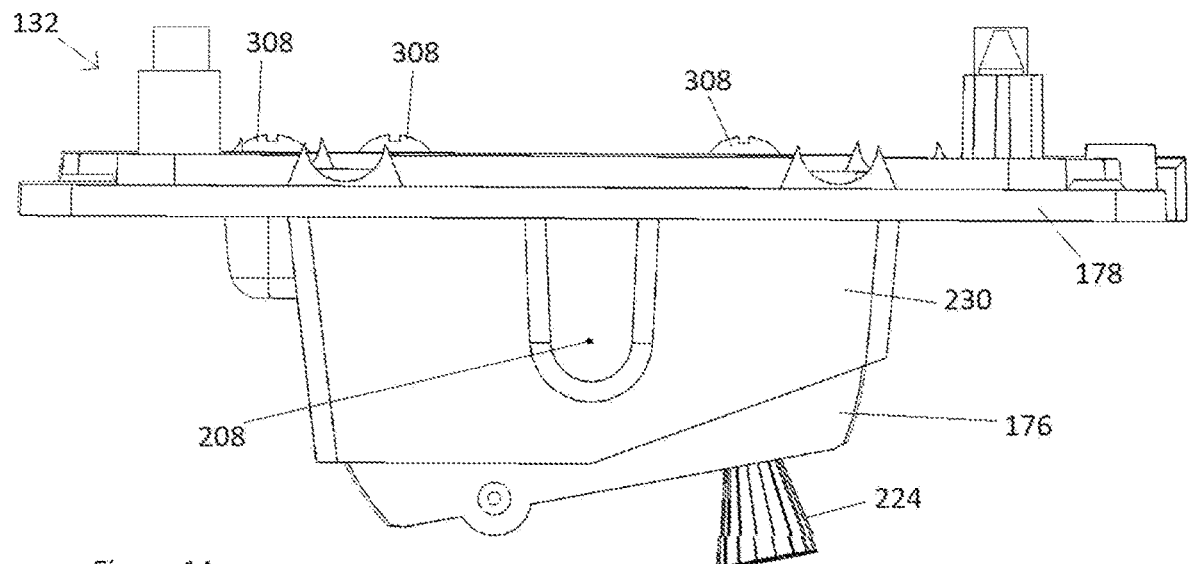
FIG. 14 is a side view of the sensor assembly shown in FIG. 12, with the sensor housing at the first angular position.
Figure 15:
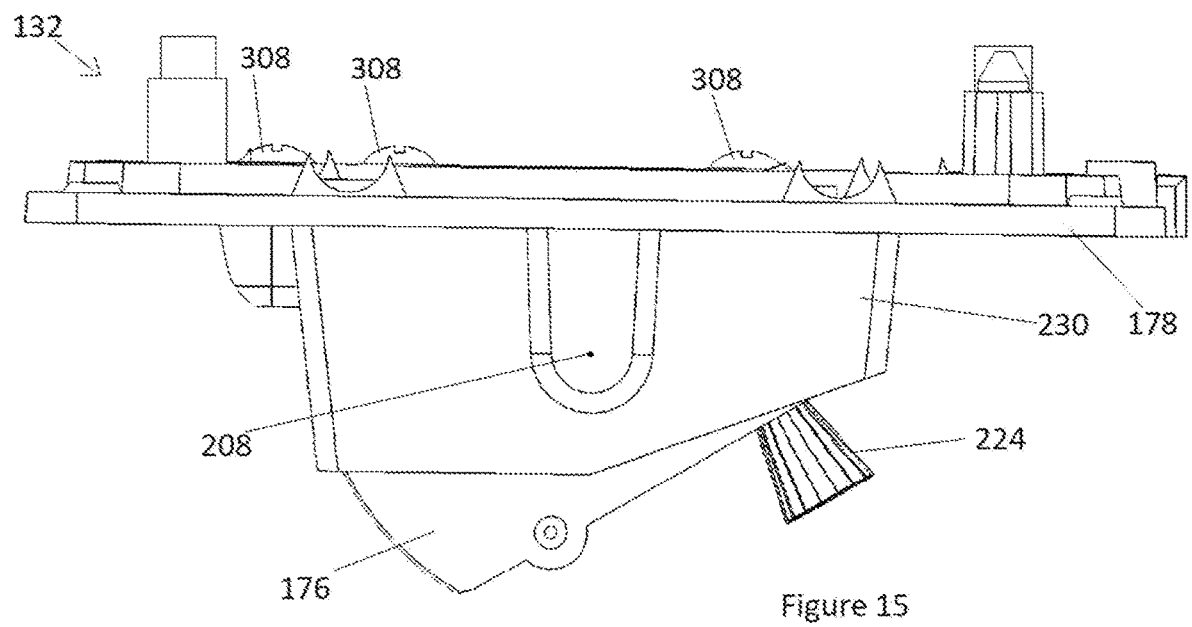
FIG. 15 is a side view of the sensor assembly shown in FIG. 12, with the sensor housing at the second angular position.

When the adjustment member 180 is at the first location as shown in FIG. 12, the engagement of the first adjustment slot 300 and the second adjustment slot 306 with the first adjustment projection 210 and the second adjustment projection 212, respectively, place the sensor housing 176 at the first angular position as shown in FIGS. 12 and 14. When the adjustment member 180 slides from the first location shown in FIG. 12 to the second location shown in FIG. 13, the engagement of the first adjustment slot 300 and the second adjustment slot 306 with the first adjustment projection 210 and the second adjustment projection 212, respectively, causes the sensor housing 176 to pivot about the pivot axis 208 from the first angular position shown in FIGS. 12 and 14 to the second angular position shown in FIGS. 13 and 15. The first adjustment slot 300 and the second adjustment slot 306 each have an extended longitudinal dimension, which allows the first adjustment projection 210 and the second adjustment projection 212 to move towards and away from the closed ends 302 of the slots 300, 306 as the sensor housing 176 pivots about the pivot axis 208.

Each location of the adjustment member 180 along the adjustment axis 314 places the sensor housing 176 at a different angular position relative to the mounting member 178, such that the angular position of the sensor housing 176 can be selected by adjusting the location of the adjustment member 180 along the adjustment axis 314. When the sensor housing 176 is at a desired angular position, the sensor housing 176 can be locked at that angular position by tightening the locking fasteners 308 so as to place the locking mechanism 182 in the locked state. When in the locked state, the heads 312 of the locking fasteners 308 exert a locking force against the fastener engagement surface 280 of the adjustment member 180, which forces the mounting member engagement surface 278 into a locked engagement with the inner surface 236 of the lid portion 228 of the mounting member 178. When the mounting member engagement surface 278 is in locked engagement with the inner surface 236 of the lid portion 228 of the mounting member 178, the adjustment member 180 is prevented from sliding along the adjustment axis 314 relative to the mounting member 178, and the engagement of the adjustment slots 300, 306 with the adjustment projections 210, 212 prevents the sensor housing 176 from pivoting away from the selected angular position.

A preferred manner of operating the paper towel dispenser 10 will now be described with reference to FIGS. 1 to 29. The paper towel dispenser 10 can be placed at a location where a supply of paper towels 66 is desired, such as for example mounted to a wall adjacent to a sink in a washroom. As shown in FIG. 4, the roll holding mechanism 70 carries a roll of the paper towel 66 in a product storage space 320 within the inner chamber 68 of the enclosure 12. The roll of paper towel 66 feeds into the dispensing mechanism 72 in a manner as is known in the art, such that portions of the paper towel 66 are dispensed through the bottom opening 64 of the enclosure 12 upon activation of the dispensing mechanism 72.

As paper towel 66 is dispensed from the dispenser 10, the size of the roll of paper towel 66 decreases, as can be seen by comparing FIGS. 4 and 5. FIG. 4 shows a full roll of paper towel 66, and FIG. 5 shows the much smaller roll of paper towel 66 after most of the paper towel 66 has been dispensed.

As can be seen in FIGS. 4 and 5, when the smart module 18 is mounted to the mounting and locking body 16, the electromagnetic radiation 224 emitted by the sensor 174 is directed towards the product storage space 320. When there is a full roll of paper towel 66 in the dispenser 10, as shown in FIG. 4, the electromagnetic radiation 224 travels only a short distance before being reflected back to the sensor 174 from the roll of paper towel 66. When the roll of paper towel 66 is depleted as shown in FIG. 5, the electromagnetic radiation 224 must travel a further distance to reach the roll of paper towel 66. The length of time that it takes for the electromagnetic radiation 224 to be reflected back to the sensor 174 thus provides an indication of the amount of paper towel 66 remaining in the dispenser 10.

The processor 170 is preferably configured to determine the amount of paper towel 66 remaining in the dispenser 10 based on data received from the time of flight sensor 174, and to communicate information about the amount of paper towel 66 remaining in the dispenser 10. For example, the processor 170 is optionally configured to light up the first indicator light 164 when the amount of paper towel 66 remaining in the dispenser 10 falls below a preselected threshold. As can be seen in FIG. 1, the first indicator light 164 is visible from outside of the paper towel dispenser 10 through the first indicator window 88 in the plug member 86. This preferably allows service personnel to easily determine whether the dispenser 10 needs to be refilled with paper towel 66, without for example having to open up the dispenser 10 as shown in FIG. 2.

The processor 170 is optionally configured to control the first indicator light 164 to provide additional information about the quantity of paper towel 66 remaining in the dispenser 10. The processor 170 may, for example, light up the first indicator light 164 in a first color, such as green, when the amount of paper towel 66 is greater than a preselected threshold; in a second color, such as red, when the amount of paper towel 66 is below the preselected threshold; and to flash on and off when there is no paper towel 66 remaining in the dispenser 10.

The processor 170 is also preferably configured to store in the memory 172 information about the amount of paper towel 66 in the dispenser 10 over time, and to communicate this information wirelessly via the wireless communication device 168. For example, the wireless communication device 168 may be configured to transmit the information stored in the memory 172 to a smart phone or other similar wireless device via Near-Field Communication when the smart phone or other device is placed on top of the plug member 86. The information can then be used to track usage of the paper towel dispenser 10 over time. This information may be useful for a variety of different purposes, such as predicting when the dispenser 10 will need to be refilled and/or automatically ordering more paper towel 66 when needed. The wireless communication device 168 is also preferably able to receive wireless signals, such as from a smart phone, to for example receive updated firmware or configure the settings for the indicator lights 164, 166.

Optionally, the paper towel dispenser 10 may be distributed without the smart module 18. When the smart module 18 is not included, the paper towel dispenser 10 remains functional for dispensing paper towel 66, but does not have the smart functionality provided by the smart module 18. Preferably, the paper towel dispenser 10 is distributed with the mounting and locking body 16, even when the smart module 18 is not included.

With the mounting and locking body 16 pre-installed in the dispenser 10, the dispenser 10 is preferably able to be easily retrofitted to provide smart functionality by attaching the smart module 18 to the mounting and locking body 16. The owner of the paper towel dispenser 10 may, for example, use the paper towel dispenser 10 for a number of months or years before deciding to upgrade the dispenser 10 to provide smart functionality. The owner could then order the smart module 18 from the manufacturer. The manufacturer could then assemble the smart module 18, including placing all of the desired electronic components on the circuit board 130 and adjusting the angular position of the sensor housing 176 so that the sensor 174 will face towards the product storage space 320 at the correct angle when the smart module 18 is installed in the dispenser 10. The sensor housing 176 could then be locked at the selected angular position using the locking mechanism 182. Once the smart module 18 is fully assembled, with the sensor housing 176 locked at the correct angular position, the smart module 18 could then be shipped to the owner of the dispenser 10 for installation in the dispenser 10.

Figure 29:
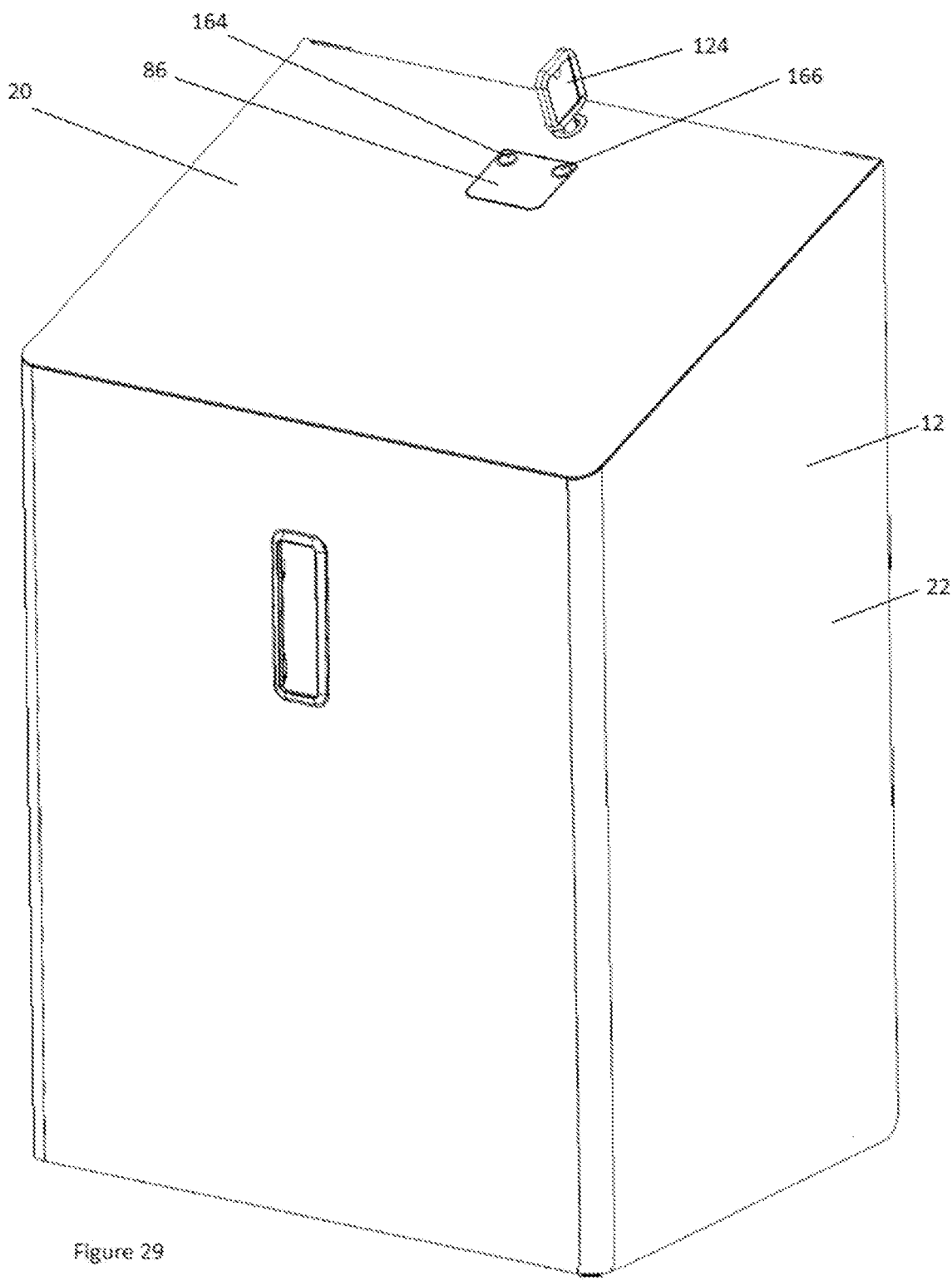
FIG. 29 is a perspective view of the paper towel dispenser shown in FIG. 1, showing the unlocking tool of FIG. 28 inserted into a tool receiving opening of the paper towel dispenser.

To install the smart module 18 in the dispenser 10, the enclosure 12 is first opened from the closed state shown in FIG. 1 to the open state shown in FIG. 2. When in the closed state, the enclosure locking hook 112 of the mounting and locking body 16 extends through and engages with the lock opening 58 in the back panel 26 of the enclosure 12, so as to hold the top panel 20 and the front and side panel 22 in the upright and closed position shown in FIG. 1. To move the enclosure 12 to the open state, the tool 124 is inserted into the first tool receiving aperture 96, as shown in FIG. 29, and then rotated to activate the enclosure unlocking mechanism 116. This draws the enclosure locking hook 112 inwardly, allowing the enclosure locking hook 112 to be removed from the lock opening 58 and allowing the top panel 20 and the front and side panel 22 to be pivoted downwardly to the open state shown in FIG. 2.

Once the enclosure 12 is in the open state, the mounting and locking body 16 is accessible for mounting the smart module 18. To mount the smart module 18 to the mounting and locking body 16, the forwardly extending projection 162 is inserted into the projection receiving opening 102, and the mounting wall 134 of the smart module housing 128 is pivoted towards and into engagement with the smart module attachment side 84 of the attachment portion 76 of the mounting and locking body 16. As the mounting wall 134 moves towards the attachment portion 76, the hook member 104 extends into and engages with the hook receiving aperture 156. The catch surfaces 110 on the catch arms 106 of the mounting and locking body 16 also engage with catching surfaces 322 on the smart module housing 128, which can be seen in FIG. 8. The engagement of the forwardly extending projection 162 with the projection receiving opening 102; the engagement of the hook member 104 with the hook receiving aperture 156; and the engagement of the catch surfaces 110 with the catching surfaces 322 holds the smart module 18 mounted in place on the mounting and locking body 16.

Once the smart module 18 is mounted in place, any wires extending through the wire receiving channels 244 can be connected, for example to a power source. The enclosure 12 can then be moved back to the closed state as shown in FIG. 1, with the enclosure locking hook 112 engaging with the lock opening 58 to hold the enclosure 12 at the closed state. The smart module 18 is then ready to use, with the sensor housing 176 already at the correct angular position for detecting the amount of paper towel 66 remaining in the dispenser 10.

Advantageously, the cover assembly 132 of the smart module 18 allows the angular position of the sensor 174 to be selected and locked in place by the manufacturer before the smart module 18 is shipped to the owner of the paper towel dispenser 10, for example using an automated process or a pre-determined setting jig. This allows the sensor 174 to be locked at the precise angular position that is best suited for detecting the quantity of paper towel 66 remaining in the paper towel dispenser 10. Setting the angular position of the sensor 174 in advance also preferably makes it easier for the owner to install the smart module 18 in the dispenser 10, without for example requiring a skilled technician to adjust the angular position of the sensor 174 when the smart module 18 is installed. The configuration of the smart module 18, with for example the adjustment member 180 and the locking mechanism 182 being hidden inside the assembled smart module 18, also preferably helps to avoid the angular position of the sensor 174 being inadvertently modified during the installation process.

The smart module 18 can also be removed from the mounting and locking body 16, for example if the smart module 18 needs to be serviced or replaced. Advantageously, the same tool 124 used to open the enclosure 12 can also be used to remove the smart module 18. To remove the smart module 18, the tool 124 is inserted into the second tool receiving aperture 120, and then rotated so that the resiliently deflectable wall 122 is deflected outwardly into engagement with the smart module 18. This exerts a force on the smart module 18 that pushes the smart module 18 away from the locking portion 78 of the mounting and locking body 16 and towards the projection receiving opening 102, which causes the hook member 104 to disengage from the hook receiving aperture 156, and the catch surfaces 110 to disengage from the catching surfaces 322. The smart module 18 is then able to be pivoted away from the locking portion 78 of the mounting and locking body 16 and the forwardly extending projection 162 can then be withdrawn from the projection receiving opening 102, to thereby remove the smart module 18 from the mounting and locking body 16.

Preferably, the paper towel dispenser 10 and the smart module 18 are part of a system for providing smart functionality to a variety of different apparatuses. For example, the system could include a line of different products, including the paper towel dispenser 10 shown in FIGS. 1 to 29, as well as toilet paper dispensers, waste bins, and/or hand cleaning fluid dispensers. Preferably, each of the smart modules 18 has an identical smart module housing 128, and each of the apparatuses has a mounting and locking body 16 that is capable of mounting the smart module housing 128 of any one of the smart modules 18. This preferably allows the same design of the mounting and locking body 16 and the same design of the smart module housing 128 to be used for providing smart functionality to a variety of different products, thereby preferably simplifying manufacturing.

Preferably, at least a subset of the smart modules 18 in the system have a cover assembly 132 that is identical to the cover assembly 132 shown in FIGS. 1 to 29. Advantageously, because the cover assembly 132 allows the angular position of the sensor 174 to be adjusted, the same cover assembly 132 design can be used for providing smart functionality to a variety of different apparatuses, including apparatuses in which the relative position of the mounting and locking body 16 and the product storage space 320 differ from the relative position shown in FIGS. 4 and 5. Preferably, for each smart module 18 distributed, the manufacturer adjusts and locks the sensor 174 at the appropriate angular position for the particular apparatus in which the smart module 18 will be installed.

Figure 30:
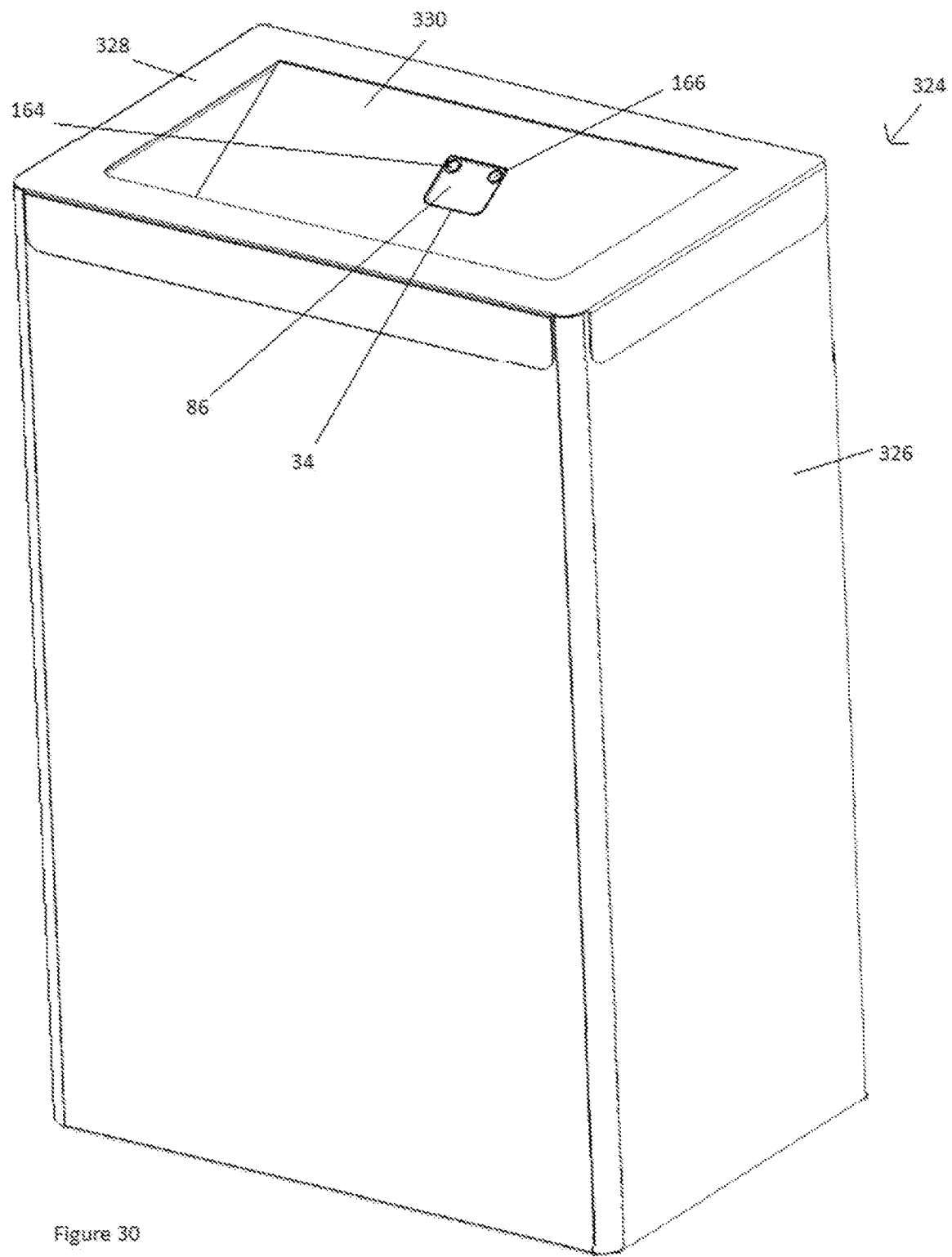
FIG. 30 is a perspective view of a waste bin in accordance with a second embodiment of the present invention.
Figure 31:
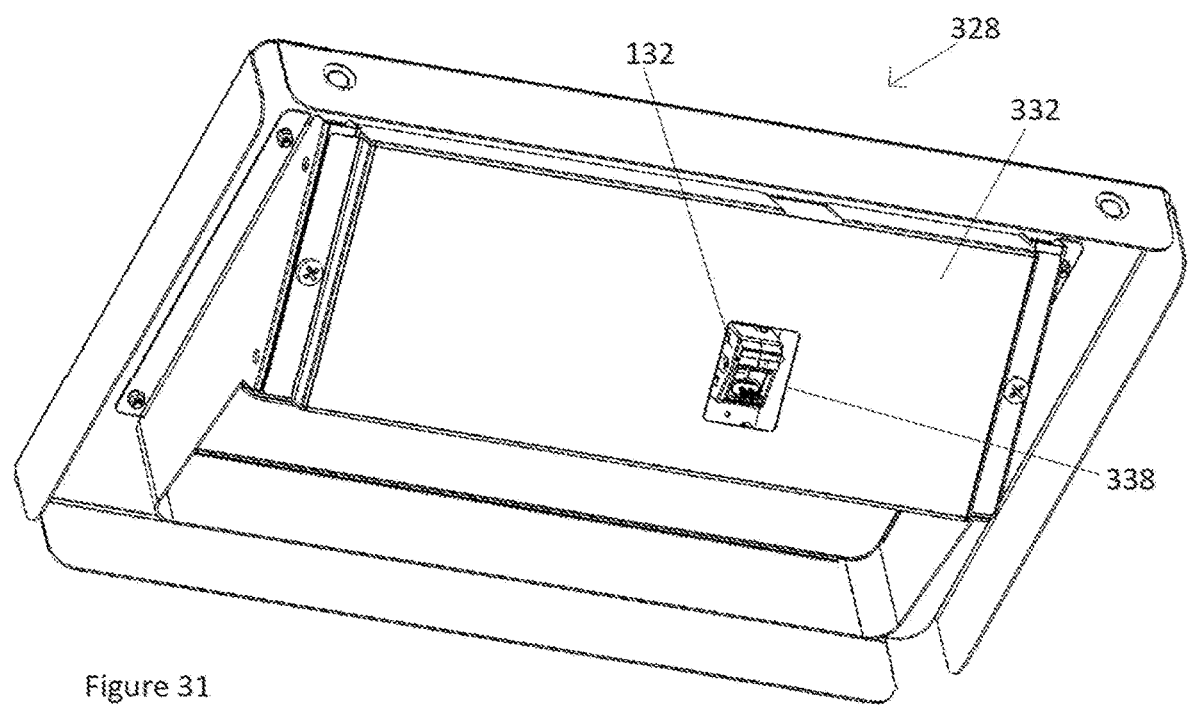
FIG. 31 is a bottom perspective view of a lid of the waste bin shown in FIG. 30.
Figure 32:
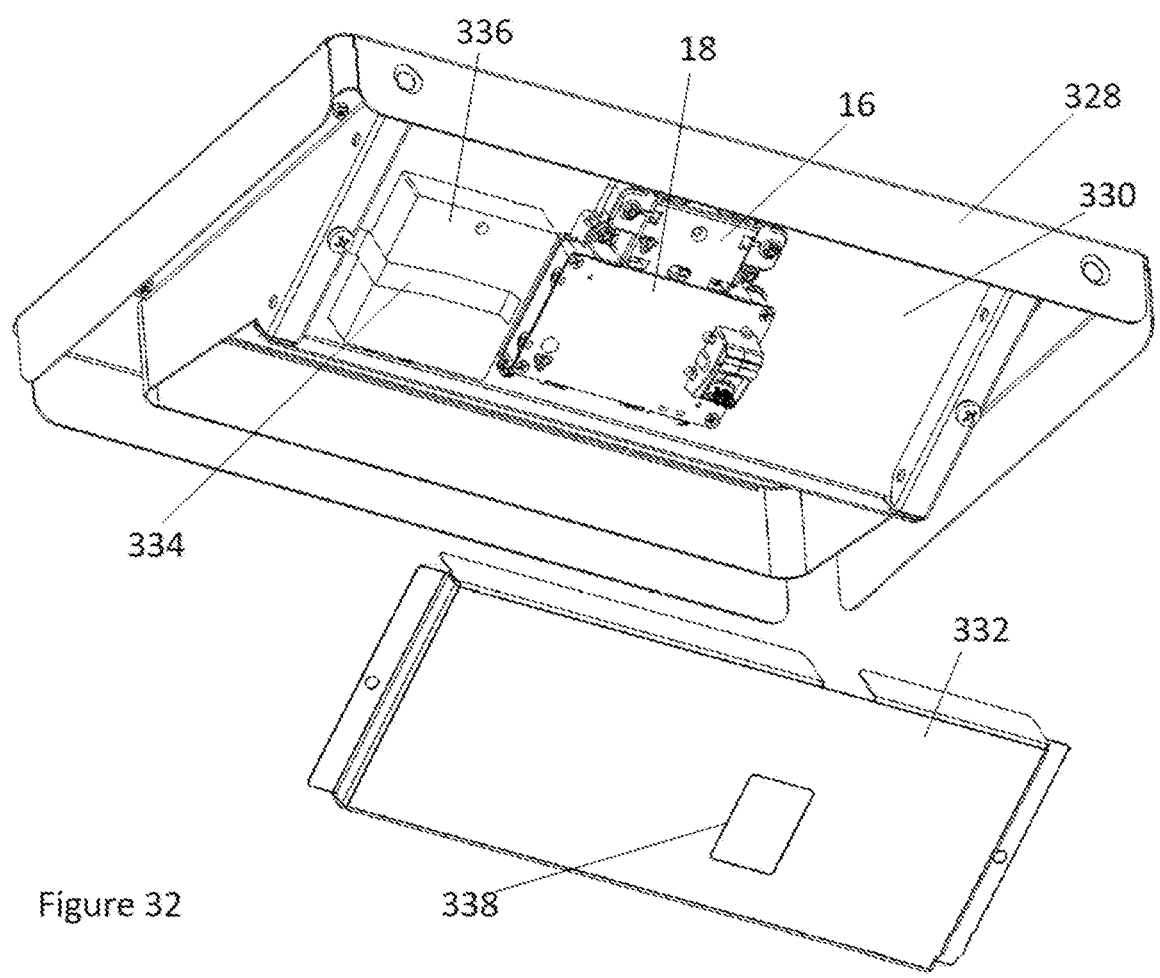
FIG. 32 is a partially exploded view of the lid shown in FIG. 31.

As an example of an additional apparatus that could be included in such a system, reference is now made to FIGS. 30 to 32, which show a waste bin 324 in accordance with a second embodiment of the present invention. The waste bin 324 incorporates a mounting and locking body 16 and a smart module 18 that are identical to the mounting and locking body 16 and the smart module 18 shown in FIGS. 1 to 29. Like numerals are used to denote like components.

Referring to FIG. 30, the waste bin 324 has a receptacle body 326 and a lid 328. The receptacle body 326 defines an interior compartment for receiving waste products, such as used paper towels 66. The lid 328 is attached to an open upper end of the receptacle body 326. As can be seen in FIG. 30, the lid 328 has an inclined rear wall 330 with a communication opening 34 for receiving the plug member 86 of the mounting and locking body 16.

As shown in FIG. 32, the mounting and locking body 16 is attached to the underside of the inclined rear wall 330, and carries the smart module 18. A resilient metal clip 334 is also attached to the underside of the inclined rear wall 330, and holds a battery module 336 against the underside of the inclined rear wall 330. The battery module 336 contains a battery or batteries for providing power to the smart module 18.

As can be seen in FIG. 31, a protective cover 332 is attached to the underside of the lid 328 so as to partially enclose the battery module 336 and the smart module 18. The protective cover 332 preferably helps to protect the battery module 336 and the smart module 18 from damage and/or theft. The protective cover 332 has a sensor opening 338 through which the sensor 174 is able to emit and receive electromagnetic radiation 224.

The sensor housing 176 has an angular position that is selected so that the electromagnetic radiation 224 emitted by the sensor 174 is directed into the interior compartment of the receptacle body 326, to be reflected back to the sensor 174 by the waste products that have collected in the interior compartment, or if the waste bin 324 is empty, by the bottom of the receptacle body 326. As the amount of waste products in the waste bin 324 accumulates, the distance between the sensor 174 and the top of the collection of waste products decreases. The amount of time that it takes for the electromagnetic radiation 224 to be reflected back to the sensor 174 therefore provides an indication as to how full the waste bin 324 is.

The processor 170 is preferably configured to determine how full the waste bin 324 is based on data received from the time of flight sensor 174, and to control the first indicator light 164 to convey information about how full the waste bin 324 is. For example, the processor 170 may be configured to illuminate the first indicator light 164 when the volume of waste products in the waste bin 324 exceeds a preselected threshold. As can be seen in FIG. 30, the first indicator light 164 is visible from outside of the waste bin 324. Illuminating the first indicator light 164 when the volume of waste products in the waste bin 324 exceeds the preselected threshold therefore preferably allows a service personnel to easily see when the waste bin 324 needs to be emptied, without for example requiring the service personnel to remove the lid 164.

The processor 170 is also preferably configured to store information in the memory 172 about the amount of waste products in the waste bin 324 over time. This information is preferably communicated wirelessly by the wireless communication device 168 through the communication opening 34, for example via Near-Field Communication when a suitably programmed smart phone is placed on the plug member 86.

The processor 170 is also preferably configured to control the illumination of the second indicator light 166 based on the battery power remaining in the battery module 336. For example, the processor 170 may illuminate the second indicator light 166 when the amount of battery power falls below a preselected threshold. This preferably provides an easily recognizable visual indication to a service personnel that the battery module 336 needs to be replaced. The metal clip 334 preferably allows the battery module 336 to be easily removed and replaced with a new, fully charged, replacement battery module 336, without for example having to remove or disassemble the smart module 18. Although not shown in the drawings, the paper towel dispenser 10 shown in FIGS. 1 to 29 could also incorporate a similar metal clip 334 for carrying a battery module 336 adjacent to the smart module 18.

The waste bin 324 could optionally be distributed without the smart module 18 and without the battery module 336. Preferably, the waste bin 324 is distributed with the mounting and locking member 16 attached to the lid 328, even when the smart module 18 and the battery module 336 are not included. The smart module 18 and the battery module 336 could then be added later as an optional upgrade to provide smart functionality, merely by attaching the smart module 18 to the mounting and locking member 16 and clipping the battery module 336 in place using the metal clip 334. The protective cover 332 could also be provided separately as an optional upgrade for protecting the smart module 18 and the battery module 336.

The manufacturer preferably adjusts and locks the sensor 174 at the preferred angular position for determining the volume of waste products in the waste bin 324 before the smart module 18 is shipped to the owner of the waste bin 324. Advantageously, the smart module 18 to be incorporated into the waste bin 324 can use the same design for the smart module housing 128 and the cover assembly 132 as in the first embodiment shown in FIGS. 1 to 29. The circuit board 130 also optionally has the same design as in the first embodiment, but typically at least the programming of the processor 170 would differ depending on the type of apparatus that the smart module 18 is to be incorporated into. Optionally, one or more electronic components of the smart module 18 may also differ depending on the type of apparatus that the smart module 18 is to be incorporated into.

Figure 33:
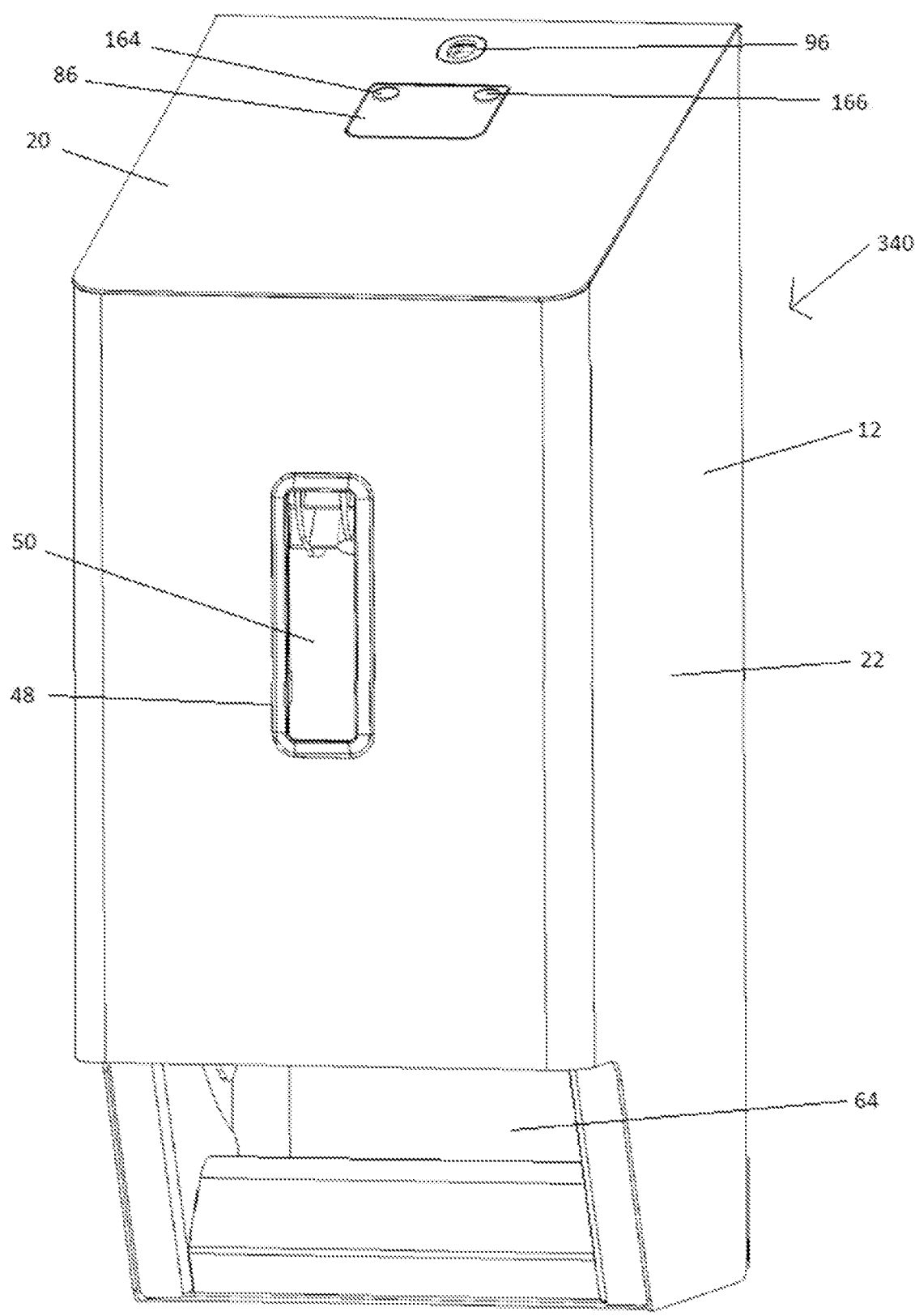
FIG. 33 is a perspective view of a toilet paper dispenser in accordance with a third embodiment of the present invention.
Figure 34:
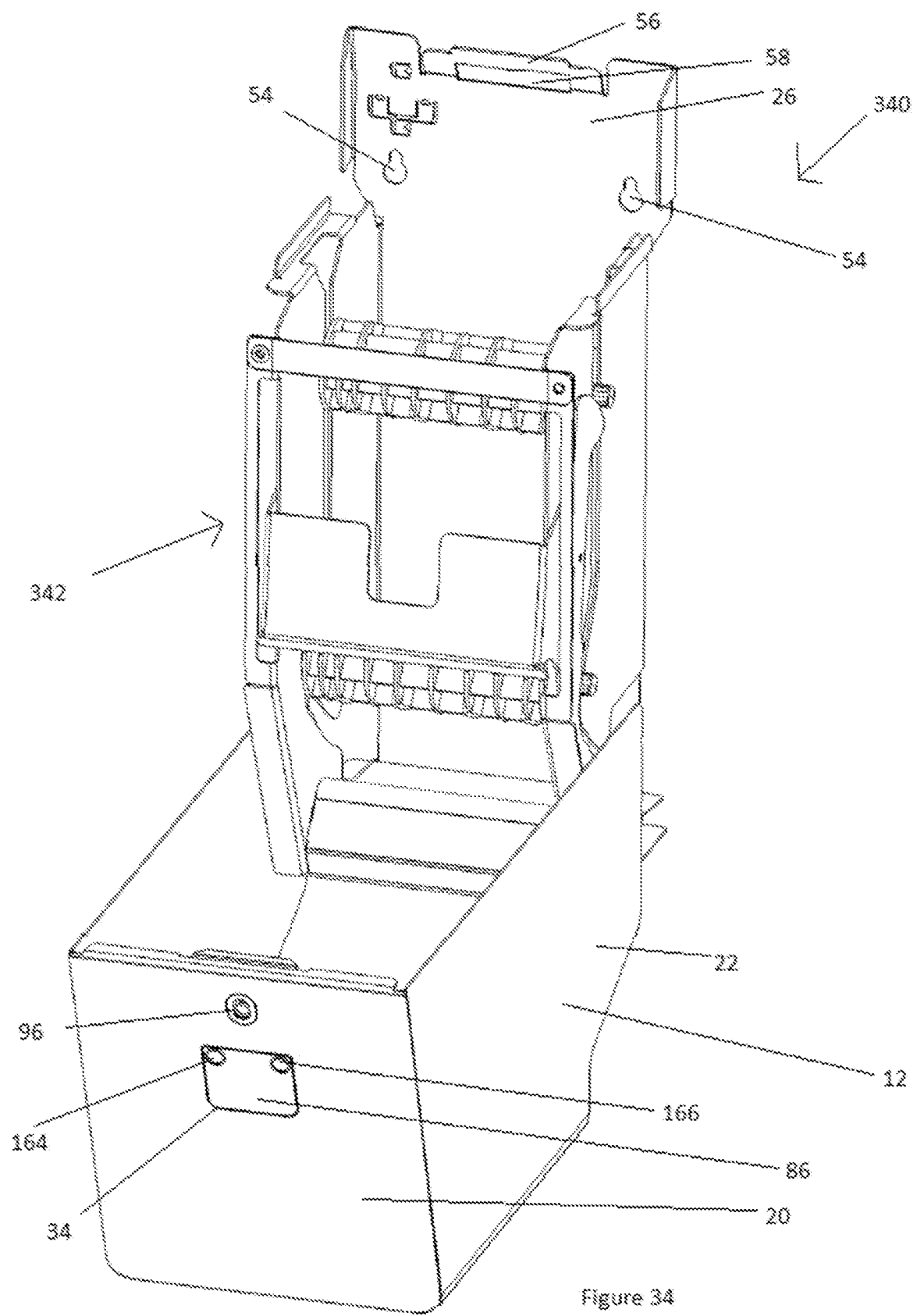
FIG. 34 is a perspective view of the toilet paper dispenser shown in FIG. 33, showing an enclosure of the toilet paper dispenser in an open state.
Figure 35:
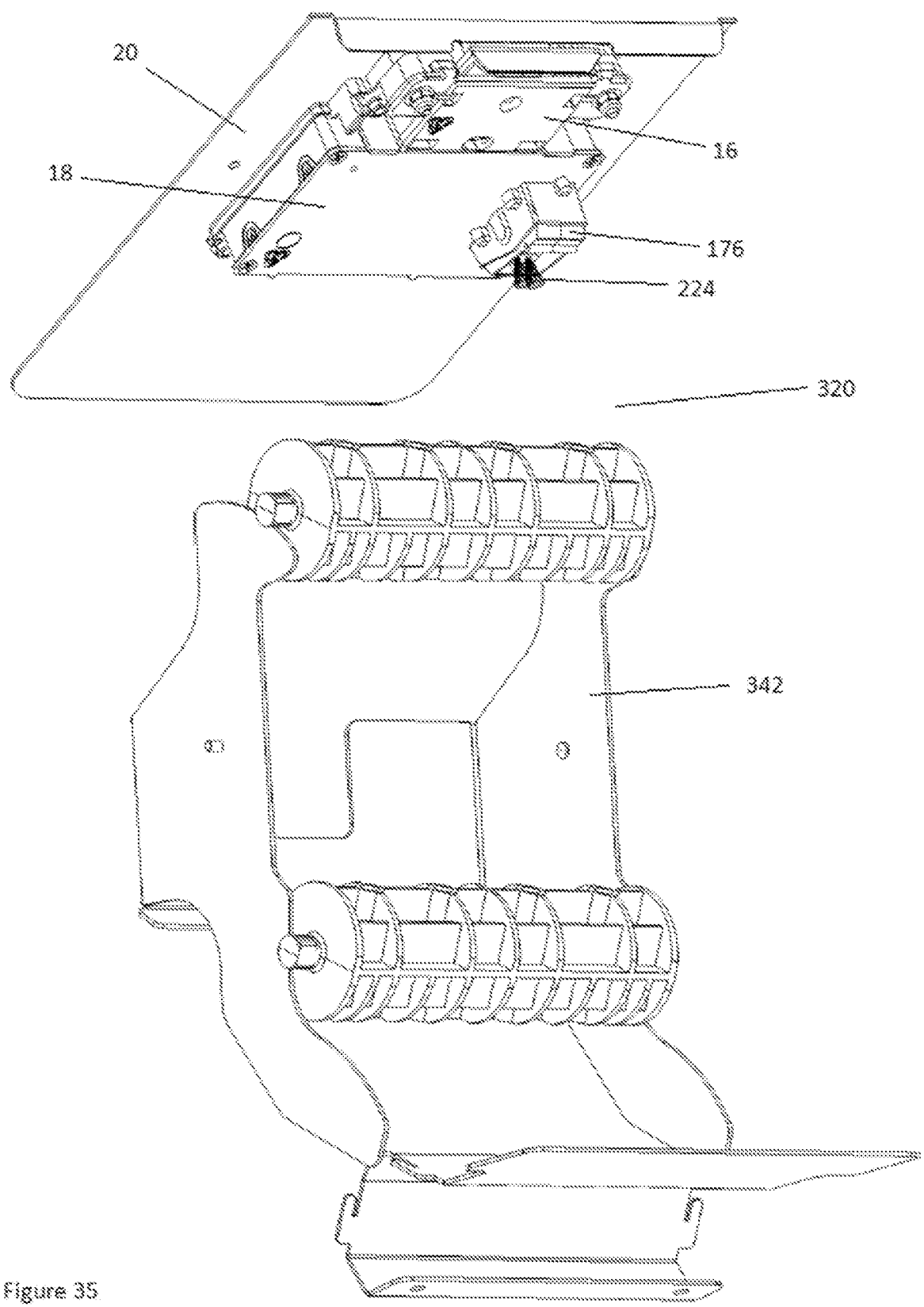
FIG. 35 is a rear perspective view of the toilet paper dispenser shown in FIG. 33, with the enclosure omitted except for a top panel of the enclosure.

Reference is now made to FIGS. 33 to 35, which show a toilet paper dispenser 340 in accordance with a third embodiment of the present invention. The toilet paper dispenser 340 incorporates a mounting and locking body 16 and a smart module 18 that are identical to the mounting and locking body 16 and the smart module 18 shown in FIGS. 1 to 29. Like numerals are used to denote like components.

Referring to FIG. 1, the toilet paper dispenser 340 has an enclosure 12 with a bottom opening 64 for dispensing toilet paper from the dispenser 340, and a communication opening 34 for receiving the plug member 86 of the mounting and locking body 16. As shown in FIG. 34, the dispenser 340 includes a toilet paper holding and dispensing mechanism 342. The toilet paper holding and dispensing mechanism 342 is configured to hold two rolls of toilet paper, and to dispense the toilet paper out through the bottom opening 64 in a manner as is known in the art.

As can be seen in FIG. 35, the sensor housing 176 is angled so as to emit the electromagnetic radiation 224 from the sensor 174 towards a product storage space 320 within the enclosure 12. Although not shown in the drawings, the toilet paper is stored in the product storage space 320, such that the electromagnetic radiation 224 emitted from the sensor 174 is reflected back to the sensor 174 from the toilet paper. Similarly to the first embodiment shown in FIGS. 1 to 29, as the amount of toilet paper in the dispenser 340 decreases, the distance between the toilet paper and the sensor 174 increases. As such, the amount of time that it takes for the electromagnetic radiation 224 to be reflected back to the sensor 174 provides an indication of the amount of toilet paper remaining in the dispenser 340.

The processor 170 is preferably configured to determine the amount of toilet paper remaining in the dispenser 340 based on data received from the time of flight sensor 174, and to control the illumination of the first indicator light 164 based on the amount of toilet paper remaining in the dispenser 340. For example, the processor 170 may be configured to illuminate the first indicator light 164 when the amount of toilet paper remaining in the dispenser 340 falls below a preselected threshold, to provide a visual indication to a service personnel that the toilet paper needs to be refilled. The processor 170 also preferably stores information in the memory 172 about the amount of toilet paper in the dispenser 340 over time, and communicates this information wirelessly via the wireless communication device 168 similarly to the previous embodiments described above.

As in the previous embodiments, the toilet paper dispenser 340 is optionally distributed without the smart module 18, and the smart module 18 can be optionally added later as an upgrade to provide smart functionality. The manufacturer preferably adjusts and locks the sensor 174 at the preferred angular position for detecting the quantity of toilet paper in the dispenser 340 before the smart module 18 is shipped to the owner of the dispenser 340.

Figure 36:
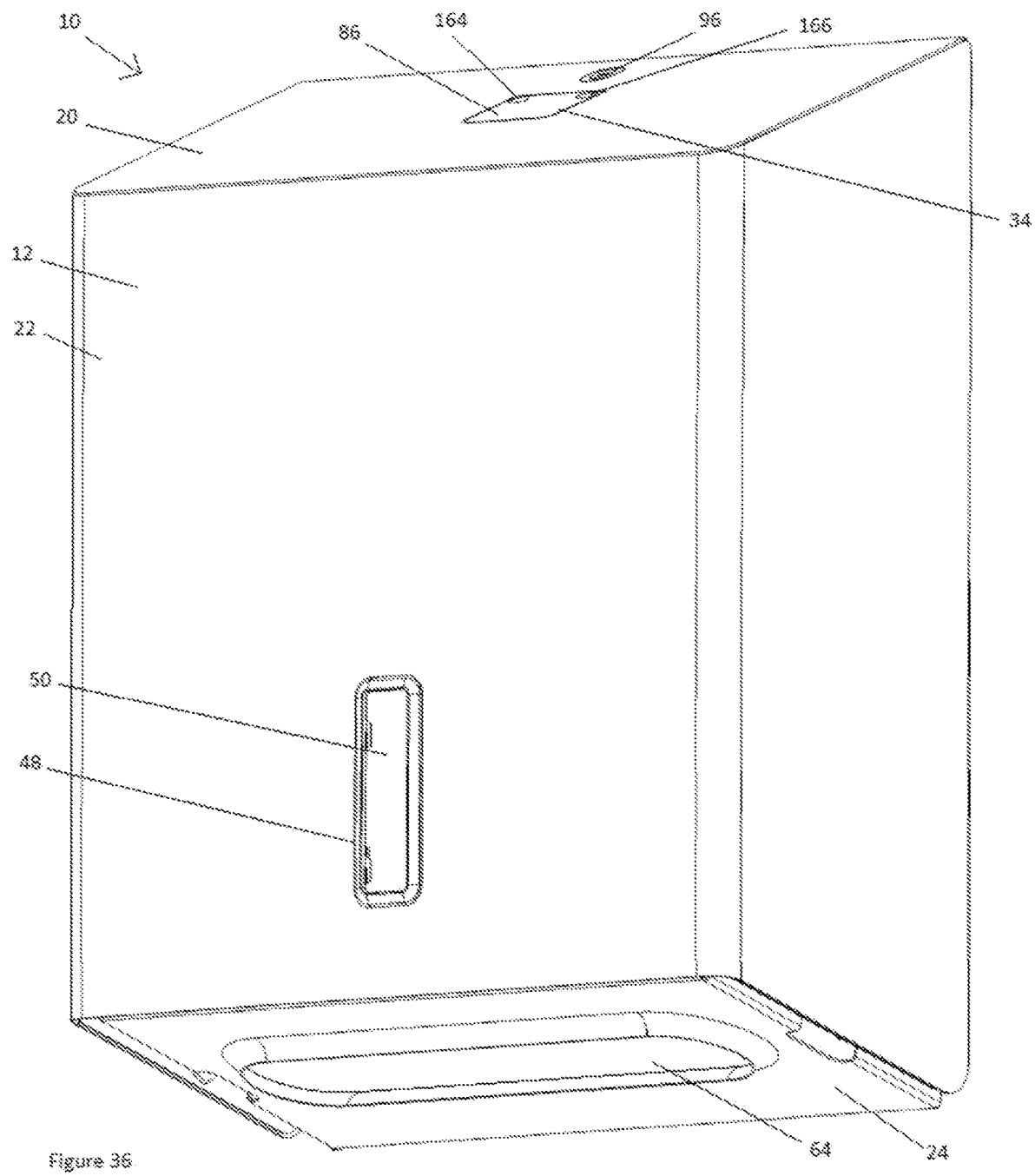
FIG. 36 is a perspective view of a paper towel dispenser in accordance with a fourth embodiment of the present invention.
Figure 37:
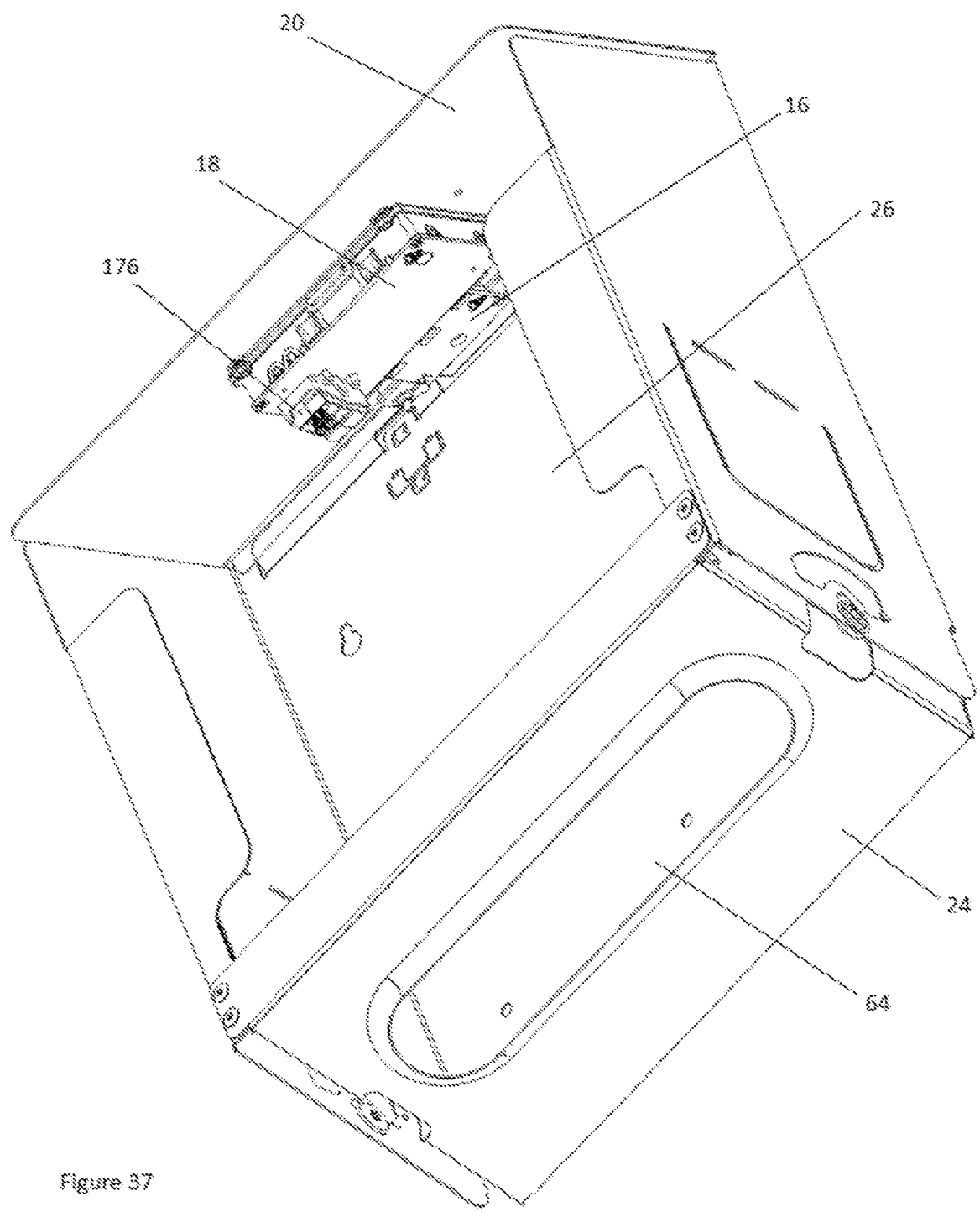
FIG. 37 is a bottom perspective view of the paper towel dispenser shown in FIG. 36, with a front and side panel of an enclosure of the paper towel dispenser omitted.

Reference is now made to FIGS. 36 and 37, which show a paper towel dispenser 10 in accordance with a fourth embodiment of the present invention. The paper towel dispenser 10 incorporates a mounting and locking body 16 and a smart module 18 that are identical to the mounting and locking body 16 and the smart module 18 shown in FIGS. 1 to 29. Like numerals are used to denote like components.

The paper towel dispenser 10 shown in FIGS. 36 and 37 is generally similar to the paper towel dispenser 10 shown in FIGS. 1 to 29, but is adapted to carry stacked sheets of paper towel 66 instead of rolls of paper towel 66. Although not shown in the drawings, the paper towels 66 are stacked on top of the bottom panel 24 of the enclosure 12. The paper towels 66 can be individually drawn from the dispenser 10 through the bottom opening 64, for example by a user pulling the paper towel 66 with their hand or hands.

As can be seen in FIG. 37, the smart module 18 is mounted to the mounting and locking body 16, with the sensor 174 directed downwardly for emitting the electromagnetic radiation 224 towards the product storage space 320 where the paper towels 10 are stacked in the enclosure 12. The amount of time that it takes for the electromagnetic radiation 224 to be reflected from the stack of paper towels 10, or if there are no paper towels 10, from the bottom panel 24 of the enclosure 12, provides an indication of the amount of paper towels 66 remaining in the dispenser 10.

The processor 170 is preferably configured to determine the amount of paper towels 66 remaining in the dispenser 10 based on data received from the time of flight sensor 174, and to control the illumination of the first indicator light 164 based on the amount of paper towels 66 remaining in the dispenser 10, as in the previous embodiments. The processor 170 also preferably stores information in the memory 172 about the amount of paper towels 66 in the dispenser 10 over time, and communicates this information wirelessly via the wireless communication device 168 similarly to the previous embodiments described above.

As in the previous embodiments, the paper towel dispenser 10 is optionally distributed without the smart module 18, and the smart module 18 can be optionally added later as an upgrade to provide smart functionality. The manufacturer preferably adjusts and locks the sensor 174 at the preferred angular position for detecting the quantity of paper towels 66 in the dispenser 10 before the smart module 18 is shipped to the owner of the dispenser 10.

It will be understood that, although various features of the invention have been described with respect to one or another of the embodiments of the invention, the various features and embodiments of the invention may be combined or used in conjunction with other features and embodiments of the invention as described and illustrated herein.

The invention is not limited to the particular constructions of the paper towel dispensers 10, waste bin 324, and toilet paper dispenser 340 shown in the drawings. The invention could also be used with other apparatuses beyond those shown in the drawings, including for example hand cleaning fluid dispensers. The smart module 18 and the mounting and locking body 16 could also have different constructions from those shown in the drawings. In some embodiments of the invention, the functions of the mounting and locking body 16 could be provided by two separate components, with one component for mounting the smart module 18 and another component for locking and unlocking the enclosure 12.

Although the sensor 174 is described as a time of flight sensor 174 in the preferred embodiments, the invention could also be used with other types of sensors 174, such as motion detectors, temperature sensors, capacitive sensors, and/or liquid level sensors.

Although the smart modules 18 shown in the drawings include a cover assembly 132 that incorporates a sensor 174 carried by a sensor housing 176, this is not strictly necessary in all embodiments of the invention. For example, in some embodiments of the invention some or all of the smart modules 18 may provide smart functionality without using a sensor 174 that is directly incorporated into the smart module 18. The sensor 174 could, for example, be provided separately from the smart module 18 and mounted at a different location than the smart module 18.

The invention could be used with apparatuses that are manually operated and/or that are touchlessly operated. The smart module 18 could use any suitable source of power, including from a battery and/or a wired connection to an external power source.

The sensor housing 176 is preferably able to rotate about the pivot axis 208 relative to the mounting member 178 in at least a 15 degree arc motion; at least a 20 degree arc motion; or at least a 30 degree arc motion.

The sensor assembly 132 need not be incorporated into the cover or lid of a smart module 18, and could instead be used in any suitable context where a sensor 174 is to be mounted. For example, the sensor assembly 132 could be directly incorporated into the enclosure 12 of an apparatus such as a paper towel dispenser 10, a waste bin 324, or a toilet paper dispenser 340.

Although this disclosure has described and illustrated certain preferred embodiments of the invention, it is to be understood that the invention is not restricted to these particular embodiments. Rather, the invention includes all embodiments which are functional, electrical, optical, or mechanical equivalents of the specific embodiments and features that have been described and illustrated herein.

I claim:

1. A sensor assembly comprising:
a sensor housing configured to carry a sensor;
a mounting member that pivotally engages with the sensor housing;
an adjustment member for selecting an angular position of the sensor housing relative to the mounting member; and
a locking mechanism for locking the sensor housing at the selected angular position relative to the mounting member;
wherein the sensor housing comprises a first mounting element and a first adjustment element;
wherein the mounting member comprises a second mounting element that pivotally engages with the first mounting element so as to permit pivotal movement of the sensor housing about a pivot axis relative to the mounting member;
wherein the adjustment member comprises a second adjustment element that engages with the first adjustment element;
wherein, when the locking mechanism is in an unlocked state, the adjustment member is slideable relative to the mounting member between a first location and a second location;
wherein, when the adjustment member is moved relative to the mounting member between the first location and the second location, the engagement of the second adjustment element with the first adjustment element pivots the sensor housing about the pivot axis relative to the mounting member between a first angular position and a second angular position;
wherein the angular position of the sensor housing relative to the mounting member is selectable by adjusting a location of the adjustment member relative to the mounting member;
wherein, when the sensor housing is at the selected angular position relative to the mounting member and the locking mechanism is in a locked state, the adjustment member is prevented from sliding relative to the mounting member, and the engagement of the second adjustment element with the first adjustment element locks the sensor housing at the selected angular position relative to the mounting member;
wherein the mounting member has a locking surface that is spaced from the pivot axis;
wherein the adjustment member has a lock surface that faces towards the locking surface and is slideable relative to the locking surface when the locking mechanism is in the unlocked state;
wherein, when the locking mechanism is in the locked state, the lock surface engages with the locking surface so as to prevent the adjustment member from moving relative to the mounting member;
wherein the locking surface faces away from the pivot axis;
wherein the locking surface is planar; and
wherein the locking surface is parallel to the pivot axis.

2. The sensor assembly according to claim 1, wherein, when the locking mechanism is in the locked state, the locking mechanism applies pressure to the adjustment member to force the lock surface into engagement with the locking surface.

3. The sensor assembly according to claim 2, wherein the locking mechanism comprises a fastener having a threaded shaft and a head;
wherein the adjustment member comprises a fastener slot;
wherein the mounting member comprises a threaded hole;
wherein the threaded shaft extends through the fastener slot and into the threaded hole, with the adjustment member being positioned between the head and the mounting member;
wherein, when the locking mechanism is in the unlocked state, the head is sufficiently spaced from the mounting member to allow the adjustment member to slide between the first location and the second location;
wherein placing the locking mechanism in the locked state comprises rotating the threaded shaft relative to the threaded hole so as to move the head towards the mounting member; and
wherein, when the locking mechanism is in the locked state, the head engages with the adjustment member to force the lock surface into engagement with the locking surface.

4. The sensor assembly according to claim 3,
wherein the first adjustment element comprises an adjustment projection;
wherein the second adjustment element comprises an adjustment slot that receives the adjustment projection;
wherein the adjustment projection extends along a projection axis that is spaced from the pivot axis and parallel to the pivot axis;
wherein, when the locking mechanism is in the unlocked state, the adjustment member is slideable relative to the mounting member between the first location and the second location along an adjustment axis, and
wherein the adjustment axis is spaced from the pivot axis and lies in an adjustment plane that is perpendicular to the pivot axis.

5. The sensor assembly according to claim 4, wherein the adjustment slot has a closed terminal end;
wherein the adjustment projection is slideable within the adjustment slot relative to the closed terminal end;
wherein a distance between the adjustment projection and the closed terminal end changes as the adjustment member moves between the first location and the second location;
wherein the adjustment slot has an open end for receiving the adjustment projection during assembly of the sensor assembly;
wherein the sensor housing has an outer wall that defines an internal chamber;
wherein the internal chamber has an open adjustment end;
wherein the adjustment projection extends inwardly from the outer wall into the internal chamber;
wherein the adjustment member comprises an adjustment slot defining body that defines the adjustment slot;
wherein the adjustment slot defining body extends through the open adjustment end into the internal chamber of the sensor housing;
wherein the outer wall has a side portion that is perpendicular to the pivot axis; and
wherein the adjustment projection extends inwardly into the internal chamber from the side portion of the outer wall.

6. The sensor assembly according to claim 5, wherein the first mounting element comprises a first mounting projection and a second mounting projection;
wherein the second mounting element comprises a first mounting cavity that receives the first mounting projection and a second mounting cavity that receives the second mounting projection;
wherein the sensor housing has a first outer surface and a second outer surface;
wherein the first mounting projection extends outwardly from the first outer surface along the pivot axis;
wherein the second mounting projection extends outwardly from the second outer surface along the pivot axis,
wherein the mounting member has a mounting portion with a first side wall and a second side wall;
wherein the first side wall defines the first mounting cavity;
wherein the second side wall defines the second mounting cavity; and
wherein the pivot axis extends through the first mounting cavity and the second mounting cavity.

7. The sensor assembly according to claim 6, wherein the mounting member has a base portion;
wherein the mounting portion extends from the base portion;
wherein the mounting portion has an open end adjacent to the base portion,
wherein the first side wall defines a first channel that extends from the open end to the first mounting cavity;
wherein the second side wall defines a second channel that extends from the open end to the second mounting cavity;
wherein the sensor housing is configured to be inserted into the open end of the mounting portion, between the first side wall and the second side wall, during assembly of the sensor assembly;
wherein the first mounting projection is configured to travel through the first channel from the open end to the first mounting cavity during assembly of the sensor assembly;
wherein the second mounting projection is configured to travel through the second channel from the open end to the second mounting cavity during assembly of the sensor assembly;
wherein the first side wall and the second side wall extend perpendicularly from the base portion;
wherein the base portion is planar and lies in a base plane;
wherein, when the locking mechanism is in the unlocked state, the adjustment member is slideable relative to the base portion along a sliding axis that is parallel to the base plane; and
wherein, when the locking mechanism is in the locked state, the adjustment member engages with the base portion and is prevented from moving along the sliding axis relative to the base portion.

8. The sensor assembly according to claim 7, wherein the mounting member is a cover of a container configured to contain electronics;
wherein the container comprises a box configured to carry a circuit board; and
wherein the sensor comprises a time of flight sensor.

9. The sensor assembly according to claim 1, wherein the first adjustment element comprises an adjustment projection;
wherein the second adjustment element comprises an adjustment slot that receives the adjustment projection;
wherein the adjustment projection extends along a projection axis that is spaced from the pivot axis and parallel to the pivot axis;
wherein, when the locking mechanism is in the unlocked state, the adjustment member is slideable relative to the mounting member between the first location and the second location along an adjustment axis; and
wherein the adjustment axis is spaced from the pivot axis and lies in an adjustment plane that is perpendicular to the pivot axis.

10. The sensor assembly according to claim 9, wherein the adjustment slot has a closed terminal end;
wherein the adjustment projection is slideable within the adjustment slot relative to the closed terminal end;
wherein a distance between the adjustment projection and the closed terminal end changes as the adjustment member moves between the first location and the second location; and
wherein the adjustment slot has an open end for receiving the adjustment projection during assembly of the sensor assembly.

11. The sensor assembly according to claim 9, wherein the sensor housing has an outer wall that defines an internal chamber;
wherein the internal chamber has an open adjustment end;
wherein the adjustment projection extends inwardly from the outer wall into the internal chamber;
wherein the adjustment member comprises an adjustment slot defining body that defines the adjustment slot;
wherein the adjustment slot defining body extends through the open adjustment end into the internal chamber of the sensor housing;
wherein the outer wall has a side portion that is perpendicular to the pivot axis; and
wherein the adjustment projection extends inwardly into the internal chamber from the side portion of the outer wall.

12. The sensor assembly according to claim 1, wherein the first mounting element comprises a first mounting projection and a second mounting projection;
wherein the second mounting element comprises a first mounting cavity that receives the first mounting projection and a second mounting cavity that receives the second mounting projection;
wherein the sensor housing has a first outer surface and a second outer surface;
wherein the first mounting projection extends outwardly from the first outer surface along the pivot axis;
wherein the second mounting projection extends outwardly from the second outer surface along the pivot axis;
wherein the mounting member has a mounting portion with a first side wall and a second side wall;
wherein the first side wall defines the first mounting cavity;
wherein the second side wall defines the second mounting cavity; and
wherein the pivot axis extends through the first mounting cavity and the second mounting cavity.

13. The sensor assembly according to claim 12, wherein the mounting member has a base portion; and
wherein the mounting portion extends from the base portion.

14. The sensor assembly according to claim 13, wherein the mounting portion has an open end adjacent to the base portion;
wherein the first side wall defines a first channel that extends from the open end to the first mounting cavity;
wherein the second side wall defines a second channel that extends from the open end to the second mounting cavity;

wherein the sensor housing is configured to be inserted into the open end of the mounting portion, between the first side wall and the second side wall, during assembly of the sensor assembly;

wherein the first mounting projection is configured to travel through the first channel from the open end to the first mounting cavity during assembly of the sensor assembly; and wherein the second mounting projection is configured to travel through the second channel from the open end to the second mounting cavity during assembly of the sensor assembly.

15. The sensor assembly according to claim 13, wherein the first side wall and the second side wall extend perpendicularly from the base portion.

16. The sensor assembly according to claim 13, wherein the base portion is planar and lies in a base plane;

wherein, when the locking mechanism is in the unlocked state, the adjustment member is slideable relative to the base portion along a sliding axis that is parallel to the base plane; and wherein, when the locking mechanism is in the locked state, the adjustment member engages with the base portion and is prevented from moving along the sliding axis relative to the base portion.

17. The sensor assembly according to claim 1, wherein the mounting member is a cover of a container configured to contain electronics.

18. The sensor assembly according to claim 17, wherein the container comprises a box configured to carry a circuit board; and further comprising:

a time of flight sensor carried by the sensor housing.

19. A sensor assembly comprising:

a sensor housing configured to carry a sensor;

a mounting member that pivotally engages with the sensor housing;

an adjustment member for selecting an angular position of the sensor housing relative to the mounting member; and a locking mechanism for locking the sensor housing at the selected angular position relative to the mounting member;

wherein the sensor housing comprises a first mounting element and a first adjustment element;

wherein the mounting member comprises a second mounting element that pivotally engages with the first mounting element so as to permit pivotal movement of the sensor housing about a pivot axis relative to the mounting member;

wherein the adjustment member comprises a second adjustment element that engages with the first adjustment element;

wherein, when the locking mechanism is in an unlocked state, the adjustment member is slideable relative to the mounting member between a first location and a second location;

wherein, when the adjustment member is moved relative to the mounting member between the first location and the second location, the engagement of the second adjustment element with the first adjustment element pivots the sensor housing about the pivot axis relative to the mounting member between a first angular position and a second angular position;

wherein the angular position of the sensor housing relative to the mounting member is selectable by adjusting a location of the adjustment member relative to the mounting member;

wherein, when the sensor housing is at the selected angular position relative to the mounting member and the locking mechanism is in a locked state, the adjustment member is prevented from sliding relative to the mounting member, and the engagement of the second adjustment element with the first adjustment element locks the sensor housing at the selected angular position relative to the mounting member;

wherein the first adjustment element comprises an adjustment projection;

wherein the second adjustment element comprises an adjustment slot that receives the adjustment projection;

wherein the adjustment projection extends along a projection axis that is spaced from the pivot axis and parallel to the pivot axis;

wherein, when the locking mechanism is in the unlocked state, the adjustment member is slideable relative to the mounting member between the first location and the second location along an adjustment axis;

wherein the adjustment axis is spaced from the pivot axis and lies in an adjustment plane that is perpendicular to the pivot axis;

wherein the sensor housing has an outer wall that defines an internal chamber;

wherein the internal chamber has an open adjustment end;

wherein the adjustment projection extends inwardly from the outer wall into the internal chamber;

wherein the adjustment member comprises an adjustment slot defining body that defines the adjustment slot;

wherein the adjustment slot defining body extends through the open adjustment end into the internal chamber of the sensor housing;

wherein the outer wall has a side portion that is perpendicular to the pivot axis; and wherein the adjustment projection extends inwardly into the internal chamber from the side portion of the outer wall.

20. The sensor assembly according to claim 19, wherein the adjustment slot has a closed terminal end;

wherein the adjustment projection is slideable within the adjustment slot relative to the closed terminal end;

wherein a distance between the adjustment projection and the closed terminal end changes as the adjustment member moves between the first location and the second location; and wherein the adjustment slot has an open end for receiving the adjustment projection during assembly of the sensor assembly.

* * * * *